United States Patent
Hishida et al.

(10) Patent No.: US 8,169,826 B2
(45) Date of Patent: May 1, 2012

(54) NONVOLATILE SEMICONDUCTOR MEMORY DEVICE

(75) Inventors: Tomoo Hishida, Yokohama (JP); Yoshihisa Iwata, Yokohama (JP); Megumi Ishiduki, Yokohama (JP); Ryota Katsumata, Yokohama (JP); Yoshiaki Fukuzumi, Yokohama (JP); Masaru Kito, Yokohama (JP); Masaru Kidoh, Yokohama (JP); Hiroyasu Tanaka, Yokohama (JP); Yosuke Komori, Yokkaichi (JP); Junya Matsunami, Yokohama (JP); Tomoko Fujiwara, Yokohama (JP); Hideaki Aochi, Kawasaki (JP); Ryouhei Kirisawa, Yokohama (JP); Yoshimasa Mikajiri, Yokohama (JP); Shigeto Oota, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 12/726,858

(22) Filed: Mar. 18, 2010

(65) Prior Publication Data
US 2011/0013454 A1 Jan. 20, 2011

(30) Foreign Application Priority Data

Jul. 15, 2009 (JP) .................................. 2009-166499
Jan. 19, 2010 (JP) .................................. 2010-009221

(51) Int. Cl.
*G11C 16/04* (2006.01)
*H01L 29/792* (2006.01)
*H01L 29/66* (2006.01)

(52) U.S. Cl. ......... 365/185.11; 365/185.13; 365/185.17; 257/324; 257/329; 257/E27.103; 257/E29.309

(58) Field of Classification Search ............... 365/185.11
See application file for complete search history.

(56) References Cited

U.S. PATENT DOCUMENTS

| 7,821,058 | B2 * | 10/2010 | Kidoh et al. | 257/324 |
|---|---|---|---|---|
| 7,852,676 | B2 * | 12/2010 | Maejima | 365/185.11 |
| 7,933,151 | B2 * | 4/2011 | Maeda et al. | 365/185.11 |
| 7,936,004 | B2 * | 5/2011 | Kito et al. | 257/324 |
| 7,983,084 | B2 * | 7/2011 | Tokiwa et al. | 365/185.11 |
| 7,989,880 | B2 * | 8/2011 | Wada et al. | 257/329 |
| 8,013,389 | B2 * | 9/2011 | Oh et al. | 257/331 |
| 2007/0252201 | A1 | 11/2007 | Kito et al. | |
| 2008/0242028 | A1 * | 10/2008 | Mokhlesi et al. | 438/270 |
| 2010/0038703 | A1 * | 2/2010 | Fukuzumi et al. | 257/326 |
| 2010/0090286 | A1 * | 4/2010 | Lee et al. | 257/368 |
| 2010/0117137 | A1 * | 5/2010 | Fukuzumi et al. | 257/324 |
| 2010/0117143 | A1 * | 5/2010 | Lee et al. | 257/329 |

FOREIGN PATENT DOCUMENTS

JP 2007-266143 10/2007
WO WO 2009/075370 A1 6/2009

OTHER PUBLICATIONS

H. Onoda, et al., "A Novel Cell Structure Suitable for a 3 Volt Operation, Sector Erase Flash Memory", IEDM Tech. Dig., Dec. 1992, 4 pages.
U.S. Appl. No. 12/679,991, filed Mar. 25, 2010, Fukuzumi, et al.

* cited by examiner

*Primary Examiner* — Son Mai
(74) *Attorney, Agent, or Firm* — Oblon, Spivak, McClelland, Maier & Neustadt, L.L.P.

(57) ABSTRACT

A nonvolatile semiconductor memory device comprises: a plurality of first memory strings; a first select transistor having one end thereof connected to one end of the first memory strings; a first line commonly connected to the other end of a plurality of the first select transistors; a switch circuit having one end thereof connected to the first line; and a second line commonly connected to the other end of a plurality of the switch circuits. The switch circuit controls electrical connection between the second line and the first line.

20 Claims, 57 Drawing Sheets

NONVOLATILE SEMICONDUCTOR MEMORY DEVICE

CROSS REFERENCE TO RELATED APPLICATIONS

This application is based upon and claims the benefit of priority from the prior Japanese Patent Application No. 2009-166499, filed on Jul. 15, 2009, and No. 2010-9221, filed on Jan. 19, 2010, the entire contents of which are incorporated herein by reference.

BACKGROUND OF THE INVENTION

1. Field of the Invention

The present invention relates to an electrically data-rewritable nonvolatile semiconductor memory device.

2. Description of the Related Art

Conventionally, an LSI is formed by integrating elements in a two-dimensional plane on a silicon substrate. The only way to increase storage capacity of memory is by reducing dimensions of (miniaturizing) elements. However, in recent years, even this miniaturization is becoming difficult in terms of cost and technology. Improvements in photolithographic technology are necessary for miniaturization, but, for example, in current ArF immersion lithography technology, a rule of around 40 nm represents the resolution limit, and further miniaturization requires introduction of EUV steppers. However, EUV steppers are expensive and unrealistic when considering costs. Moreover, even if miniaturization is achieved, it is expected that physical limitations such as those of withstand voltage between elements are encountered, unless the drive voltage and so on are scaled. In other words, there is a high possibility that operation as a device becomes difficult.

Accordingly, in recent years, many semiconductor memory devices are proposed in which memory cells are disposed three-dimensionally in order to increase a degree of integration of memory (refer to Japanese Unexamined Patent Application Publication No. 2007-266143).

One conventional semiconductor memory device in which memory cells are disposed three-dimensionally uses transistors with a cylindrical column type structure (Japanese Unexamined Patent Application Publication No. 2007-266143). The semiconductor memory device using the transistors with the cylindrical column type structure is provided with multi-layer stacked conductive layers configured to form gate electrodes, and pillar-shaped columnar semiconductor layers. The columnar semiconductor layer functions as a channel (body) portion of the transistors. A vicinity of the columnar semiconductor layer is provided with a MONOS (Metal-Oxide-Nitride-Oxide-Semiconductor) layer. A configuration including these stacked conductive layer, columnar semiconductor layer, and MONOS layer is called a memory string.

A plurality of the above-described memory strings are connected to a common bit line via select transistors. Accordingly, the greater becomes the number of memory strings connected to one bit line, the larger becomes the sum total of current flowing in unselected memory strings. As a result, it becomes difficult to perform a read accurately.

SUMMARY OF THE INVENTION

In accordance with an aspect of the present invention, a nonvolatile semiconductor memory device comprises: a plurality of first memory strings each having a plurality of electrically rewritable first memory transistors connected in series; a first select transistor having one end thereof connected to one end of the first memory string; a first line commonly connected to the other end of a plurality of the first select transistors; a switch circuit having one end thereof connected to the first line; and a second line commonly connected to the other end of a plurality of the switch circuits, the first memory string comprising: a first semiconductor layer including a first columnar portion that extends in a perpendicular direction to a substrate and functioning as a body of the first memory transistors; a first charge storage layer formed surrounding a side surface of the first columnar portion; and a first conductive layer formed surrounding the first charge storage layer and functioning as a gate of the first memory transistors, the switch circuit controlling electrical connection between the second line and the first line.

DETAILED DESCRIPTION OF THE EMBODIMENTS

Embodiments of a nonvolatile semiconductor memory device in accordance with the present invention are described below with reference to the drawings.

[First Embodiment]
[Configuration of a Nonvolatile Semiconductor Memory Device 100 in Accordance with a First Embodiment]

Figure 1:
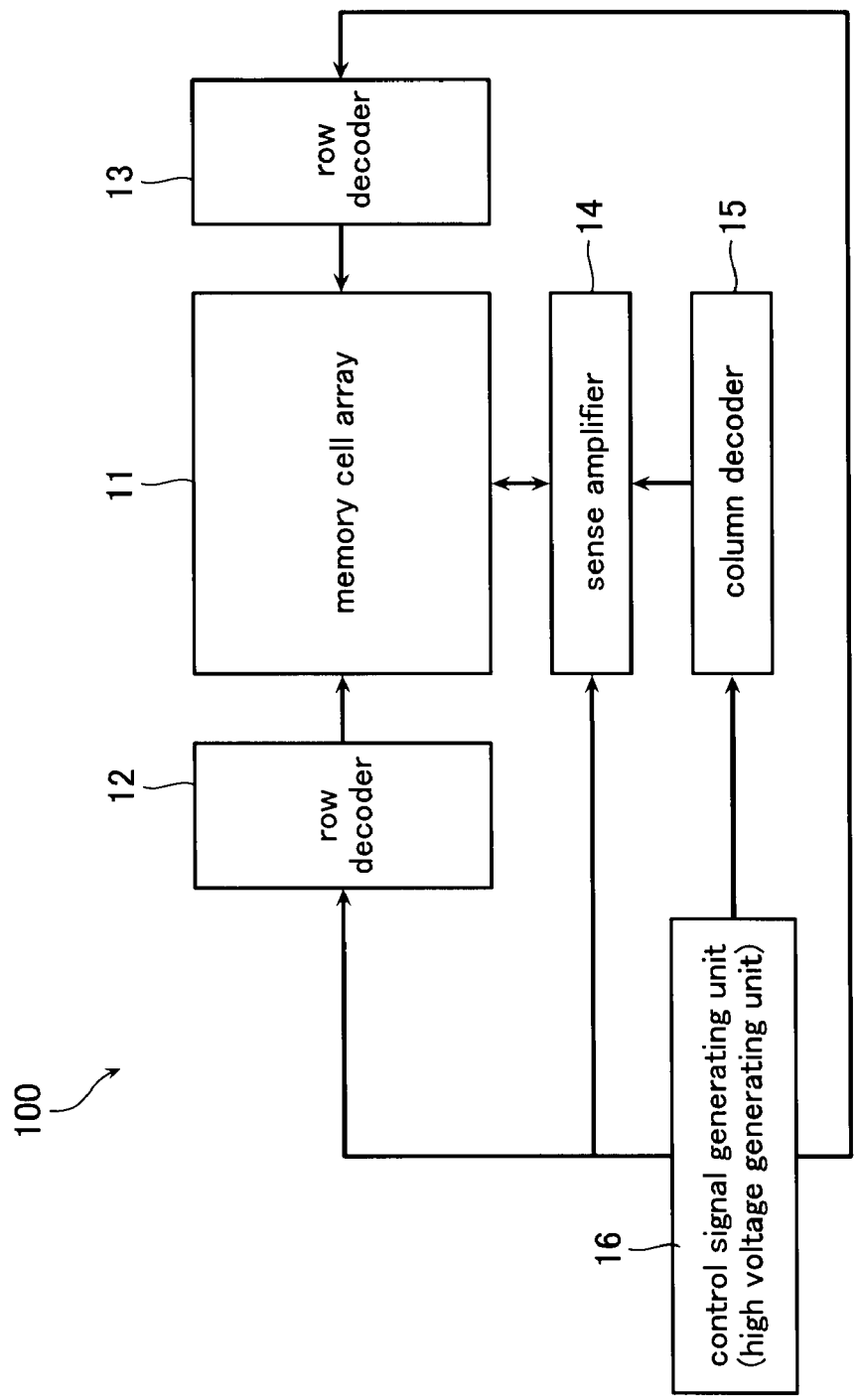
FIG. 1 is a block diagram of a nonvolatile semiconductor memory device 100 in accordance with a first embodiment of the present invention.

First, a configuration of a nonvolatile semiconductor memory device 100 in accordance with a first embodiment is described with reference to FIG. 1. FIG. 1 is a block diagram of the nonvolatile semiconductor memory device 100 in accordance with the first embodiment of the present invention.

As shown in FIG. 1, the nonvolatile semiconductor memory device 100 in accordance with the first embodiment comprises a memory cell array 11, row decoders 12 and 13, a sense amplifier 14, a column decoder 15, and a control signal generating unit (high voltage generating unit) 16.

As mentioned hereafter, the memory cell array 11 is configured having electrically data-storing memory transistors MTr arranged in a three-dimensional matrix. That is, the memory transistors MTr, as well as being arranged in a matrix in a horizontal direction, are also arranged in a stacking direction. A plurality of the memory transistors MTr aligned in the stacking direction are connected in series to configure a memory string MS. Connected to the two ends of the memory string MS are select transistors SDTr and SSTr, which are rendered conductive when selected. The memory string MS is arranged having the stacking direction as a long direction. The memory string MS is configured from NAND cell units.

The row decoders 12 and 13 decode a block address signal and so on input thereto, and control the memory cell array 11. The sense amplifier 14 reads data from the memory cell array 11. The column decoder 15 decodes a column address signal and controls the sense amplifier 14. The control signal generating unit 16 boosts a reference voltage to generate a high voltage required during write and erase, and, further, generates a control signal to control the row decoders 12 and 13, the sense amplifier 14, and the column decoder 15.

Figure 2:
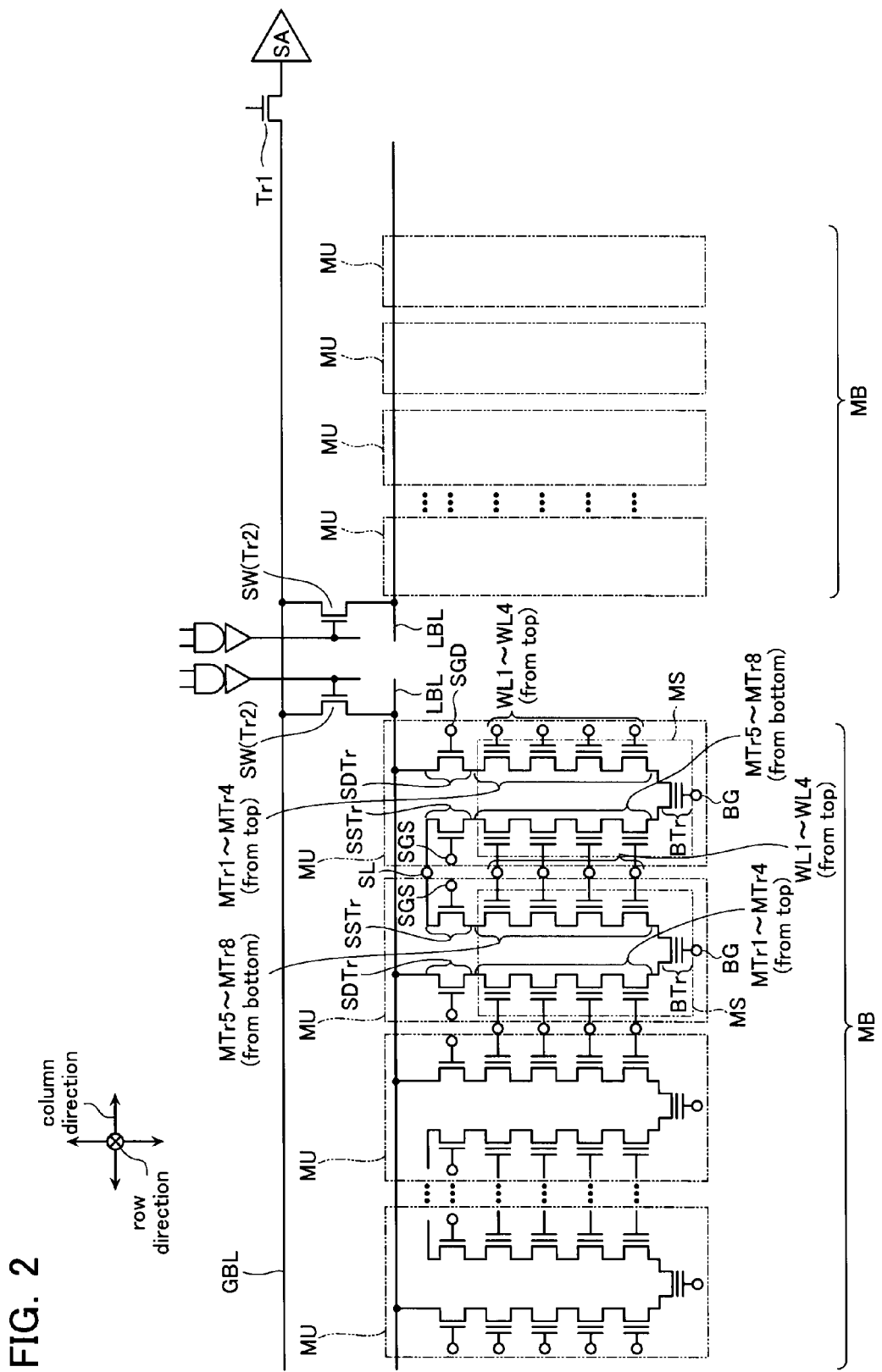
FIG. 2 is an equivalent circuit diagram of the nonvolatile semiconductor memory device 100 in accordance with the first embodiment.

Next, a circuit configuration of the memory cell array 11 is described with reference to FIG. 2. FIG. 2 is an equivalent circuit diagram of the memory transistors MTr, the select transistors SDTr and SSTr, and a peripheral circuit thereof, formed along a cross-section in a column direction of the memory cell array 11.

As shown in FIG. 2, the memory cell array 11 includes a global bit line GBL, a switch circuit SW, a local bit line LBL, and a memory block MB. The global bit line GBL, the switch circuit SW, the local bit line LBL, and the memory block MB shown in FIG. 2 are provided repeatedly in a row direction (direction orthogonal to plane of paper) with a certain pitch.

As shown in FIG. 2, one end of the global bit line GBL is connected to a sense amplifier SA via a transistor Tr1. The switch circuit SW is configured by a transistor Tr2. The transistor Tr2 has one end connected to the global bit line GBL and the other end connected to the local bit line LBL. That is, the transistor Tr2 (switch circuit SW) controls electrical connection between the global bit line GBL and the local bit line LBL, based on an address signal received by its gate. Each of the memory blocks MB is connected to a respective local bit line LBL.

As shown in FIG. 2, each of the memory blocks MB includes a plurality of memory units MU commonly connected to the local bit line LBL. Each of the memory units MU includes the memory string MS, the source side select transistor SSTr, and the drain side select transistor SDTr. The memory units MU adjacent in the column direction are formed such that a configuration thereof is mutually symmetrical in the column direction. FIG. 2 shows only memory units MU along a single cross-section in the column direction, but a plurality of such memory units MU are provided also in a direction perpendicular to the plane of paper.

The memory string MS is configured by memory transistors MTr1-MTr8 and a back gate transistor BTr connected in series. The memory transistors MTr1-MTr4 are connected in series in the stacking direction. The memory transistors MTr5-MTr8 also are similarly connected in series in the stacking direction. The memory transistors MTr1-MTr8 store information by trapping charges in a charge storage layer. The back gate transistor BTr is connected between the lowermost layer memory transistors MTr4 and MTr5. The memory transistors MTr1-MTr8 and the back gate transistor BTr are thus connected in a U shape in a cross-section in the column direction. A source of the drain side select transistor SDTr is connected to one end of the memory string MS (a drain of the memory transistor MTr1). A drain of the source side select transistor SSTr is connected to the other end of the memory string MS (a source of the memory transistor MTr8).

Gates of the memory transistors MTr1 in the memory units MU arranged in a line in the row direction are commonly connected to a word line WL1 extending in the row direction. Similarly, gates of the memory transistors MTr2-MTr8 arranged in lines in the row direction are commonly connected to word lines WL2-WL8, respectively, extending in the row direction. Note that two memory strings MS adjacent in the column direction both share the word lines WL1-WL8. Moreover, gates of the back gate transistors BTr arranged in a matrix in the row direction and the column direction are commonly connected to a back gate line BG.

Gates of each of the drain side select transistors SDTr in the memory units MU arranged in a line in the row direction are commonly connected to a drain side select gate line SGD extending in the row direction. Moreover, drains of the drain side select transistors SDTr arranged in a line in the column direction are commonly connected to the local bit line LBL.

Gates of the source side select transistors SSTr in the memory units MU arranged in a line in the row direction are commonly connected to a source side select gate line SGS extending in the row direction. Moreover, in pairs of the memory units MU adjacent in the column direction, sources of the source side select transistors SSTr arranged in a line in the row direction are commonly connected to a source line SL extending in the row direction.

Figure 3:
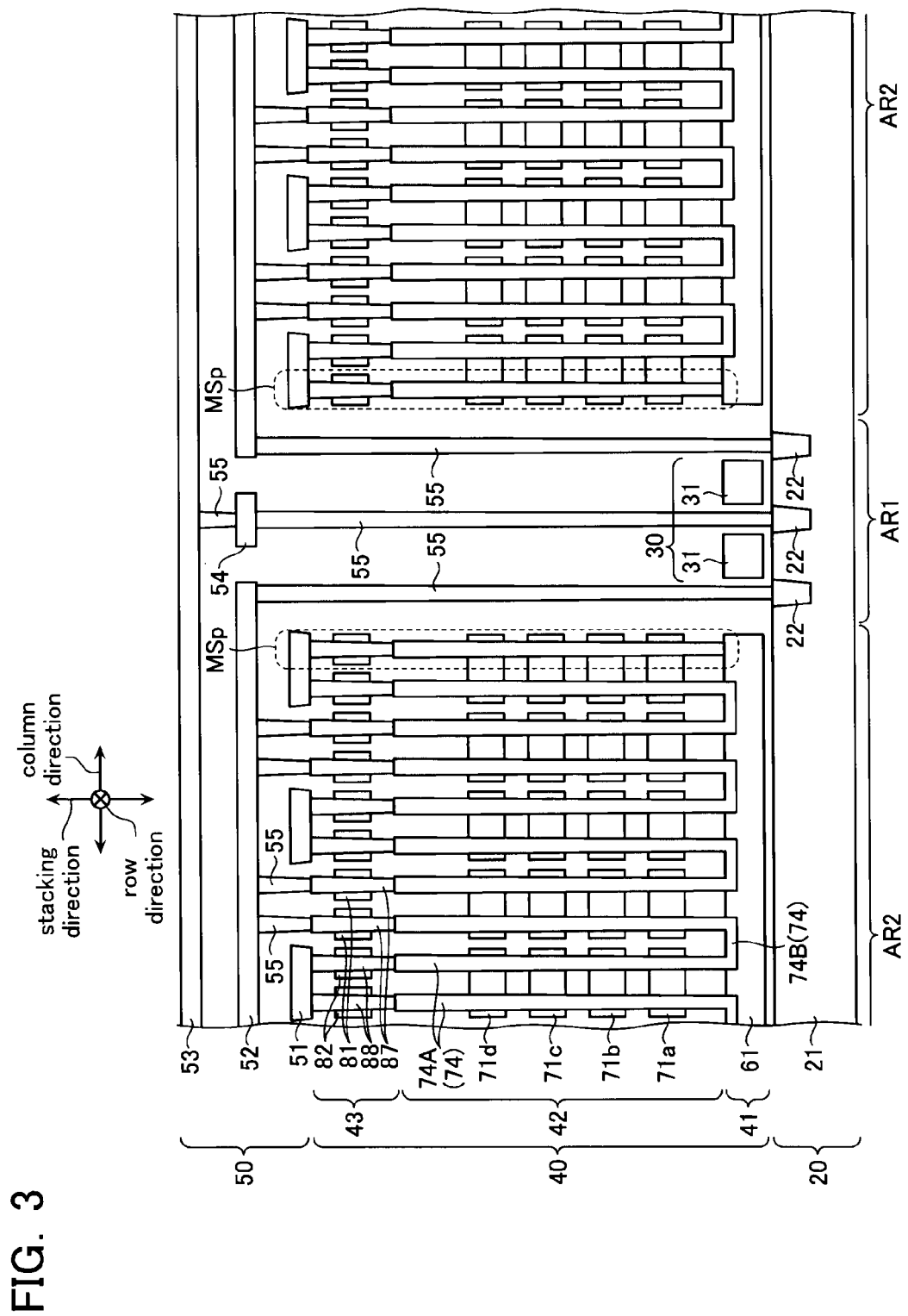
FIG. 3 is a cross-sectional view of the nonvolatile semiconductor memory device 100 in accordance with the first embodiment.

Next, a stacking structure of the nonvolatile semiconductor memory device 100 in accordance with the first embodiment configured to realize the circuit configuration shown in FIG. 2 is described with reference to FIG. 3. FIG. 3 is a cross-sectional view of the nonvolatile semiconductor memory device 100 in accordance with the first embodiment. Note that interlayer insulating layers and so on formed between the word lines WL and the select gate lines SGD and SGS are omitted from FIG. 3.

As shown in FIG. 3, the memory cell array 11 includes a plurality of first regions AR1 and a plurality of second regions AR2. The first region AR1 is provided with the switch circuit SW. The second region AR2 is provided with the memory block MB.

As shown in FIG. 3, the memory cell array 11 includes a substrate 20, a switch circuit region 30 functioning as the switch circuit SW, a memory layer 40 functioning as the memory block MB, and a wiring layer 50 functioning as the local bit line LBL, the global bit line GBL and other connecting lines.

The substrate 20 includes a substrate 21 and a plurality of diffusion layers 22, as shown in FIG. 3. The substrate 21 is formed in a plate-like shape and constituted by, for example, silicon (Si). The plurality of diffusion layers 22 are formed in an upper surface of the substrate 21 in the first region AR1 having a certain pitch in the column direction. The diffusion layer 22 is one where, for example, silicon (Si) is implanted with an impurity and functions as a source/drain of the transistor Tr2.

The switch circuit region 30 is formed on the substrate 20 in the first region AR1, as shown in FIG. 3. The switch circuit region 30 includes a conductive layer 31 functioning as a gate of the transistor Tr2. The conductive layer 31 is formed on the substrate 21 with an insulating layer (not shown) interposed therebetween and so as to straddle two of the diffusion layers 22. The conductive layer 31 is formed in the same layer as a back gate conductive layer 61 to be mentioned hereafter. The conductive layer 31 is constituted by, for example, polysilicon (poly-Si).

The memory layer 40 is formed on the substrate 20 in the second region AR2, as shown in FIG. 3. The memory layer 40 includes, sequentially from a lower layer, a back gate layer 41, a memory transistor layer 42, and a select transistor layer 43. The back gate layer 41 functions as the back gate transistor BTr. The memory transistor layer 42 functions as the memory transistors MTr1-MTr8. The select transistor layer 43 functions as the drain side select transistor SDTr and the source side select transistor SSTr. Note that detailed configuration of the above-mentioned memory layer 40 is described hereafter with reference to FIGS. 4 and 5.

The wiring layer 50 is formed in a layer above the memory layer 40, as shown in FIG. 3. The wiring layer 50 includes, sequentially from a lower layer, a first wiring layer 51, a second wiring layer 52, and a third wiring layer 53. The first wiring layer 51 functions as the source line SL. The second wiring layer 52 functions as the local bit line LBL. The third wiring layer 53 functions as the global bit line GBL.

The first wiring layer 51 is formed in the second region AR2. The first wiring layer 51 is formed extending in the row direction and having a certain pitch in the column direction. The second wiring layer 52 is in the second region AR2 and formed in a layer above the first wiring layer 51. The second wiring layer 52 is formed in stripes extending in the column direction and having a certain pitch in the row direction. The third wiring layer 53 is formed in a layer above the second wiring layer 52 so as to straddle the plurality of first regions AR1 and second regions AR2. The third wiring layer 53 is formed in stripes extending in the column direction and having a certain pitch in the row direction. The first wiring layer 51, the second wiring layer 52, and the third wiring layer 53 are configured by a stacking structure of tungsten (W)/titanium nitride (TiN)/titanium (Ti).

In addition, a wiring layer 54 and a plug layer 55 are formed as a configuration for mutually connecting these wiring layer 50 (wiring layers 51-53), switch circuit region 30 (transistor Tr2), and memory layer (memory string MS). The wiring layer 54 and plug layer 55 are configured by a stacking structure of tungsten (W)/titanium nitride (TiN)/titanium (Ti).

Note that a dotted line MSp portion of FIG. 3 is a dummy region not functioning as a memory region and may be omitted.

Figure 4:
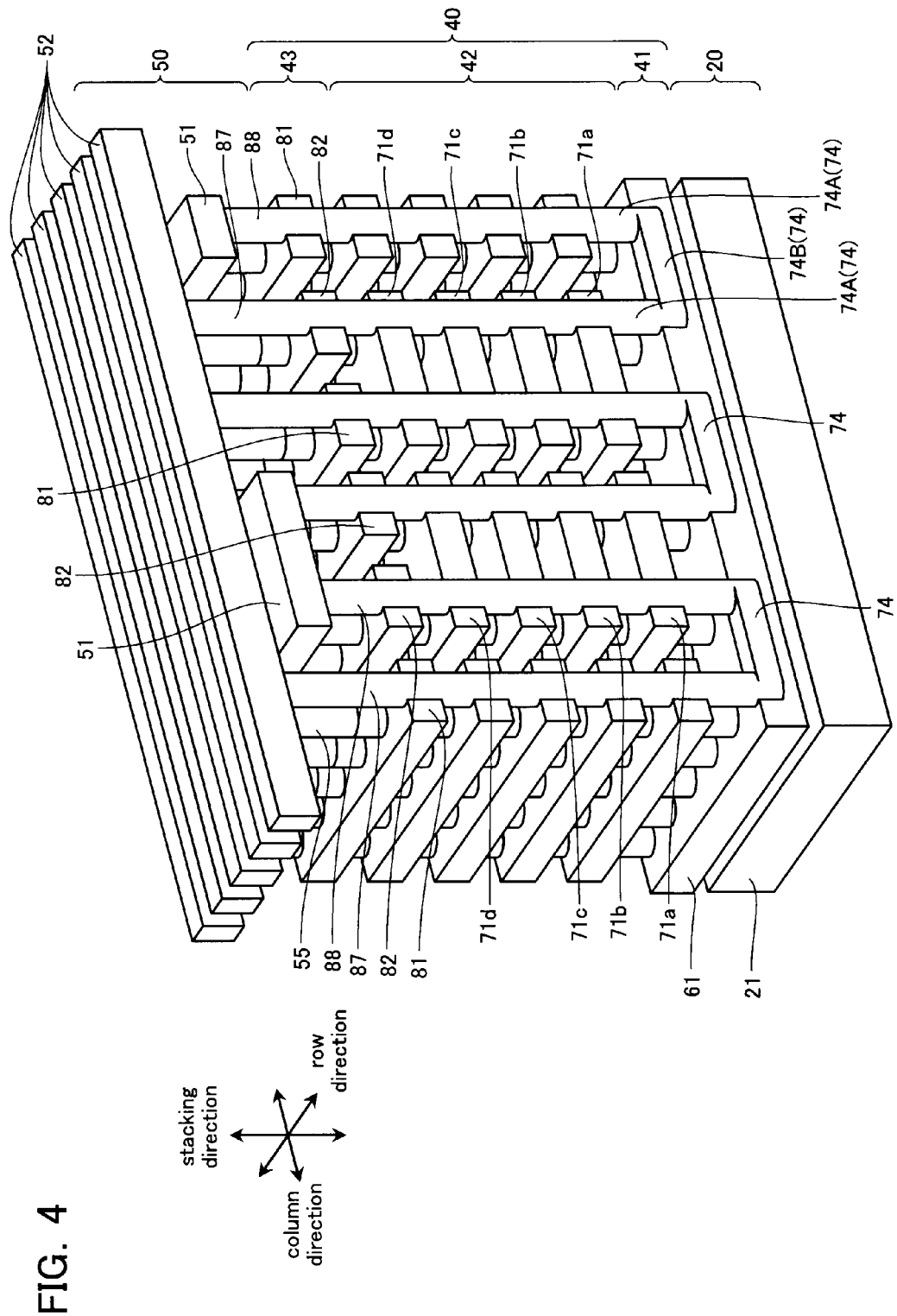
FIG. 4 is an enlarged perspective view of the nonvolatile semiconductor memory device 100 in accordance with the first embodiment.
Figure 5:
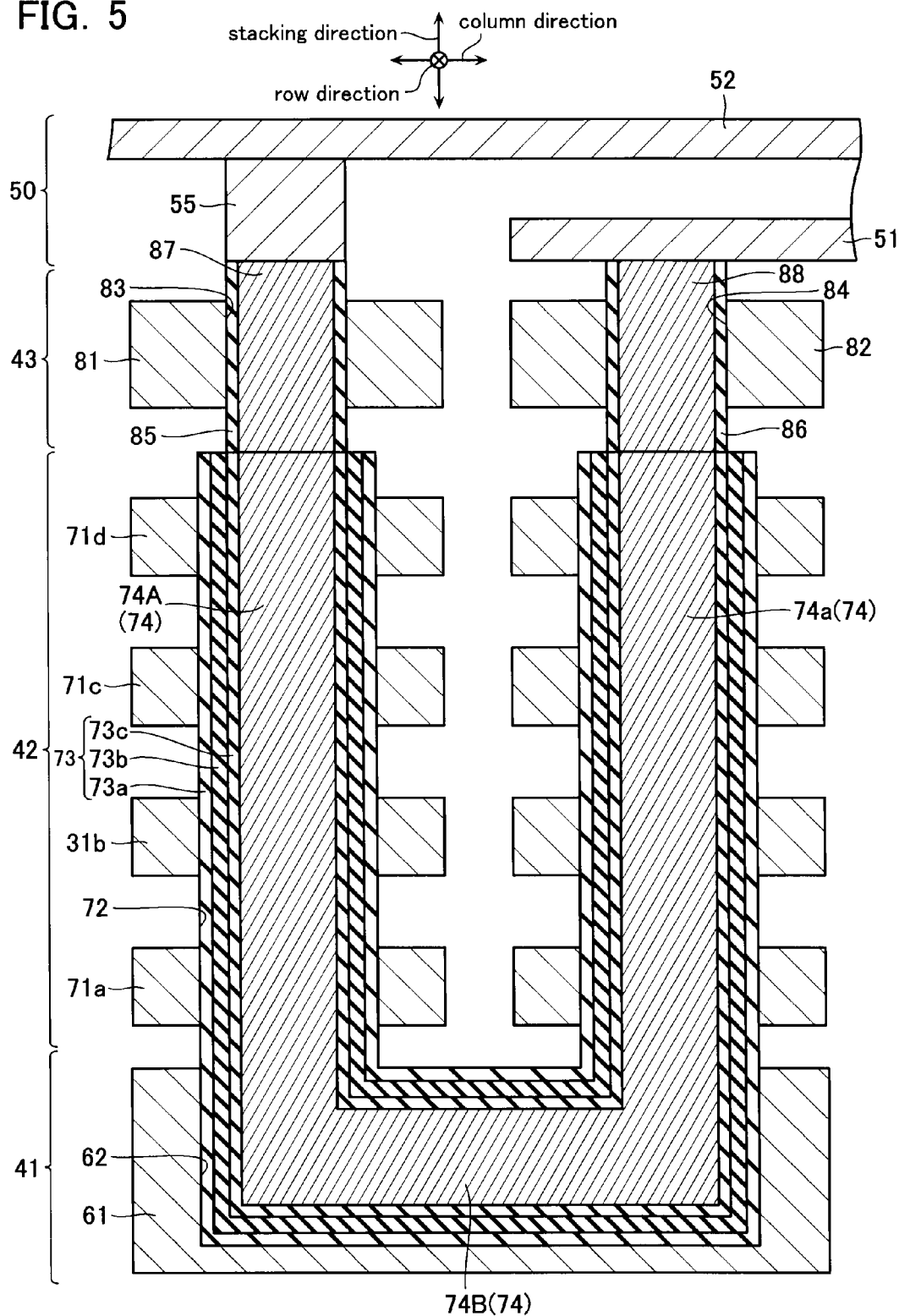
FIG. 5 is an enlarged cross-sectional view of the nonvolatile semiconductor memory device 100 in accordance with the first embodiment.

Next, each layer of the above-mentioned memory layer 40 (back gate layer 41, memory transistor layer 42, and select transistor layer 43) is described in detail with reference to FIGS. 4 and 5. FIG. 4 is an enlarged perspective view of the nonvolatile semiconductor memory device 100 in accordance with the first embodiment. FIG. 5 is an enlarged cross-sectional view of the nonvolatile semiconductor memory device 100 in accordance with the first embodiment. Note that, likewise in FIGS. 4 and 5, interlayer insulating films between lines are not shown.

The back gate layer 41 includes a back gate conductive layer 61 formed on the substrate 20 with an insulating layer (not shown) interposed therebetween, as shown in FIGS. 4 and 5. The back gate conductive layer 61 functions as the back gate line BG and as a gate of the back gate transistor BTr. The back gate conductive layer 61 is formed in a planar shape extending in the row direction and the column direction. The back gate conductive layer 61 covers a lower surface and a side surface of a joining portion 74B of a U-shaped semiconductor layer 74 to be described hereafter, and is formed to the same height as an upper surface of the joining portion 74B. The back gate conductive layer 61 is constituted by polysilicon (poly-Si).

In addition, the back gate layer 41 includes a back gate hole 62 formed so as to dig out the back gate conductive layer 61, as shown in FIG. 5. The back gate hole 62 is configured as an opening having a short side in the row direction and a long side in the column direction. The back gate hole 62 is formed in a matrix at certain intervals in the row direction and the column direction.

The memory transistor layer 42 includes word line conductive layers 71a-71d formed with a certain pitch in the stacking direction, as shown in FIGS. 4 and 5. The word line conductive layers 71a-71d function as the word lines WL1-WL8 and as a gate of the memory transistors MTr1-MTr8. The word line conductive layers 71a-71d are formed in stripes extending in the row direction and having a certain pitch in the column direction. The word line conductive layers 71a-71d are constituted by polysilicon (poly-Si).

In addition, the memory transistor layer 42 includes a memory hole 72 formed so as to penetrate the word line conductive layers 71a-71d, as shown in FIG. 5. The memory hole 72 is formed so as to be aligned with a position of the two end vicinities in the column direction of each back gate hole 62.

In addition, the above-described back gate layer 41 and memory transistor layer 42 include a memory gate insulating layer 73 and the U-shaped semiconductor layer 74 which functions as a body of the memory transistors MTr1-MTr8, as shown in FIG. 5. The memory gate insulating layer 73 is formed on a side surface of the memory hole 72 and the back gate hole 62, as shown in FIG. 5. The memory gate insulating layer 73 is configured by a block insulating layer 73a, a charge storage layer 73b, and a tunnel insulating layer 73c. The block insulating layer 73a is formed along the side surface of the memory hole 72 and the back gate hole 62 so as to be in contact with the word line conductive layers 71a-71d. The block insulating layer 73a is constituted by silicon oxide ($SiO_2$). The charge storage layer 73b is formed on a side surface of the block insulating layer 73a. The charge storage layer 73b is constituted by silicon nitride (SiN). The tunnel insulating layer 73c is formed along a side surface of the charge storage layer 73b so as to be in contact with the U-shaped semiconductor layer 74. The tunnel insulating layer 73c is constituted by silicon oxide ($SiO_2$).

The U-shaped semiconductor layer 74 is formed in a U shape as viewed from the row direction, as shown in FIG. 5. The U-shaped semiconductor layer 74 is formed so as to be in contact with the tunnel insulating layer 73c and so as to fill the back gate hole 62 and the memory hole 72. The U-shaped semiconductor layer 74 includes a pair of columnar portions 74A extending in a perpendicular direction to the substrate 20 as viewed from the row direction, and the joining portion 74B formed so as to join lower ends of the pair of columnar portions 74A. The U-shaped semiconductor layer 74 is constituted by polysilicon (poly-Si). The aforementioned back gate conductive layer 61 is formed to the same height as an upper surface of the joining portion 74B.

Expressing the above-described configuration of the memory transistor layer 42 in other words, the tunnel insulating layer 73c is formed so as to surround a side surface of the columnar portion 74A. The charge storage layer 73b is formed so as to surround a side surface of the tunnel insulating layer 73c. The block insulating layer 73a is formed so as to surround a side surface of the charge storage layer 73b. The word line conductive layers 71a-71d are formed so as to surround a side surface of the block insulating layer 73a.

The select transistor layer 43 includes a drain side conductive layer 81 and a source side conductive layer 82 formed in the same layer as the drain side conductive layer 81, as shown in FIG. 4. The drain side conductive layer 81 functions as the drain side select gate line SGD and as a gate of the drain side select transistor SDTr. The source side conductive layer 82 functions as the source side select gate line SGS and as a gate of the source side select transistor SSTr.

The drain side conductive layer 81 and the source side conductive layer 82 are formed in stripes extending in the row direction and having a certain pitch in the column direction. The drain side conductive layer 81 and the source side conductive layer 82 are provided alternately two at a time in the column direction. The drain side conductive layer 81 and the source side conductive layer 82 are constituted by polysilicon (poly-Si).

In addition, the select transistor layer 43 includes a drain side hole 83 and a source side hole 84, as shown in FIG. 5. The drain side hole 83 is formed so as to penetrate the drain side conductive layer 81. The source side hole 84 is formed so as to penetrate the source side conductive layer 82. The drain side hole 83 and the source side hole 84 are formed at a position aligning with the memory hole 72.

Moreover, the select transistor layer 43 includes a drain side gate insulating layer 85, a source side gate insulating layer 86, a drain side columnar semiconductor layer 87 which functions as a body of the drain side select transistor SDTr, and a source side columnar semiconductor layer 88 which functions as a body of the source side select transistor SSTr.

The drain side gate insulating layer 85 is formed on a side surface of the drain side hole 83. The source side gate insulating layer 86 is formed on a side surface of the source side hole 84. The drain side gate insulating layer 85 and the source side gate insulating layer 86 are constituted by silicon oxide ($SiO_2$). The drain side columnar semiconductor layer 87 is formed in a column shape extending in the stacking direction and in contact with the drain side gate insulating layer 85, and so as to fill the drain side hole 83. The drain side columnar semiconductor layer 87 is formed to have its upper surface in contact with a lower surface of the plug layer 55. The source side columnar semiconductor layer 88 is formed in a column shape extending in the stacking direction and in contact with the source side gate insulating layer 86, and so as to fill the source side hole 84. The source side columnar semiconductor layer 88 is formed to have its upper surface in contact with a lower surface of the first wiring layer 51. The drain side columnar semiconductor layer 87 and the source side columnar semiconductor layer 88 are constituted by polysilicon (poly-Si).

Expressing the above-described configuration of the select transistor layer 43 in other words, the drain side gate insulating layer 85 is formed so as to surround a side surface of the drain side columnar semiconductor layer 87. The drain side conductive layer 81 is formed so as to surround a side surface of the drain side gate insulating layer 85. The source side gate insulating layer 86 is formed so as to surround a side surface of the source side columnar semiconductor layer 88. The source side conductive layer 82 is formed so as to surround a side surface of the source side gate insulating layer 86.

[Advantages of the Nonvolatile Semiconductor Memory Device 100 in Accordance with the First Embodiment]

The nonvolatile semiconductor memory device 100 in accordance with the first embodiment includes a plurality of local bit lines LBL to which memory units MU are connected, a plurality of switch circuits SW (transistors Tr2), and a plurality of global bit lines GBL. Furthermore, one global bit line GBL is connected to the plurality of local bit lines LBL via the plurality of switch circuits SW. It is therefore possible by controlling the switch circuits SW during execution of various specified operations to connect to the global bit line GBL only the local bit line LBL connected to a selected memory string. This enables a current flowing in unselected memory strings to be reduced and an accurate read to be executed.

[Second Embodiment]
[Configuration of a Nonvolatile Semiconductor Memory Device in Accordance with a Second Embodiment]

Figure 6:
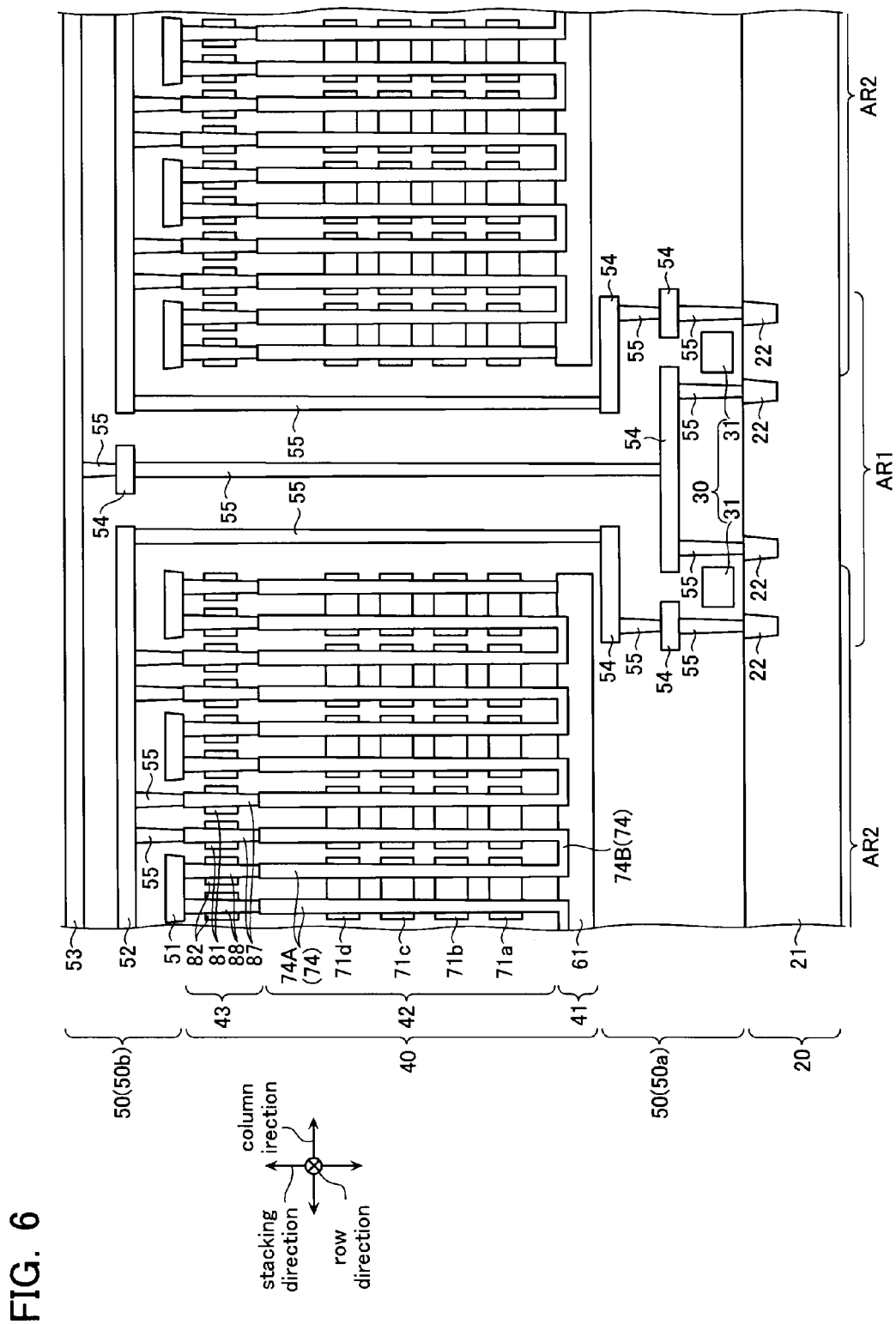
FIG. 6 is a cross-sectional view of a nonvolatile semiconductor memory device in accordance with a second embodiment.

Next, a configuration of a nonvolatile semiconductor memory device in accordance with a second embodiment is described with reference to FIG. 6. FIG. 6 is a cross-sectional view of the nonvolatile semiconductor memory device in accordance with the second embodiment. Note that in the second embodiment, identical symbols are assigned to configurations similar to those in the first embodiment and descriptions thereof are omitted.

As shown in FIG. 6, the nonvolatile semiconductor memory device in accordance with the second embodiment has the wiring layer 50 formed not only in a layer above the memory layer 40 (wiring layer 50b) but also in a layer below the memory layer 40 (wiring layer 50a), and has the switch circuit region 30 provided in this wiring layer 50a in the layer below the memory layer 40. This differs from the first embodiment in which, as well as the switch circuit region 30 being formed within the memory layer 40, the wiring layer 50 is formed only in the layer above the memory layer 40.

The switch circuit region 30 is formed in the wiring layer 50a in the layer below the memory layer 40, as shown in FIG. 6.

[Advantages of the Nonvolatile Semiconductor Memory Device in Accordance With the Second Embodiment]

The nonvolatile semiconductor memory device in accordance with the second embodiment includes the switch circuit region 30 in the layer below the memory layer 40. The nonvolatile semiconductor memory device in accordance with the second embodiment can therefore have its occupied area reduced in comparison with that of the first embodiment that includes the switch circuit region 30 between the memory layers 40.

[Third Embodiment]
[Configuration of a Nonvolatile Semiconductor Memory Device in Accordance with a Third Embodiment]

Figure 7:
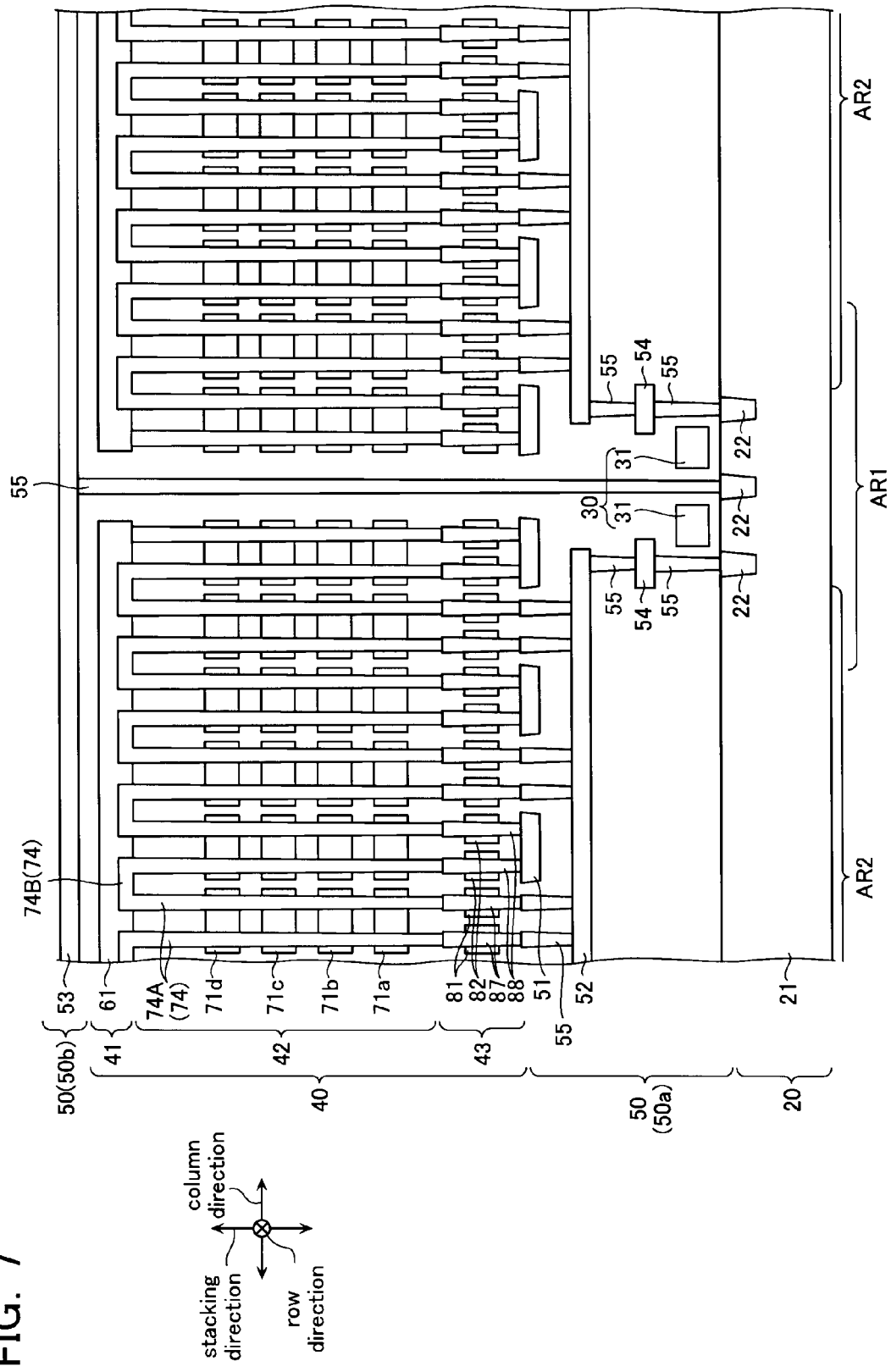
FIG. 7 is a cross-sectional view of a nonvolatile semiconductor memory device in accordance with a third embodiment.

Next, a configuration of a nonvolatile semiconductor memory device in accordance with a third embodiment is described with reference to FIG. 7. FIG. 7 is a cross-sectional view of the nonvolatile semiconductor memory device in accordance with the third embodiment. Note that in the third embodiment, identical symbols are assigned to configurations similar to those in the first and second embodiments and descriptions thereof are omitted.

As shown in FIG. 7, the nonvolatile semiconductor memory device in accordance with the third embodiment has the memory layer 40 configured with a stacking structure that is the stacking structure of the first embodiment with top and bottom inverted. That is, as shown in FIG. 7, the memory layer 40 in the third embodiment which includes, from a lower layer to an upper layer, the select transistor layer 43, the memory transistor layer 42, and the back gate layer 41, has a stacking structure that is the reverse of that of the previously mentioned embodiments.

The first wiring layer 51 which functions as the source line SL and the second wiring layer 52 which functions as the local bit line LBL are formed in the wiring layer 50a in the layer below the memory layer 40. In contrast, the third wiring layer 53 which functions as the global bit line GBL is formed in wiring layer 50b in an upper layer.

[Advantages of the Nonvolatile Semiconductor Memory Device in Accordance with the Third Embodiment]

The nonvolatile semiconductor memory device in accordance with the third embodiment displays similar advantages to the second embodiment. In addition, the nonvolatile semiconductor memory device in accordance with the third embodiment has the second wiring layer (local bit line LBL) formed more adjacent to the conductive layer 31 (transistor Tr2 configuring the switch circuit SW) than in the second embodiment. Therefore, in the nonvolatile semiconductor memory device in accordance with the third embodiment, the wiring resistance between the local bit line LBL and the switch circuit SW can be reduced more than in the second embodiment.

[Fourth Embodiment]

Figure 8:
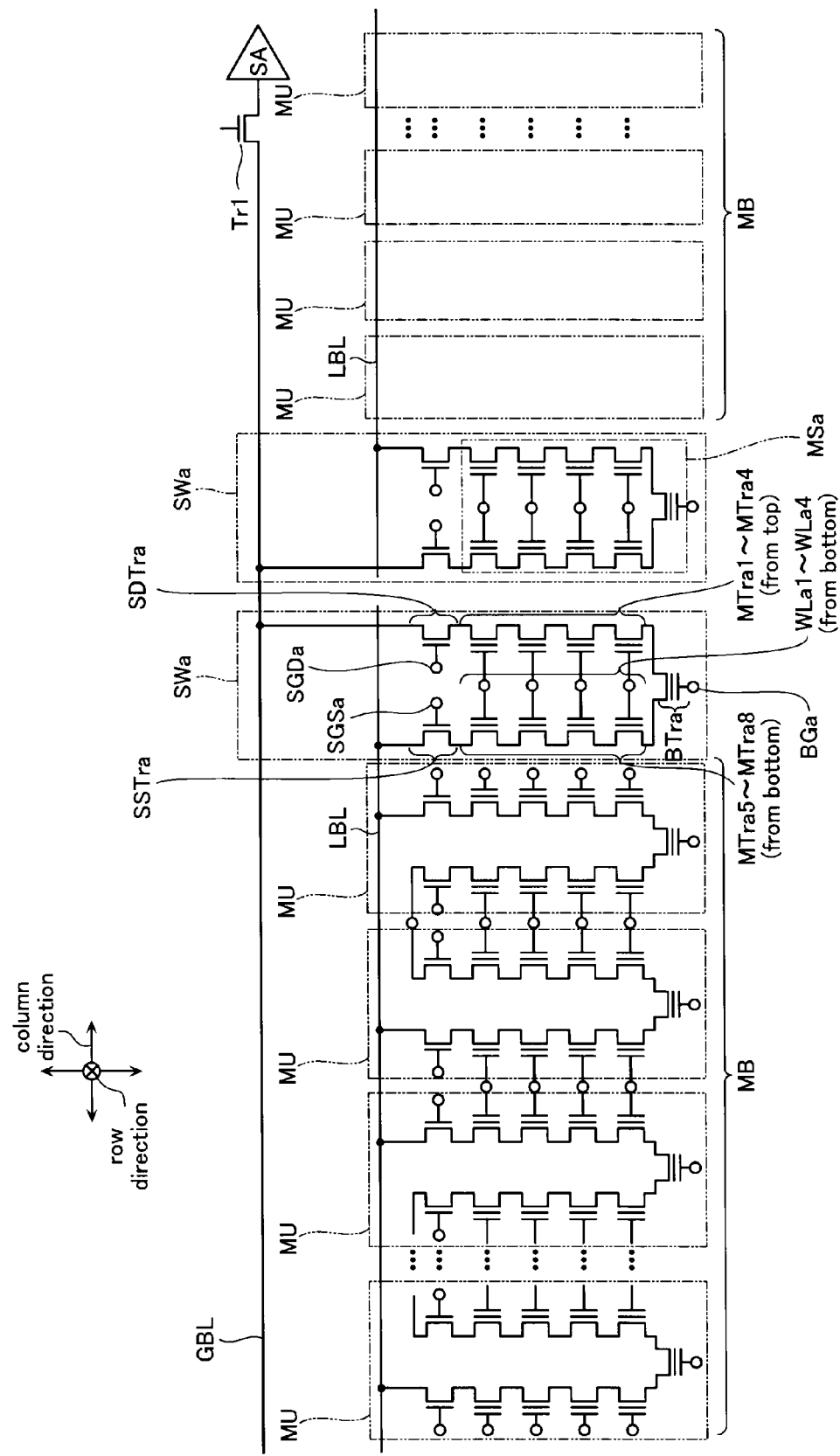
FIG. 8 is an equivalent circuit diagram of a nonvolatile semiconductor memory device in accordance with a fourth embodiment.

Next, a configuration of a nonvolatile semiconductor memory device in accordance with a fourth embodiment is described with reference to FIG. 8. FIG. 8 is a circuit diagram of the nonvolatile semiconductor memory device in accordance with the fourth embodiment. Note that in the fourth embodiment, identical symbols are assigned to configurations similar to those in the first through third embodiments and descriptions thereof are omitted.

The nonvolatile semiconductor memory device in accordance with the fourth embodiment includes a switch circuit SWa in place of the switch circuit SW. This switch circuit SWa has a structure substantially similar to that of the memory unit MU, as shown in FIG. 4. The switch circuit SWa controls electrical connection between the global bit line GBL and the local bit line LBL, similarly to the switch circuit SW in the first through third embodiments. The switch circuit SWa includes a memory string MSa, a drain side select transistor SDTra, and a source side select transistor SSTra.

The memory string MSa includes memory transistors MTra1-MTra8 and a back gate transistor BTra connected in series. The memory transistors MTra1-MTra8 and the back gate transistor BTra have identical structures to those of the memory transistors MTr1-MTr8 and the back gate BTr in the memory block MB.

Gates of the memory transistors MTra4 and MTra5 are commonly connected to a word line WLa1. Gates of the memory transistors MTra3 and MTra6 are commonly connected to a word line WLa2. Gates of the memory transistors MTra2 and MTra7 are commonly connected to a word line WLa3. Gates of the memory transistors MTra1 and MTra8 are commonly connected to a word line WLa4. The back gate transistor BTra is provided between the memory transistor MTra4 and the memory transistor MTra5. A gate of the back gate transistor BTra is connected to a back gate line BGa.

A source of the drain side select transistor SDTra is connected to a drain of the memory transistor MTra1, and a drain of the drain side select transistor SDTra is connected to the global bit line GBL. Moreover, a gate of the drain side select transistor SDTra is connected to a drain side select gate line SGDa.

A drain of the source side select transistor SSTra is connected to a source of the memory transistor MTra8, and a source of the source side select transistor SSTra is connected to the local bit line LBL. Moreover, a gate of the source side select transistor SSTra is connected to a source side select gate line SGSa.

During execution of various specified operations, the switch circuit SWa having the above-described configuration sets to an on state all of the memory transistors MTra1-MTra8, the back gate transistor BTra, the drain side select transistor SDTra, and the source side select transistor SSTra. This causes the local bit line LBL and the global bit line GBL to be electrically connected.

Figure 9:
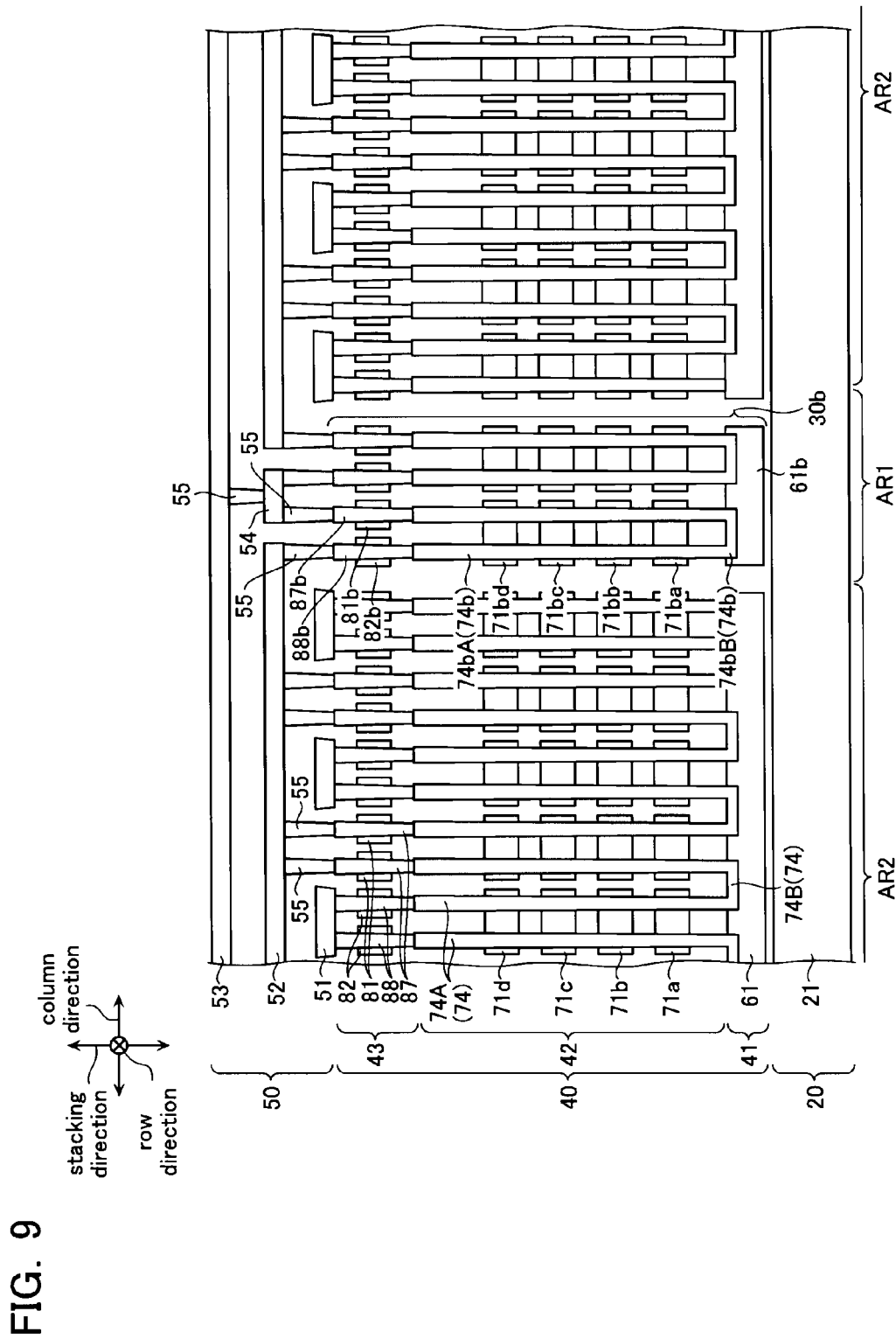
FIG. 9 is a cross-sectional view of the nonvolatile semiconductor memory device in accordance with the fourth embodiment.

Next, a stacking structure of the nonvolatile semiconductor memory device in accordance with the fourth embodiment is described with reference to FIG. 9. FIG. 9 is a cross-sectional view of the nonvolatile semiconductor memory device in accordance with the fourth embodiment.

As shown in FIG. 9, a switch circuit region 30b is formed between memory layers 40 adjacent in the column direction. The switch circuit region 30b functions as the switch circuit SWa.

A back gate conductive layer 61b, word line conductive layers 71ba-71bd, and a U-shaped semiconductor layer 74b are formed in the switch circuit region 30b. These may be formed to an identical height as, may be configured with an identical shape and from an identical material as, and, further, may be formed by an identical process as, respectively, the back gate conductive layer 61, the word line conductive layers 71a-71d, and the U-shaped semiconductor layer 74.

The back gate conductive layer 61b functions as the back gate line BGa, and as a gate of the back gate transistor BTra.

The word line conductive layers 71ba-71bd function as the word lines WLa1-WLa4, and as gates of the memory transistors MTra1-MTra8. Moreover, the word line conductive layers 71ba-71bd are formed in the same layer as the word line conductive layers 71a-71d.

The U-shaped semiconductor layer 74b functions as a body of the memory transistors MTra1-MTra8, and as a body of the back gate transistor BTra. The U-shaped semiconductor layer 74b includes a pair of columnar portions 74bA and a joining portion 74bB configured to join lower ends of the pair of columnar portions 74bA. The pair of columnar portions 74bA are formed so as to be surrounded by the word line conductive layers 71ba-71bd with a memory gate insulating layer interposed therebetween. The joining portion 74bB is formed so as to be surrounded by the back gate conductive layer 61b with a memory gate insulating layer interposed therebetween. The U-shaped semiconductor layer 74b is constituted by polysilicon (poly-Si).

Note that the memory gate insulating layer in the fourth embodiment has a similar stacking structure to that of the memory gate insulating layer 73 in the first embodiment.

In addition, a drain side conductive layer 81b, a source side conductive layer 82b, a drain side columnar semiconductor layer 87b, and a source side columnar semiconductor layer 88b are formed in the switch circuit region 30b. The drain side conductive layer 81b, source side conductive layer 82b, drain side columnar semiconductor layer 87b, and source side columnar semiconductor layer 88b can be manufactured in the same layer, in an identical manufacturing process, and so as to have an identical shape and material as the drain side conductive layer 81, source side conductive layer 82, drain side columnar semiconductor layer 87, and source side columnar semiconductor layer 88.

The drain side conductive layer 81b functions as the drain side select gate line SGDa and as a gate of the drain side select transistor SDTra. The source side conductive layer 82b functions as the source side select gate line SGSa and as a gate of the source side select transistor SSTra. The drain side conductive layer 81b and the source side conductive layer 82b are formed in stripes extending in the row direction and having a certain pitch in the column direction.

The drain side columnar semiconductor layer 87b and the source side columnar semiconductor layer 88b are formed so as to penetrate the drain side conductive layer 81b and the source side conductive layer 82b. The drain side columnar semiconductor layer 87b functions as a body of the drain side select transistor SDTra. The source side columnar semiconductor layer 88b functions as a body of the source side select transistor SSTra.

The drain side columnar semiconductor layer 87b is formed in a column shape extending upwardly from an upper end of one of the columnar portions 74bA of the U-shaped semiconductor layer 74b. The drain side columnar semiconductor layer 87b is electrically connected to the third wiring layer 53 via the wiring layer 54 and the plug layer 55. The drain side columnar semiconductor layer 87b is formed so as to be surrounded by the drain side conductive layer 81b with a drain side gate insulating layer ($SiO_2$) interposed therebetween.

The source side columnar semiconductor layer 88b is formed in a column shape extending upwardly from an upper end of the other of the columnar portions 74bA of the U-shaped semiconductor layer 74b. The source side columnar semiconductor layer 88b is electrically connected to the second wiring layer 52 via the plug layer 55. The source side columnar semiconductor layer 88b is formed so as to be surrounded by the source side conductive layer 82b with a source side gate insulating layer ($SiO_2$) interposed therebetween.

[Advantages of the Nonvolatile Semiconductor Memory Device in Accordance with the Fourth Embodiment]

The nonvolatile semiconductor memory device in accordance with the fourth embodiment includes the switch circuit region 30b having a switch circuit SWa with a configuration substantially similar to that of the memory strings MS formed in the memory layer 40. In addition, the switch circuit region 30b can be manufactured in substantially similar manufacturing processes to those of the memory layer 40. That is, the nonvolatile semiconductor memory device in accordance with the fourth embodiment enables the number of manufacturing processes to be reduced in comparison with, and manufacture to be performed at a lower cost than in the first through third embodiments.

[Fifth Embodiment]

Figure 10:
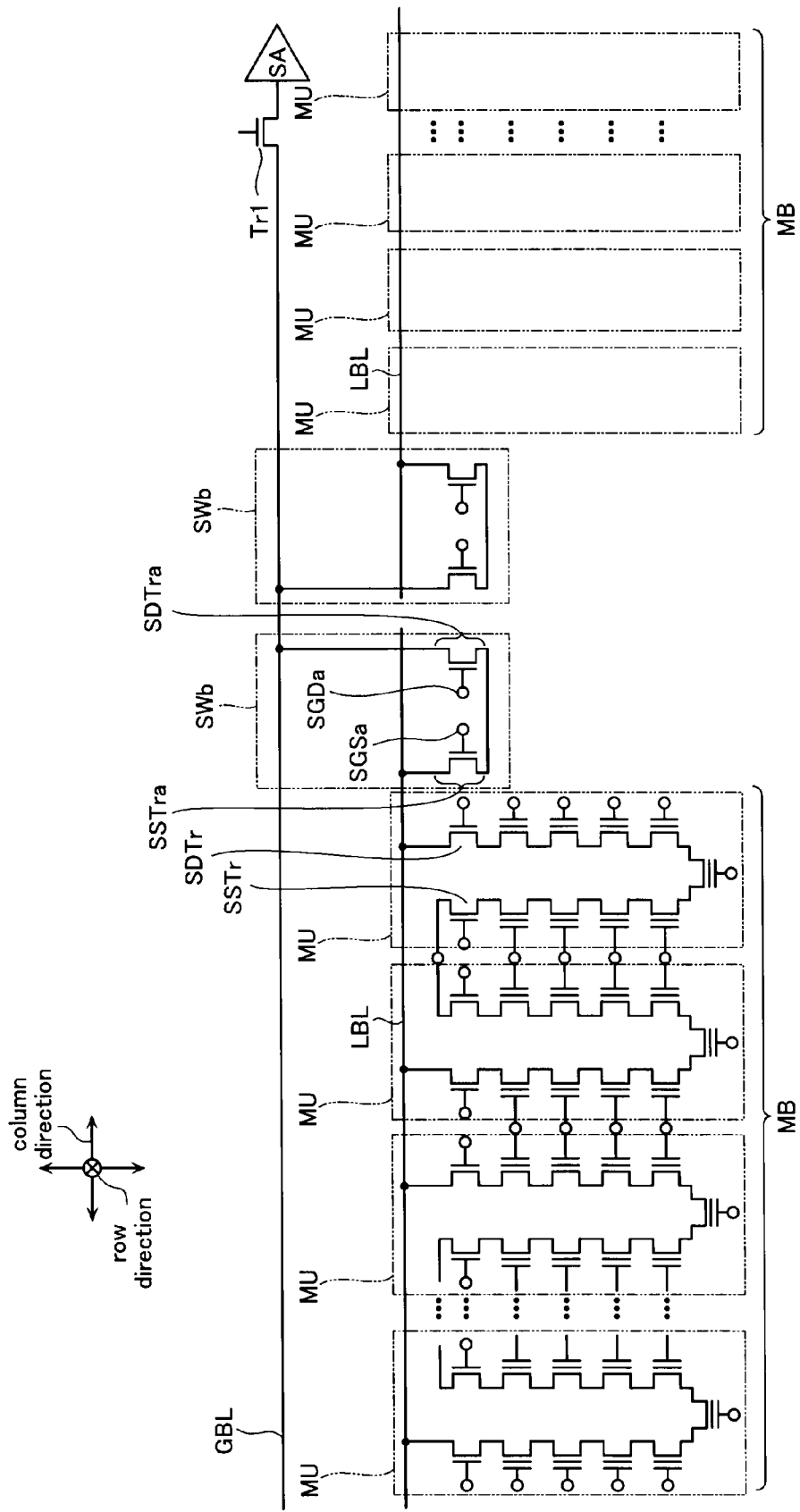
FIG. 10 is an equivalent circuit diagram of a nonvolatile semiconductor memory device in accordance with a fifth embodiment.

Next, a configuration of a nonvolatile semiconductor memory device in accordance with a fifth embodiment is described with reference to FIG. 10. FIG. 10 is a circuit diagram of the nonvolatile semiconductor memory device in accordance with the fifth embodiment. Note that in the fifth embodiment, identical symbols are assigned to configurations similar to those in the first through fourth embodiments and descriptions thereof are omitted.

The nonvolatile semiconductor memory device in accordance with the fifth embodiment has a switch circuit SWb that controls electrical connection between the global bit line GBL and the local bit line LBL similarly to the first through fourth embodiments. The switch circuit SWb has a configuration that is the configuration of the fourth embodiment with the memory string MSa omitted. That is, the switch circuit SWb is configured by a first select transistor SDTra and a second select transistor SSTra connected in series. These first select transistor SDTra and second select transistor SSTra have an identical configuration to that of the select transistors SDTr and SSTr in the memory layer, and are manufactured in identical manufacturing processes.

During execution of various specified operations, the switch circuit SWb having the above-described configuration sets to an on state both of the drain side select transistor SDTra and the source side select transistor SSTra. This causes the local bit line LBL and the global bit line GBL to be electrically connected.

Figure 11:
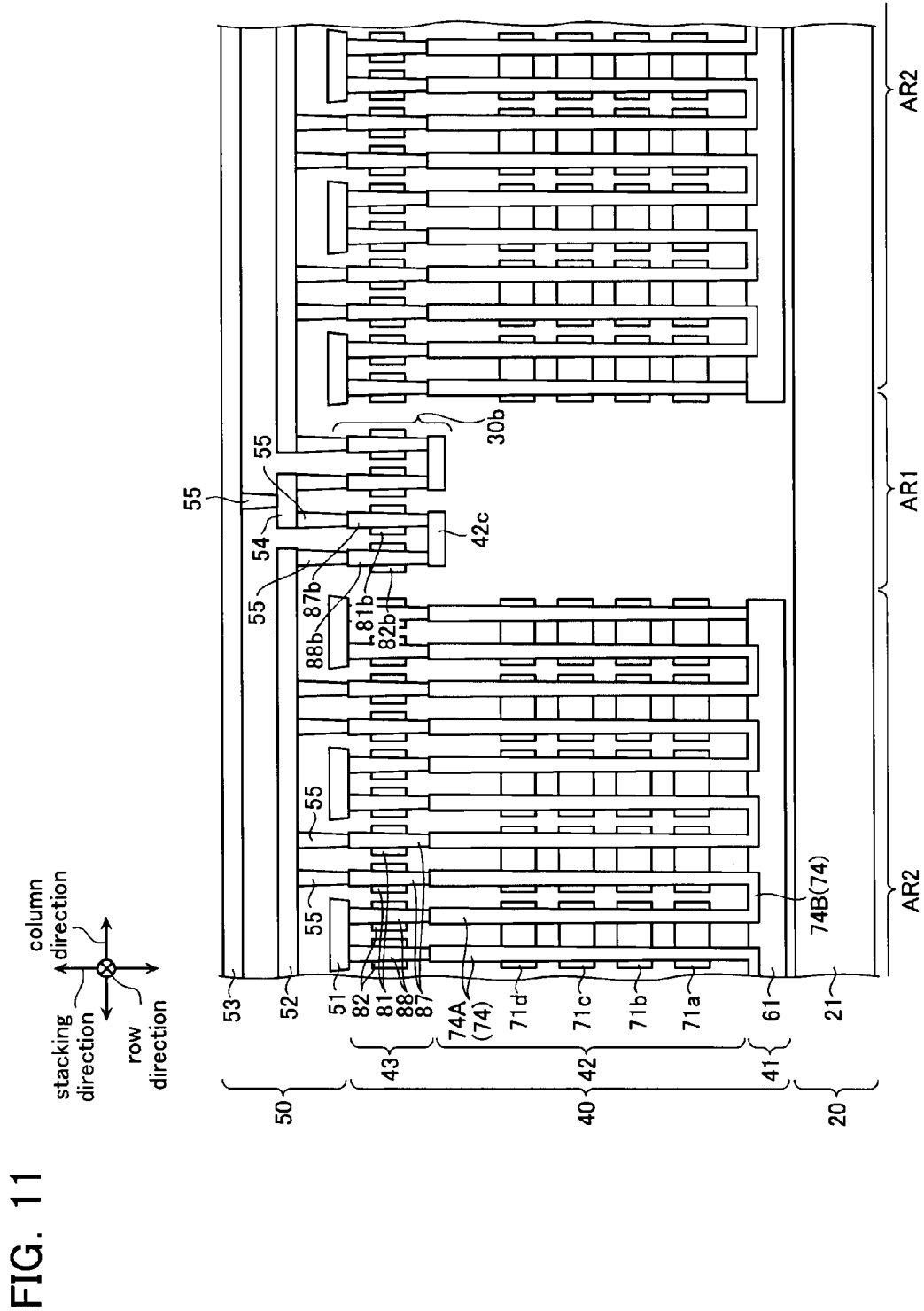
FIG. 11 is a cross-sectional view of the nonvolatile semiconductor memory device in accordance with the fifth embodiment.

Next, a stacking structure of the nonvolatile semiconductor memory device in accordance with the fifth embodiment is described with reference to FIG. 11. FIG. 11 is a cross-sectional view of the nonvolatile semiconductor memory device in accordance with the fifth embodiment.

The switch circuit region 30b includes a joining layer 42c. The joining layer 42c is formed so as to join a lower end of the drain side columnar semiconductor layer 87b and a lower end of the source side columnar semiconductor layer 88b. The joining layer 42c is constituted by polysilicon (poly-Si).

[Advantages of the Nonvolatile Semiconductor Memory Device in Accordance with the Fifth Embodiment]

The nonvolatile semiconductor memory device in accordance with the fifth embodiment displays similar advantages to the fourth embodiment. In addition, the configuration of the switch circuit SWb having the memory string MSa omitted enables electrical resistance of the switch circuit SWb in the nonvolatile semiconductor memory device in accordance with the fifth embodiment to be reduced.

[Sixth Embodiment]

Figure 12:
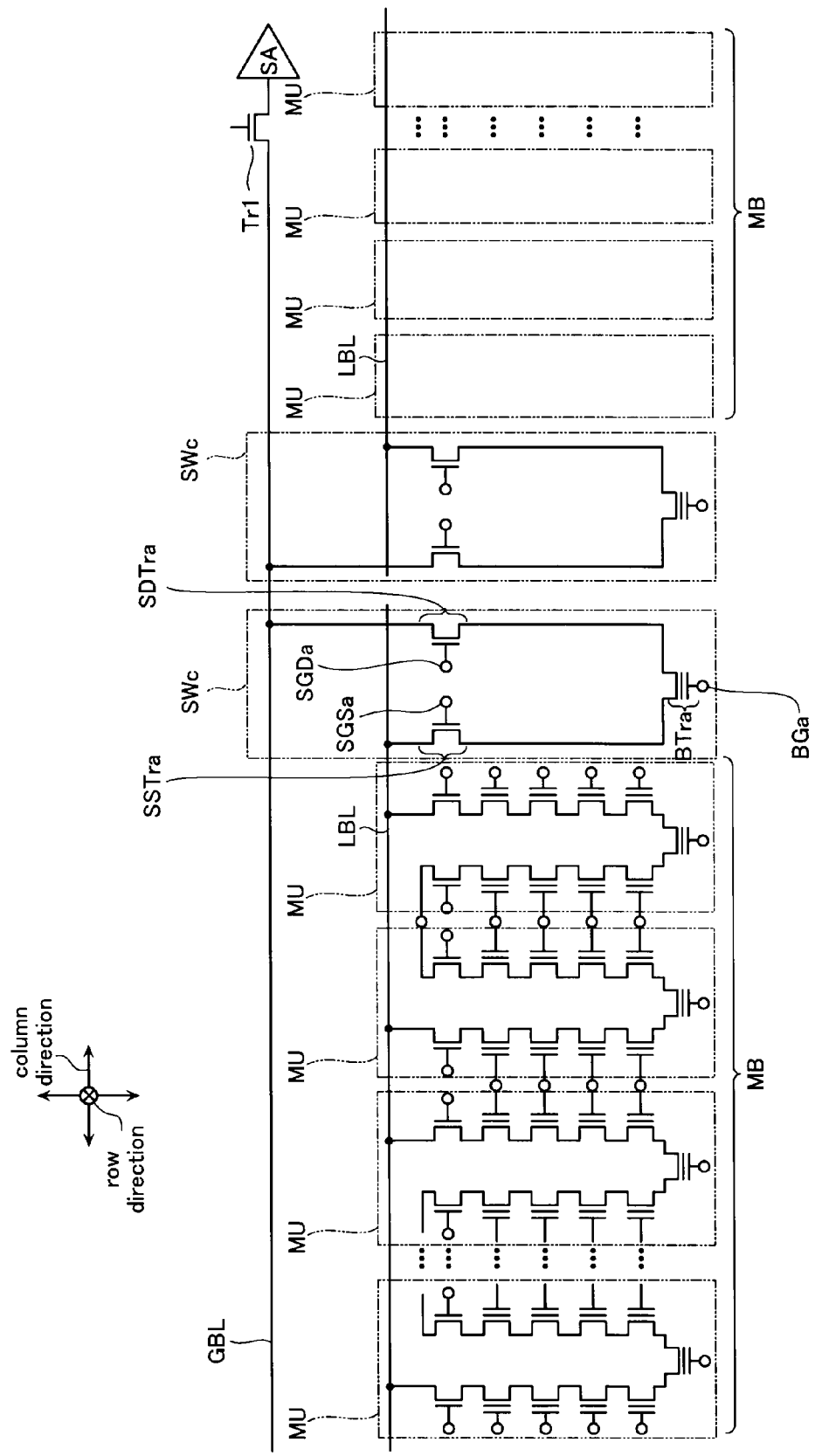
FIG. 12 is an equivalent circuit diagram of a nonvolatile semiconductor memory device in accordance with a sixth embodiment.

Next, a configuration of a nonvolatile semiconductor memory device in accordance with a sixth embodiment is described with reference to FIG. 12. FIG. 12 is a circuit diagram of the nonvolatile semiconductor memory device in accordance with the sixth embodiment. Note that in the sixth embodiment, identical symbols are assigned to configurations similar to those in the first through fifth embodiments and descriptions thereof are omitted.

The nonvolatile semiconductor memory device in accordance with the sixth embodiment includes a switch circuit SWc that differs from the previously mentioned switch circuits SW. As shown in FIG. 12, this switch circuit SWc controls electrical connection between the global bit line GBL and the local bit line LBL similarly to the first through fifth embodiments. However, the switch circuit SWc has a configuration that is the configuration of the fourth embodiment with the memory transistors MTra1-MTra8 removed. That is, the switch circuit SWc is configured by the drain side select transistor SDTra, the back gate transistor BTra, and the source side select transistor SSTra connected in series. The nonvolatile semiconductor memory device in accordance with the sixth embodiment differs from the fifth embodiment in having the drain side select transistor SDTra and the source side select transistor SSTra connected by the back gate transistor BTra instead of the joining layer 42c.

Figure 13:
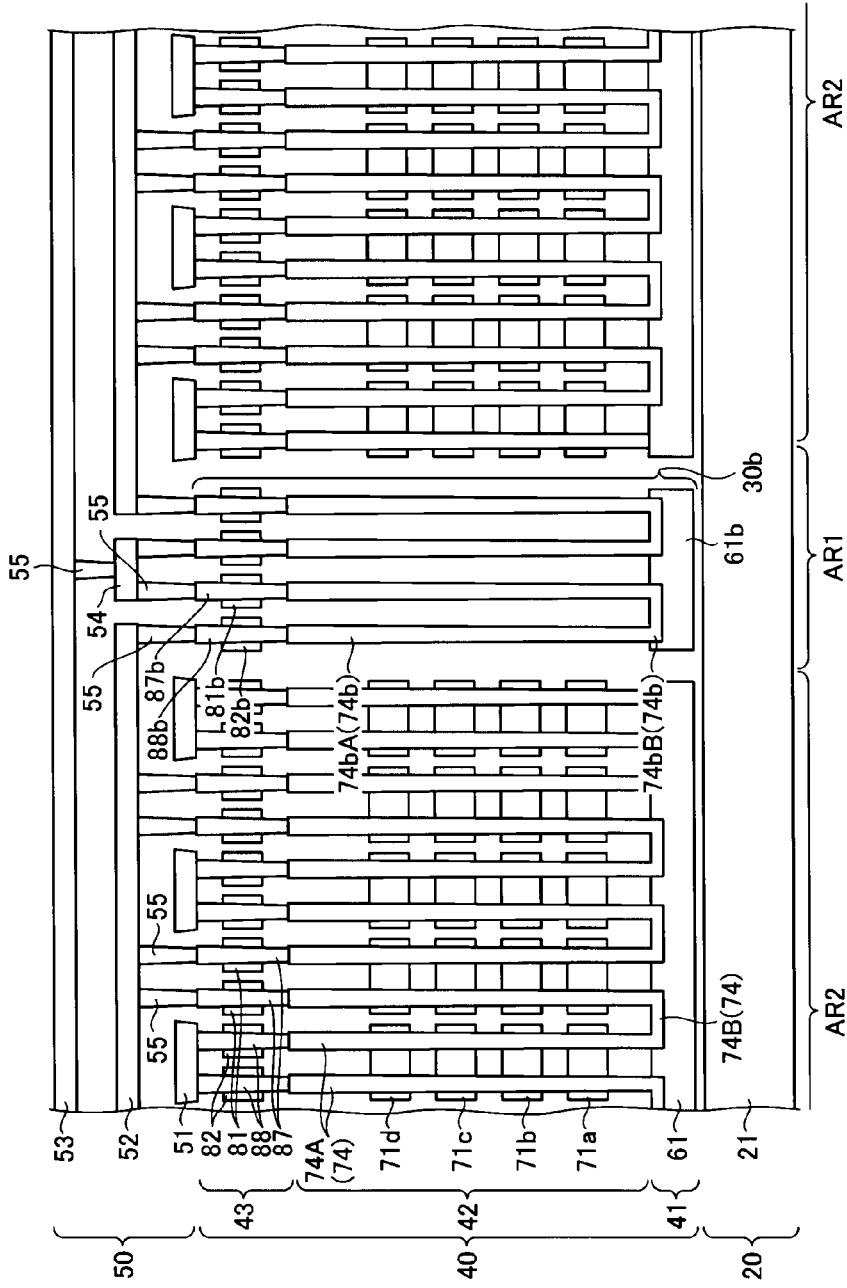
FIG. 13 is a cross-sectional view of the nonvolatile semiconductor memory device in accordance with the sixth embodiment.

Next, a stacking structure of the nonvolatile semiconductor memory device in accordance with the sixth embodiment is described with reference to FIG. 13. FIG. 13 is a cross-sectional view of the nonvolatile semiconductor memory device in accordance with the sixth embodiment.

As shown in FIG. 13, the switch circuit region 30b has a configuration that is the configuration of the fourth embodiment with the word line conductive layers 71ba-71bd omitted. Note that the U-shaped semiconductor layer 74 in the sixth embodiment is configured by a stacking structure of tungsten (W)/titanium nitride (TiN)/titanium (Ti).

[Advantages of the Nonvolatile Semiconductor Memory Device in Accordance with the Sixth Embodiment]

The nonvolatile semiconductor memory device in accordance with the sixth embodiment displays similar advantages to the fourth embodiment. The advantages of the sixth embodiment are here described through comparison with the fifth embodiment. In the fifth embodiment, the joining layer 42c is provided at a stacking position between the memory transistor layer 42 and the select transistor layer 43. The nonvolatile semiconductor memory device in accordance with the fifth embodiment therefore requires a process during manufacture for manufacturing the joining layer 42c. On the other hand, in the sixth embodiment, there is no need to provide the joining layer 42c at the stacking position between the memory transistor layer 42 and the select transistor layer 43. The nonvolatile semiconductor memory device in accordance with the sixth embodiment therefore allows the process during manufacture for manufacturing the joining layer 42c to be omitted.

[Seventh Embodiment]

Figure 14:
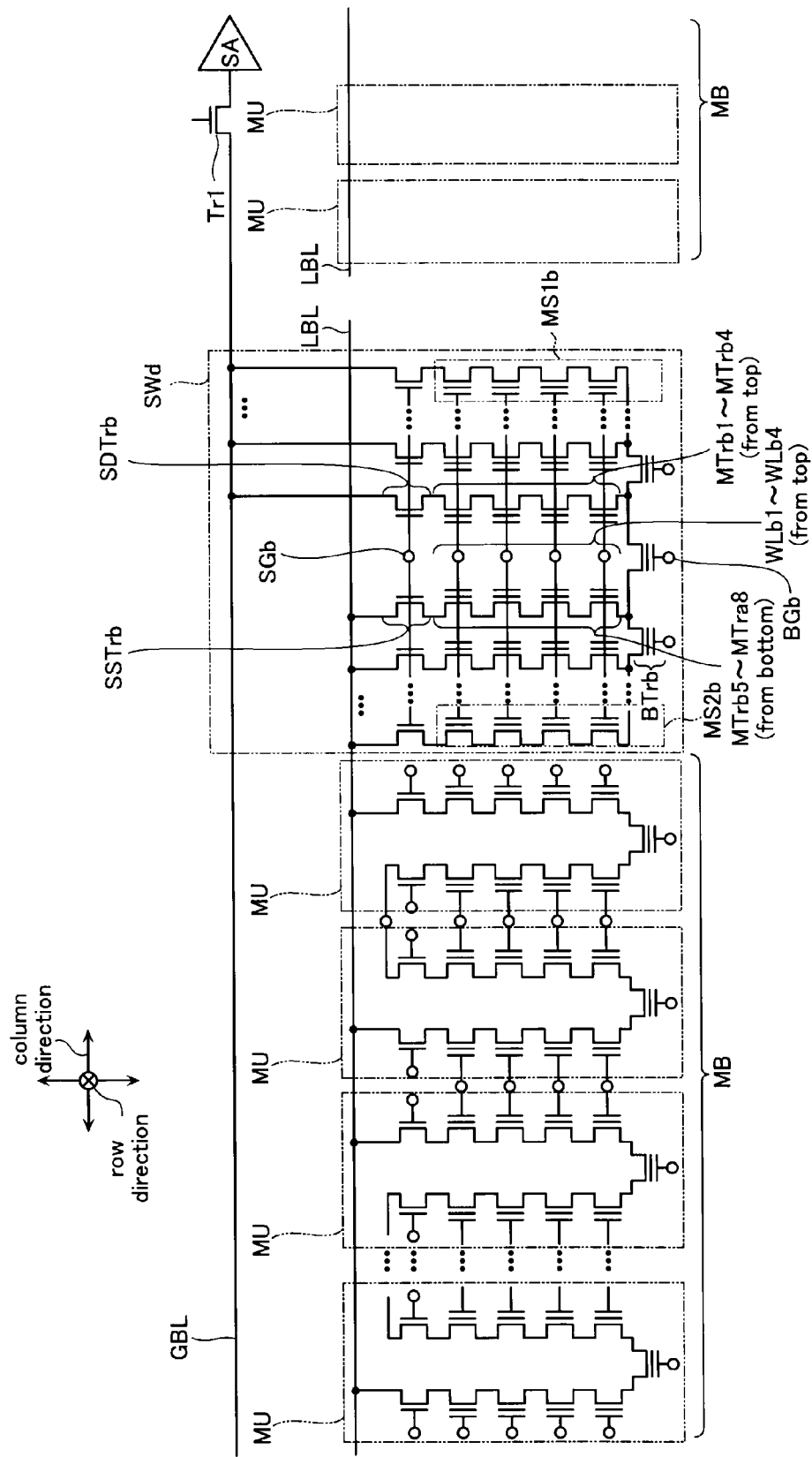
FIG. 14 is an equivalent circuit diagram of a nonvolatile semiconductor memory device in accordance with a seventh embodiment.

Next, a configuration of a nonvolatile semiconductor memory device in accordance with a seventh embodiment is described with reference to FIG. 14. FIG. 14 is a circuit diagram of the nonvolatile semiconductor memory device in accordance with the seventh embodiment. Note that in the seventh embodiment, identical symbols are assigned to configurations similar to those in the first through sixth embodiments and descriptions thereof are omitted.

The nonvolatile semiconductor memory device in accordance with the seventh embodiment includes a switch circuit SWd that differs from the previously mentioned switch circuits SW. This switch circuit SWd controls electrical connection between the global bit line GBL and the local bit line LBL similarly to the first through sixth embodiments. The switch circuit SWa of the fourth embodiment has a substantially identical structure to that of the memory unit MU, and the switch circuit SWd of the seventh embodiment is similar in this respect.

However, the switch circuit SWd is configured to have both a plurality of first memory strings MS1b connected in parallel and a plurality of second memory strings MS2b connected in parallel. Furthermore, these parallel-connected memory strings MS1b and MS2b are connected by a plurality of back gate transistors BTrb. Moreover, the switch circuit SWd includes, at one end of each of the plurality of memory strings MS1b and MS2b thereof, a plurality of drain side select transistors SDTrb and a plurality of source side select transistors SSTrb.

One ends of the first memory strings MS1b (sources of the memory transistors MTrb4) and one ends of the second memory strings MS2b (drains of the memory transistors MTrb5) are commonly connected to the back gate transistors BTrb. The other ends of the first memory strings MS1b (drains of the memory transistors MTrb1) are connected to the global bit line GBL via the drain side select transistors SDTrb, respectively. The other ends of the second memory strings MS2b (sources of the memory transistors MTrb8) are connected to the local bit line LBL via the source side select transistors SSTrb, respectively.

The first memory string MS1b includes four memory transistors MTrb1-MTrb4, similarly to the memory string MS in the memory block. The second memory string MS2b includes four memory transistors MTrb5-MTrb8, similarly to the memory string MS in the memory block. Gates of each of the memory transistors MTrb1-MTrb4 and gates of each of the memory transistors MTrb8-MTrb5 are commonly connected by word lines WLb1-WLb4. Gates of the back gate transistors BTrb are connected to a back gate line BGb. Gates of the drain side select transistors SDTrb and gates of the source side select transistors SSTrb are commonly connected to a select gate line SGb.

During execution of various specified operations, the switch circuit SWd having the above-described configuration sets to an on state all of the memory transistors MTrb1-MTrb8, the back gate transistor BTrb, the drain side select transistor SDTrb, and the source side select transistor SSTrb. This causes the local bit line LBL and the global bit line GBL to be electrically connected. That is, the switch circuit SWd in accordance with the seventh embodiment electrically connects the global bit line GBL and the local bit line LBL by the pluralities of parallel-connected first and second memory strings MS1b and MS2b. The switch circuit SWd in accordance with the seventh embodiment differs in this respect from the switch circuit SWa as in the fourth embodiment which includes only one memory string MS.

Figure 15:
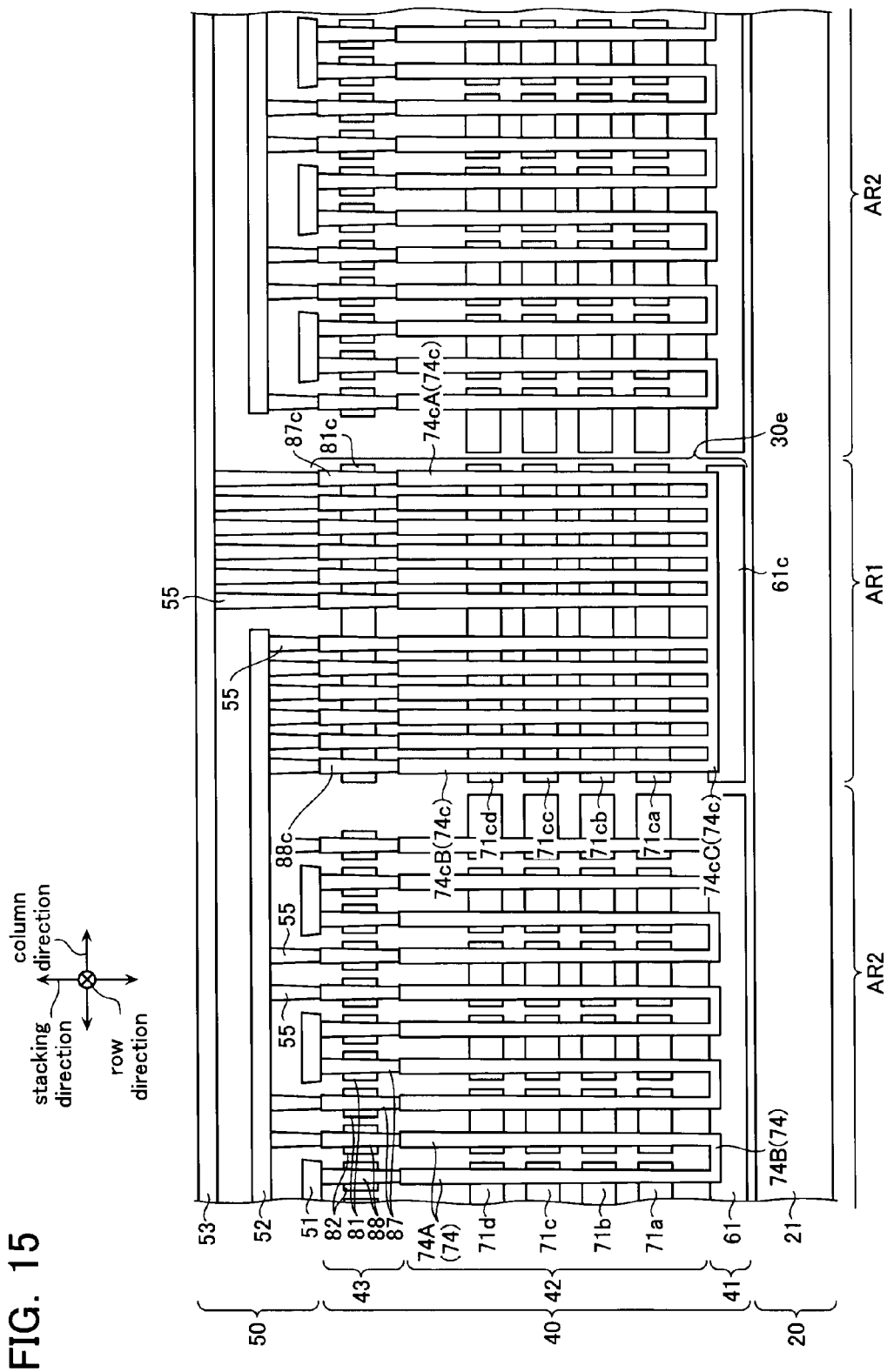
FIG. 15 is a cross-sectional view of the nonvolatile semiconductor memory device in accordance with the seventh embodiment.

Next, a stacking structure of the nonvolatile semiconductor memory device in accordance with the seventh embodiment is described with reference to FIG. 15. FIG. 15 is a cross-sectional view of the nonvolatile semiconductor memory device in accordance with the seventh embodiment.

As shown in FIG. 15, a switch circuit region 30e (switch circuit SWd) is formed between memory layers 40 adjacent in the column direction. The switch circuit region 30e functions as the switch circuit SWd.

The switch circuit region 30e includes a back gate conductive layer 61c, word line conductive layers 71ca-71cd, and a comb-shaped semiconductor layer 74c. These may be formed to an identical height as, may be configured with an identical shape and from an identical material as, and, further, may be formed by an identical process as, respectively, the back gate conductive layer 61, the word line conductive layers 71a-71d, and the U-shaped semiconductor layer 74.

The back gate conductive layer 61c functions as the back gate BGb and as gates of the back gate transistors BTrb. The back gate conductive layer 61c is formed longer in the column direction than the back gate conductive layer 61b in the fourth embodiment.

The word line conductive layers 71ca-71cd function as the word lines WLb1-WLb4, and as gates of the memory transistors MTrb1-MTrb8. The word line conductive layers 71ca-71cd are formed longer in the column direction than the word line conductive layers 71ba-71bd in the fourth embodiment.

The semiconductor layer 74c functions as a body of the memory transistors MTrb1-MTrb8. The semiconductor layer 74c includes a plurality of first columnar portions 74cA and a plurality of second columnar portions 74cB aligned in the column direction, and a single joining portion 74cC configured to join lower ends of the pluralities of first and second columnar portions 74cA and 74cB. The first and second columnar portions 74cA and 74cB are formed so as to be surrounded by the word line conductive layers 71ca-71cd with a memory gate insulating layer (SiO$_2$—SiN—SiO$_2$) interposed therebetween. The joining portion 74cC is formed so as to be surrounded by the back gate conductive layer 61c with a memory gate insulating layer (SiO$_2$—SiN—SiO$_2$) interposed therebetween. The semiconductor layer 74c is constituted by polysilicon (poly-Si).

In addition, a conductive layer 81c, a drain side columnar semiconductor layer 87c, and a source side columnar semiconductor layer 88c are formed in the switch circuit region 30e. The conductive layer 81c is formed in the same layer, in an identical manufacturing process, and so as to include an identical material as the drain side conductive layer 81 and source side conductive layer 82.

The drain side columnar semiconductor layer 87c and source side columnar semiconductor layer 88c are formed in the same layer, in an identical manufacturing process, and so as to include an identical material as the drain side columnar semiconductor layer 87 and source side columnar semiconductor layer 88.

The conductive layer 81c functions as the select gate line SGb, as gates of the drain side select transistors SDTrb, and as gates of the source side select transistors SSTrb. The conductive layer 81c is formed longer in the column direction than the drain side conductive layer 81b and the source side conductive layer 82b in the fourth embodiment.

The drain side columnar semiconductor layer 87c and the source side columnar semiconductor layer 88c are formed so as to penetrate the conductive layer 81c. The drain side columnar semiconductor layer 87c functions as a body of the drain side select transistors SDTrb. The source side columnar semiconductor layer 88c functions as a body of the source side select transistors SSTrb.

The drain side columnar semiconductor layer 87c is formed so as to be in contact with an upper surface of the first columnar portion 74cA. The drain side columnar semiconductor layer 87c is formed so as to be surrounded by the conductive layer 81c with a drain side gate insulating layer ($SiO_2$) interposed therebetween. The source side columnar semiconductor layer 88c is formed so as to be in contact with an upper surface of the second columnar portion 74cB. The source side columnar semiconductor layer 88c is formed so as to be surrounded by the conductive layer 81c with a source side gate insulating layer ($SiO_2$) interposed therebetween.

[Advantages of the Nonvolatile Semiconductor Memory Device in Accordance with the Seventh Embodiment]

The nonvolatile semiconductor memory device in accordance with the seventh embodiment connects the global bit line GBL to the local bit line LBL via the plurality of memory strings MS1b and MS2b included in the switch circuit SWd. The nonvolatile semiconductor memory device in accordance with the seventh embodiment therefore allows the electrical resistance due to the switch circuit SWd to be reduced in comparison with the fourth embodiment (FIGS. 8 and 9).

[Eighth Embodiment]

Next, a configuration of a nonvolatile semiconductor memory device in accordance with an eighth embodiment is described with reference to FIGS. 16A-18. Note that in the eighth embodiment, identical symbols are assigned to configurations similar to those in the first through seventh embodiments and descriptions thereof are omitted.

Figure 16A:
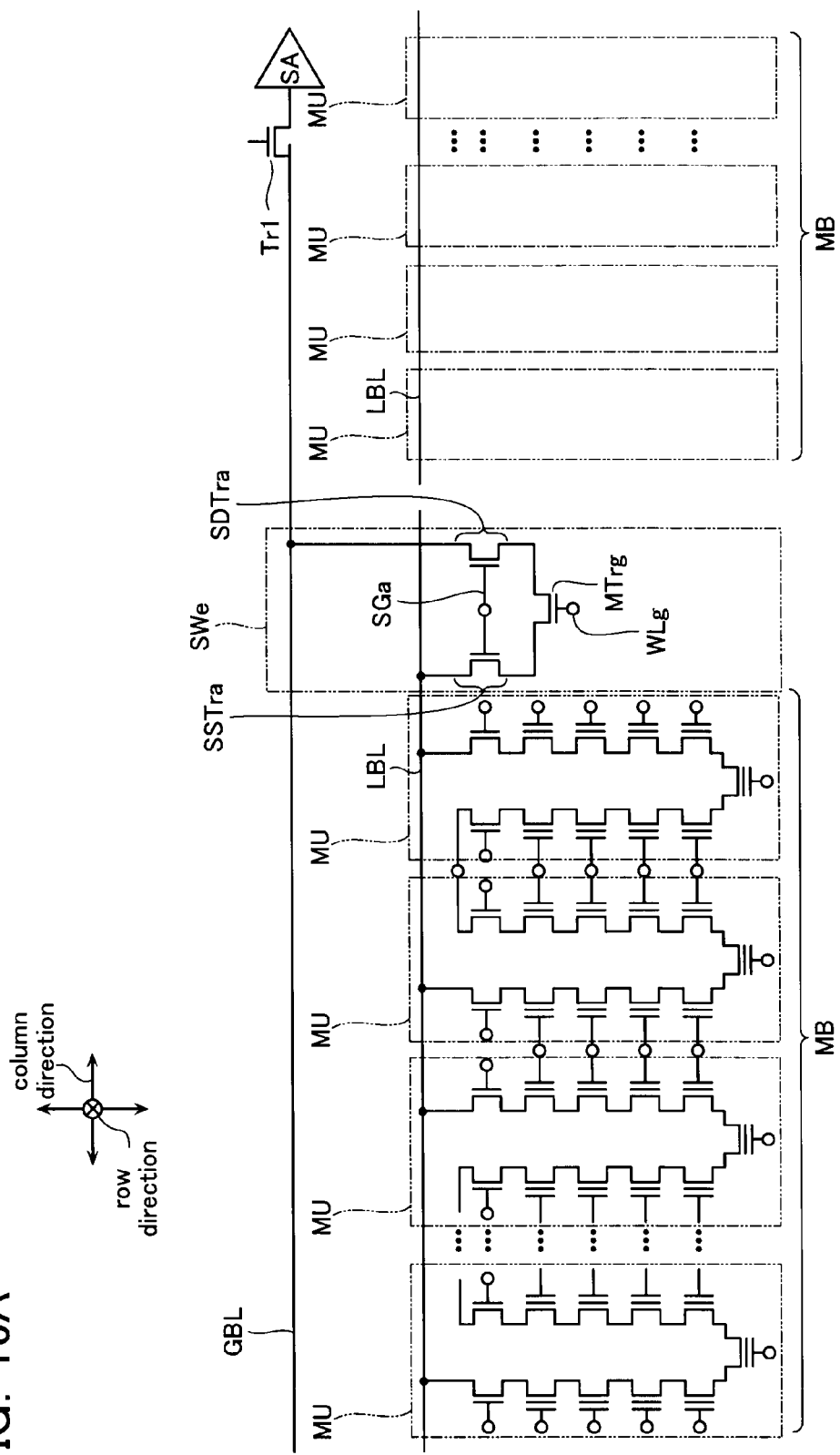
FIG. 16A is an equivalent circuit diagram of a nonvolatile semiconductor memory device in accordance with an eighth embodiment.
Figure 16B:
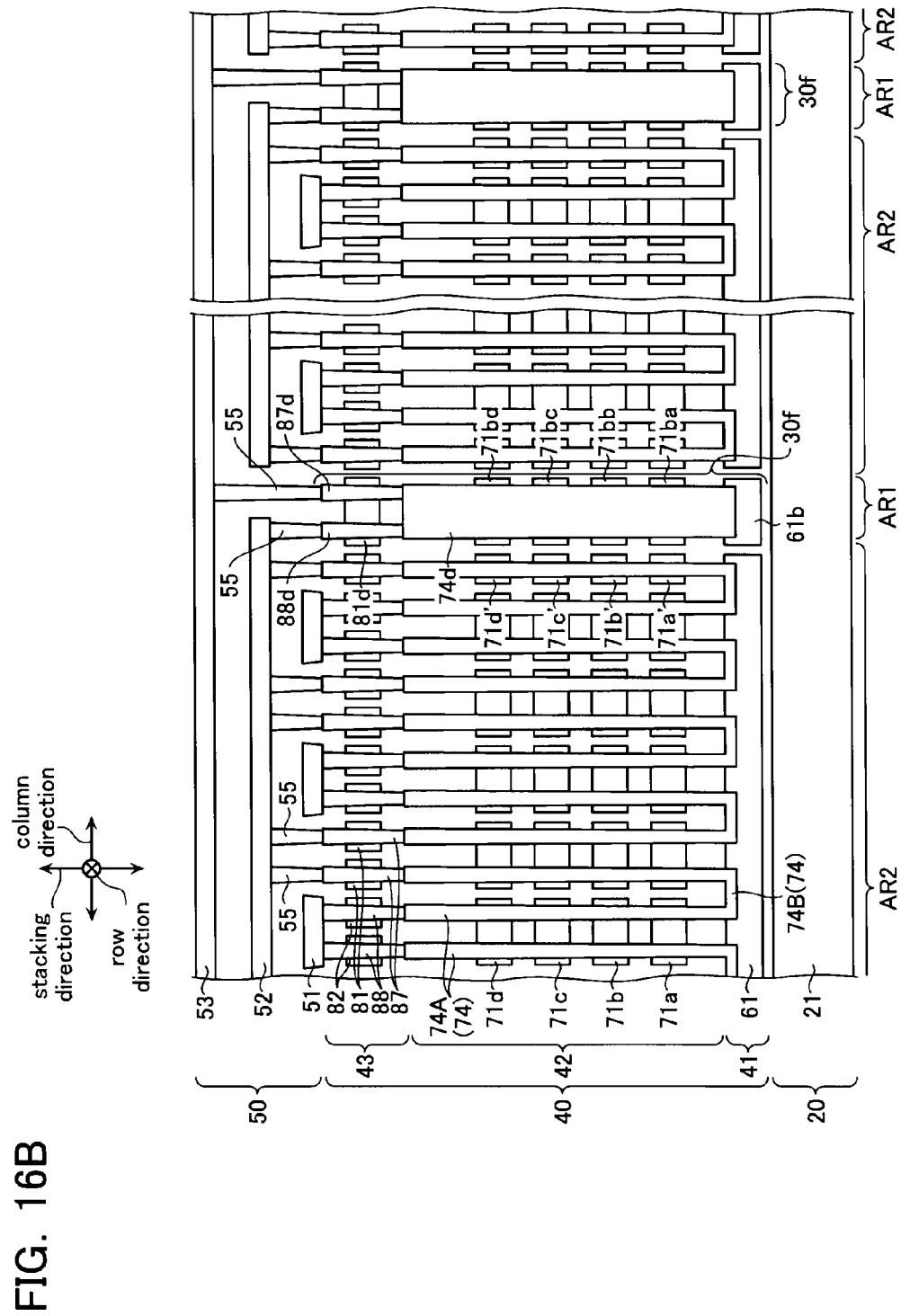
FIG. 16B is a cross-sectional view of the nonvolatile semiconductor memory device in accordance with the eighth embodiment.
Figure 17:
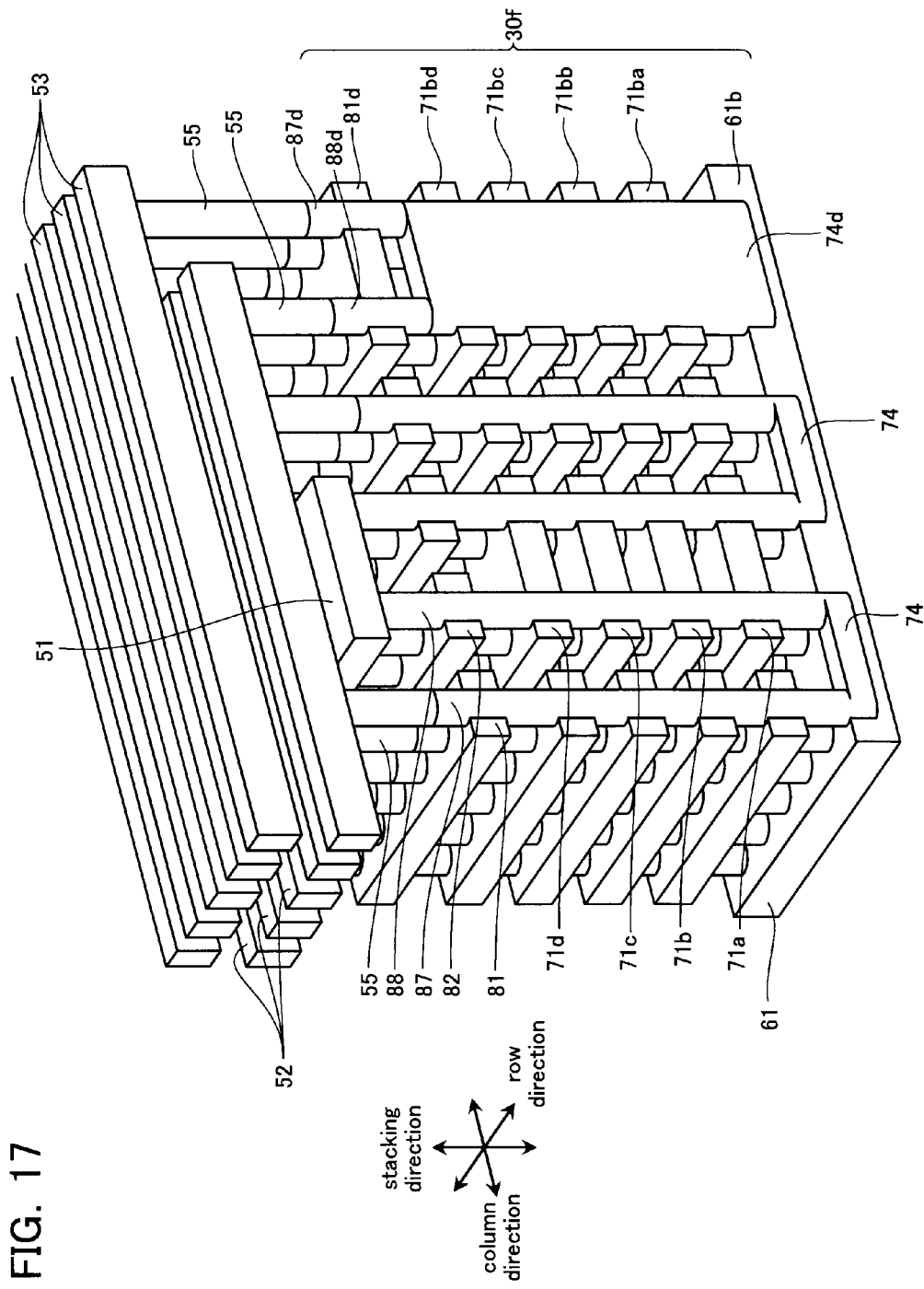
FIG. 17 is an enlarged perspective view of the nonvolatile semiconductor memory device in accordance with the eighth embodiment.
Figure 18:
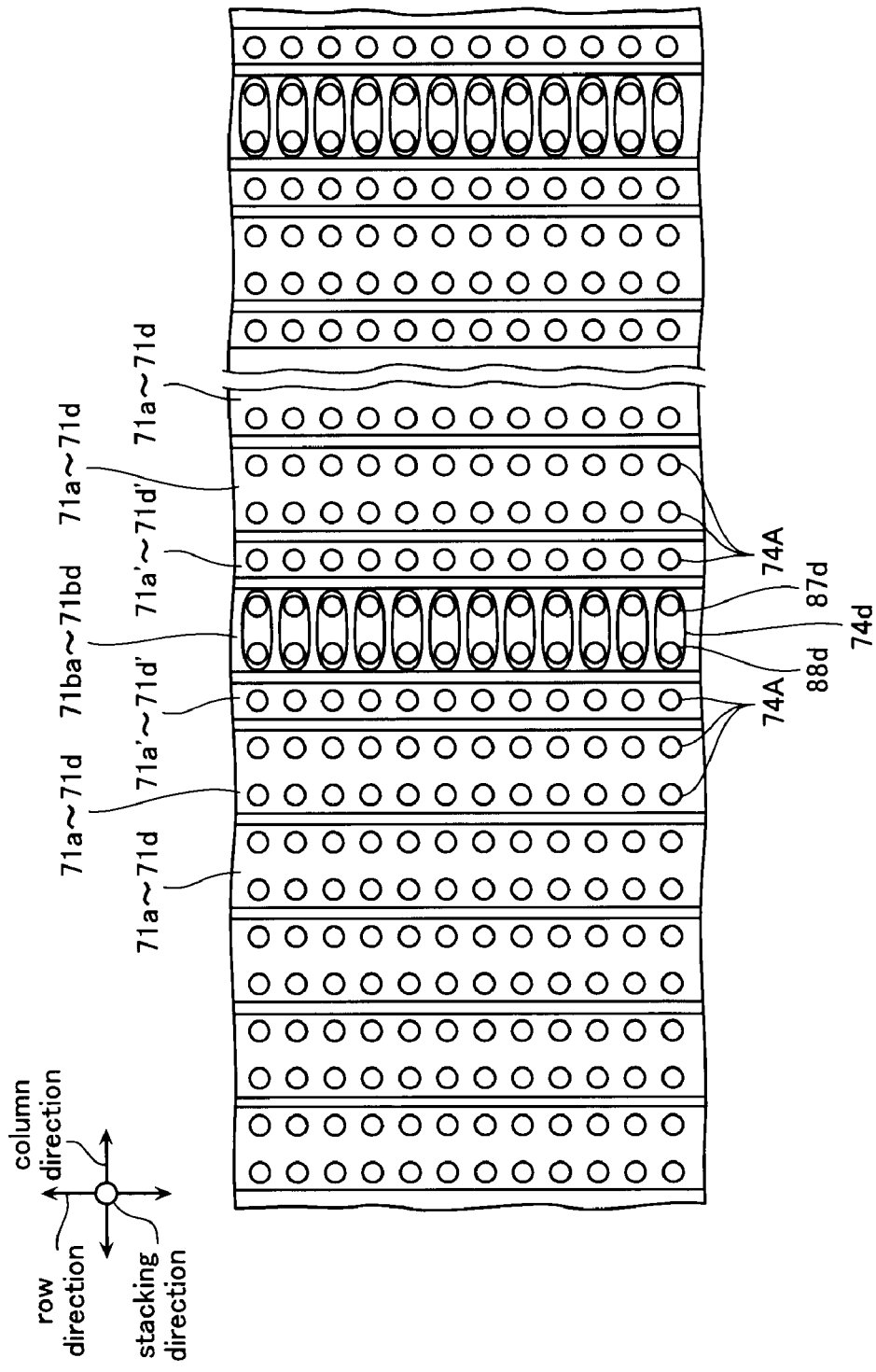
FIG. 18 is a top view of the nonvolatile semiconductor memory device in accordance with the eighth embodiment.

FIG. 16A is an equivalent circuit diagram of the nonvolatile semiconductor memory device in accordance with the eighth embodiment. FIG. 16B is a cross-sectional view of the nonvolatile semiconductor memory device in accordance with the eighth embodiment. FIG. 17 is an enlarged perspective view of the nonvolatile semiconductor memory device in accordance with the eighth embodiment. FIG. 18 is a top view of the nonvolatile semiconductor memory device in accordance with the eighth embodiment.

As shown in FIG. 16A, a switch circuit SWe in this eighth embodiment comprises a transistor MTrg to be described hereafter, in addition to the select transistors SSTra and SDTra. This switch circuit SWe is formed in a switch circuit region 30f, as shown in FIG. 16B. The switch circuit region 30f is formed between memory layers 40 adjacent in the column direction, as shown in FIGS. 16B and 17.

The back gate conductive layer 61b, word line conductive layers 71ba-71bd, and a columnar semiconductor layer 74d (second columnar portion) are formed in the switch circuit region 30f. As shown in FIGS. 17 and 18, this columnar semiconductor layer 74d has an elliptical shape cross section in a planar direction with the column direction as a long axis direction. In the present embodiment, this ellipse is of such a size in its long axis direction (column direction) as to contain therein a plurality (in the present example, two) of the columnar portions 74A in the memory region 40. Accordingly, the columnar semiconductor layer 74d has a width in the column direction (that is, in the long axis direction of the ellipse) approximately three times that of the columnar portion 74A. The columnar semiconductor layer 74d may be formed to an identical height as, may be configured from an identical material as, and, further, may be formed by an identical process as the U-shaped semiconductor layer 74. In addition, the word line conductive layers 71ba-71bd also may be configured from an identical material as, in an identical layer as, and in an identical process as the word line conductive layers 71a-71d. A memory gate insulating layer 73 identical to that of the memory layer 40 is formed between the word line conductive layers 71ba-71bd and the columnar semiconductor layer 74d. The previously mentioned transistor MTrg is formed by these columnar semiconductor layer 74d, word line conductive layers 71ba-71bd, back gate conductive layer 61b, and the memory gate insulating layer 73 sandwiched by these layers. A voltage of a certain value or greater is applied simultaneously to the back gate conductive layer 61b and the word line conductive layers 71ba-71bd when turning on the transistor MTrg.

In addition, a conductive layer 81d, a drain side columnar semiconductor layer 87d, and a source side columnar semiconductor layer 88d are formed in the switch circuit region 30f. The conductive layer 81d may be manufactured in the same layer, in an identical manufacturing process, and so as to include an identical material as the drain side conductive layer 81 and source side conductive layer 82. The drain side columnar semiconductor layer 87d and source side columnar semiconductor layer 88d may be manufactured in the same layer, in an identical manufacturing process, and so as to include an identical material as the drain side columnar semiconductor layer 87 and source side columnar semiconductor layer 88.

The conductive layer 81d functions as the select gate line SGa, as a gate of the drain side select transistor SDTra, and as a gate of the source side select transistor SSTra.

The drain side columnar semiconductor layer 87d and the source side columnar semiconductor layer 88d are formed so as to penetrate the conductive layer 81d, and so as to extend in a vertical direction from ends of an upper surface of the columnar semiconductor layer 74d. The drain side columnar semiconductor layer 87d functions as a body of the drain side select transistor SDTra. The source side columnar semiconductor layer 88d functions as a body of the source side select transistor SSTra.

The drain side columnar semiconductor layer 87d and the source side columnar semiconductor layer 88d are formed in a column shape extending upwardly from the upper ends of the columnar semiconductor layer 74d. A width of the columnar portion is less than (in this example, about one third of) a width in the long axis direction of the columnar semiconductor layer 74d. The drain side columnar semiconductor layer 87d is electrically connected to the third wiring layer 53 (global bit line GBL) via the plug layer 55. The source side columnar semiconductor layer 88d is electrically connected to the second wiring layer 52 (local bit line LBL) via the plug layer 55. The drain side columnar semiconductor layer 87d and the source side columnar semiconductor layer 88d are formed so as to be surrounded by the conductive layer 81d with a drain side gate insulating layer ($SiO_2$) interposed therebetween.

Note that in the present embodiment, word line conductive layers 71a'-71d' at an extremity of the memory layer 40 differ from the other word line conductive layers 71a-71d in having a length in the column direction that is half that of the other word line conductive layers 71a-71d. That is, the word line conductive layers 71a-71d, and 71a'-71d' extend in the row direction and have a width in the column direction. The word line conductive layers 71a'-71d' provided next to the word line conductive layers 71ba-71bd have a shorter width than the other word line conductive layers 71a-71d.

[Advantages of the Nonvolatile Semiconductor Memory Device in Accordance with the Eighth Embodiment]

In the switch circuit region 30f in accordance with the eighth embodiment, current flows from the drain side columnar semiconductor layer 87d through an upper portion of the columnar semiconductor layer 74d to the source side columnar semiconductor layer 88d. By contrast, in the switch circuit region 30e of the seventh embodiment, current flows from the drain side columnar semiconductor layer 87c through the entirety of the U-shaped semiconductor layer 74c to the source side columnar semiconductor layer 88c. This allows electrical resistance of the switch circuit region 30f in accordance with the eighth embodiment to be suppressed in comparison with the seventh embodiment, since a current path through the columnar semiconductor layer 74d is short.

[Ninth Embodiment]

[Configuration of a Nonvolatile Semiconductor Memory Device in Accordance with a Ninth Embodiment]

Figure 19:
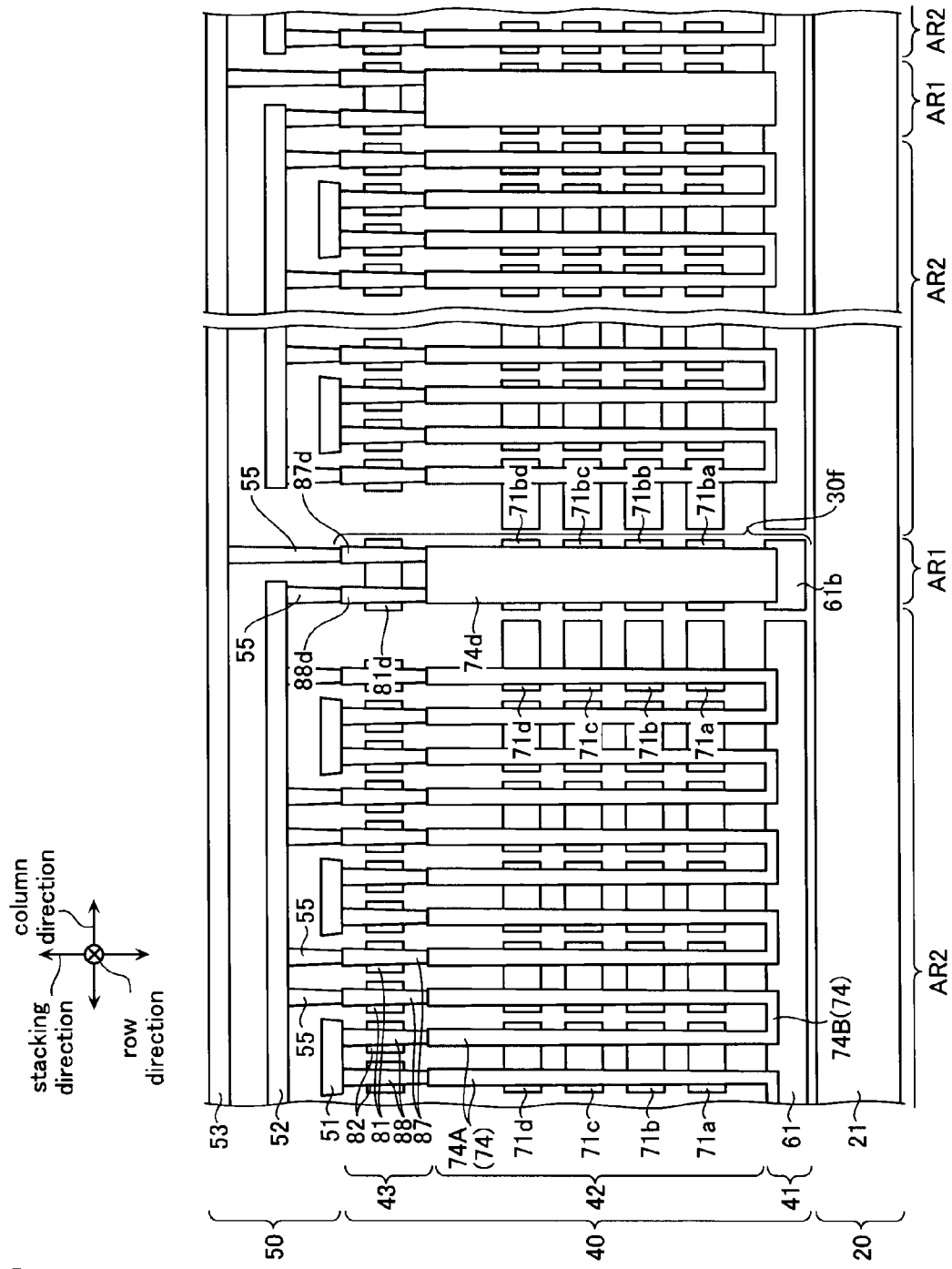
FIG. 19 is a cross-sectional view of a nonvolatile semiconductor memory device in accordance with a ninth embodiment.
Figure 20:
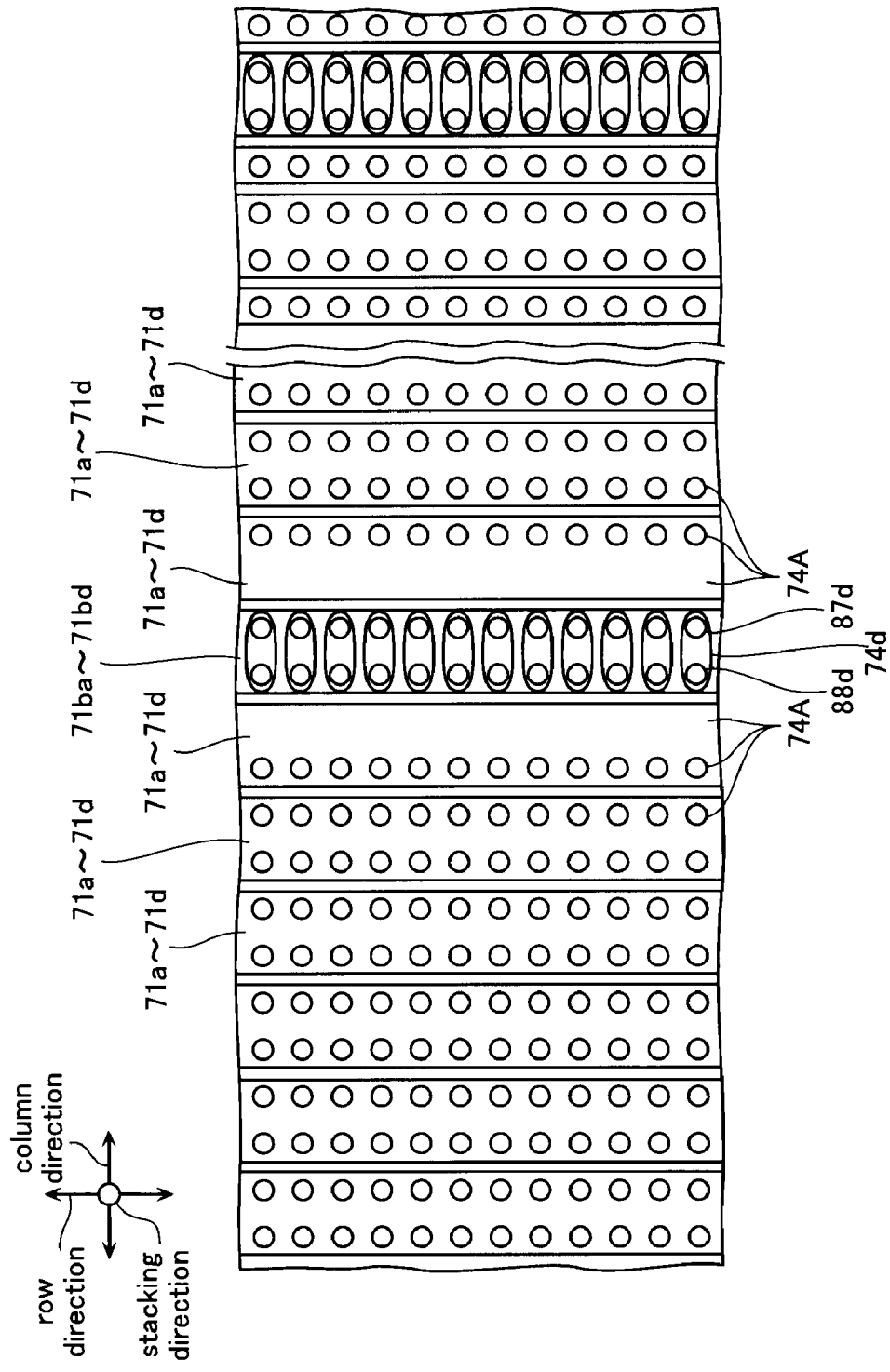
FIG. 20 is a top view of the nonvolatile semiconductor memory device in accordance with the ninth embodiment.

Next, a configuration of a nonvolatile semiconductor memory device in accordance with a ninth embodiment is described with reference to FIGS. 19 and 20. FIG. 19 is a cross-sectional view of the nonvolatile semiconductor memory device in accordance with the ninth embodiment. FIG. 20 is a top view of the nonvolatile semiconductor memory device in accordance with the ninth embodiment. Note that in the ninth embodiment, identical symbols are assigned to configurations similar to those in the first through eighth embodiments and descriptions thereof are omitted.

The nonvolatile semiconductor memory device in accordance with the ninth embodiment differs from the eighth embodiment in having the word line conductive layers 71a-71d at the extremity of the memory layer 40 also having the same width in the column direction as the other word line conductive layers 71a-71d, as shown in FIGS. 19 and 20. That is, the word line conductive layers 71a-71d provided next to the word line conductive layers 71ba-71bd have the same width as the other word line conductive layers 71a-71d.

[Advantages of the Nonvolatile Semiconductor Memory Device in Accordance with the Ninth Embodiment]

The nonvolatile semiconductor memory device in accordance with the ninth embodiment displays similar advantages to the eighth embodiment. Furthermore, the nonvolatile semiconductor memory device in accordance with the ninth embodiment includes the word line conductive layers 71a-71d formed with a certain periodic pattern (width in the column direction) along the entire second region AR2 (including the ends thereof), whereby lithography during manufacture can be readily executed. Moreover, in the nonvolatile semiconductor memory device in accordance with the ninth embodiment, there is no risk of the pattern being broken after exposure.

[Tenth Embodiment]

[Configuration of a Nonvolatile Semiconductor Memory Device in Accordance with a Tenth Embodiment]

Figure 21:
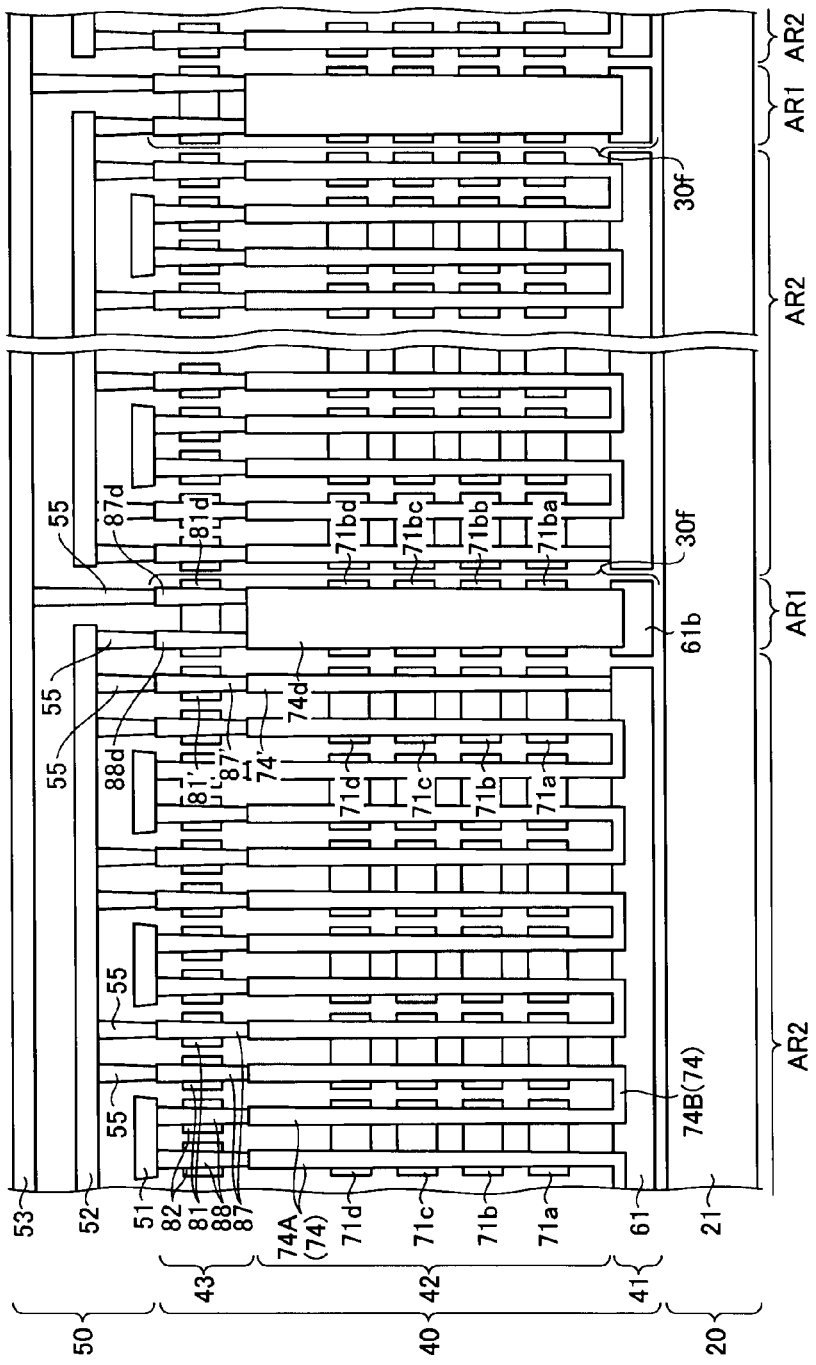
FIG. 21 is a cross-sectional view of a nonvolatile semiconductor memory device in accordance with a tenth embodiment.
Figure 22:
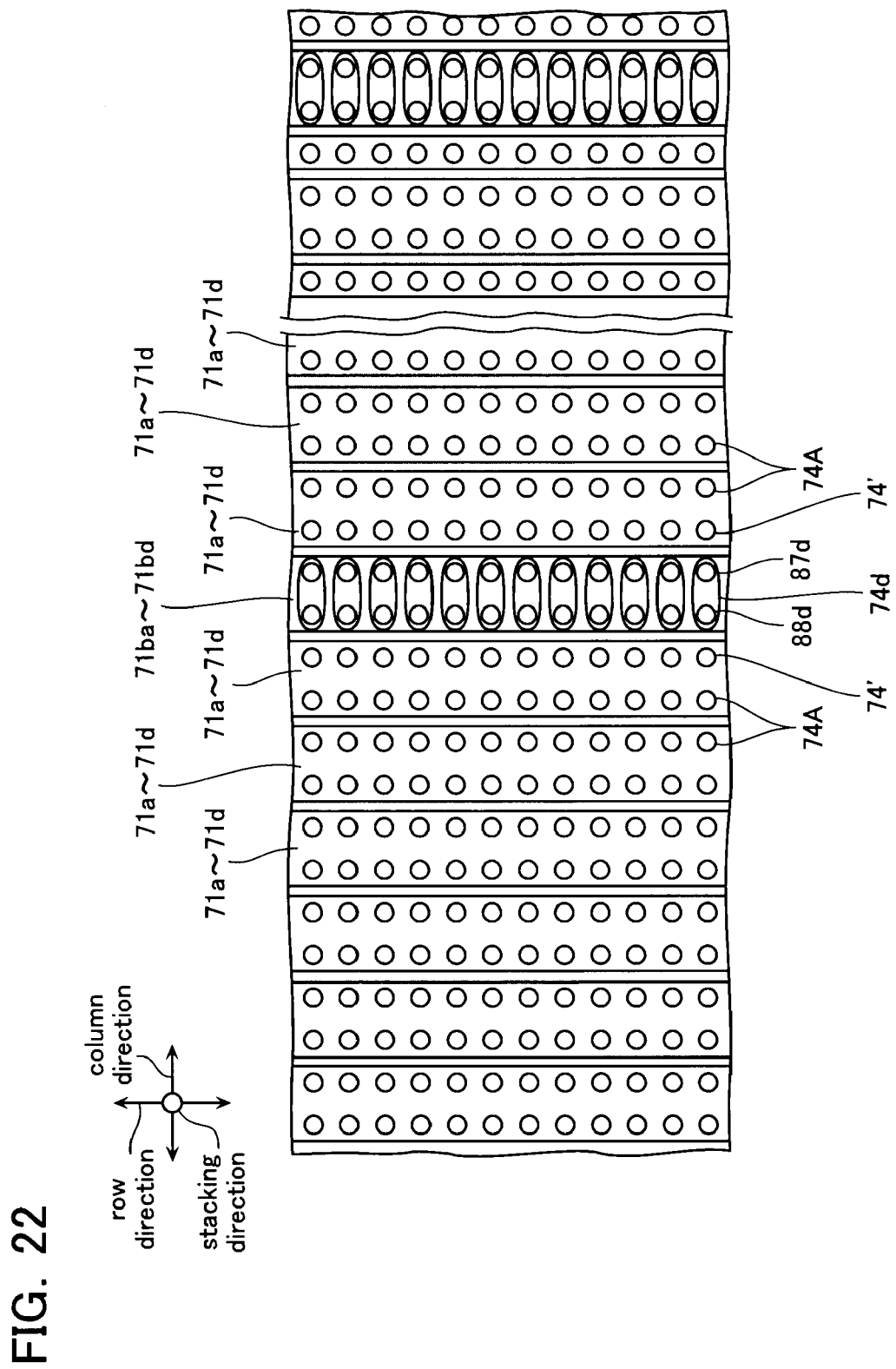
FIG. 22 is a top view of the nonvolatile semiconductor memory device in accordance with the tenth embodiment.

Next, a configuration of a nonvolatile semiconductor memory device in accordance with a tenth embodiment is described with reference to FIGS. 21 and 22. FIG. 21 is a cross-sectional view of the nonvolatile semiconductor memory device in accordance with the tenth embodiment. FIG. 22 is a top view of the nonvolatile semiconductor memory device in accordance with the tenth embodiment. Note that in the tenth embodiment, identical symbols are assigned to configurations similar to those in the first through ninth embodiments and descriptions thereof are omitted.

As shown in FIGS. 21 and 22, in the nonvolatile semiconductor memory device in accordance with the tenth embodiment, the memory layer 40 includes a dummy columnar semiconductor layer 74' formed so as to be surrounded by the word line conductive layers 71a-71d in a vicinity of the first region AR1. The dummy columnar semiconductor layer 74' is provided adjacent to the columnar portion 74A of the U-shaped semiconductor layer 74.

Furthermore, the memory layer 40 includes a dummy conductive layer 81' and a dummy columnar semiconductor layer 87'. The dummy conductive layer 81' is provided in the same layer as the drain side conductive layer 81 and the source side conductive layer 82. The dummy columnar semiconductor layer 87' is formed so as to be surrounded by the dummy conductive layer 81' and so as to extend upwardly from an upper surface of the dummy columnar semiconductor layer 74'.

[Advantages of the Nonvolatile Semiconductor Memory Device in Accordance with the Tenth Embodiment]

The nonvolatile semiconductor memory device in accordance with the tenth embodiment includes the word line conductive layers 71a-71d, and the columnar portion 74A and dummy columnar semiconductor layer 74' formed with a certain periodic pattern along the second region AR2. Consequently, lithography during manufacture can be executed even more readily in the nonvolatile semiconductor memory device in accordance with the tenth embodiment than in the ninth embodiment.

[Eleventh Embodiment]

[Configuration of a Nonvolatile Semiconductor Memory Device in Accordance with an Eleventh Embodiment]

Figure 23A:
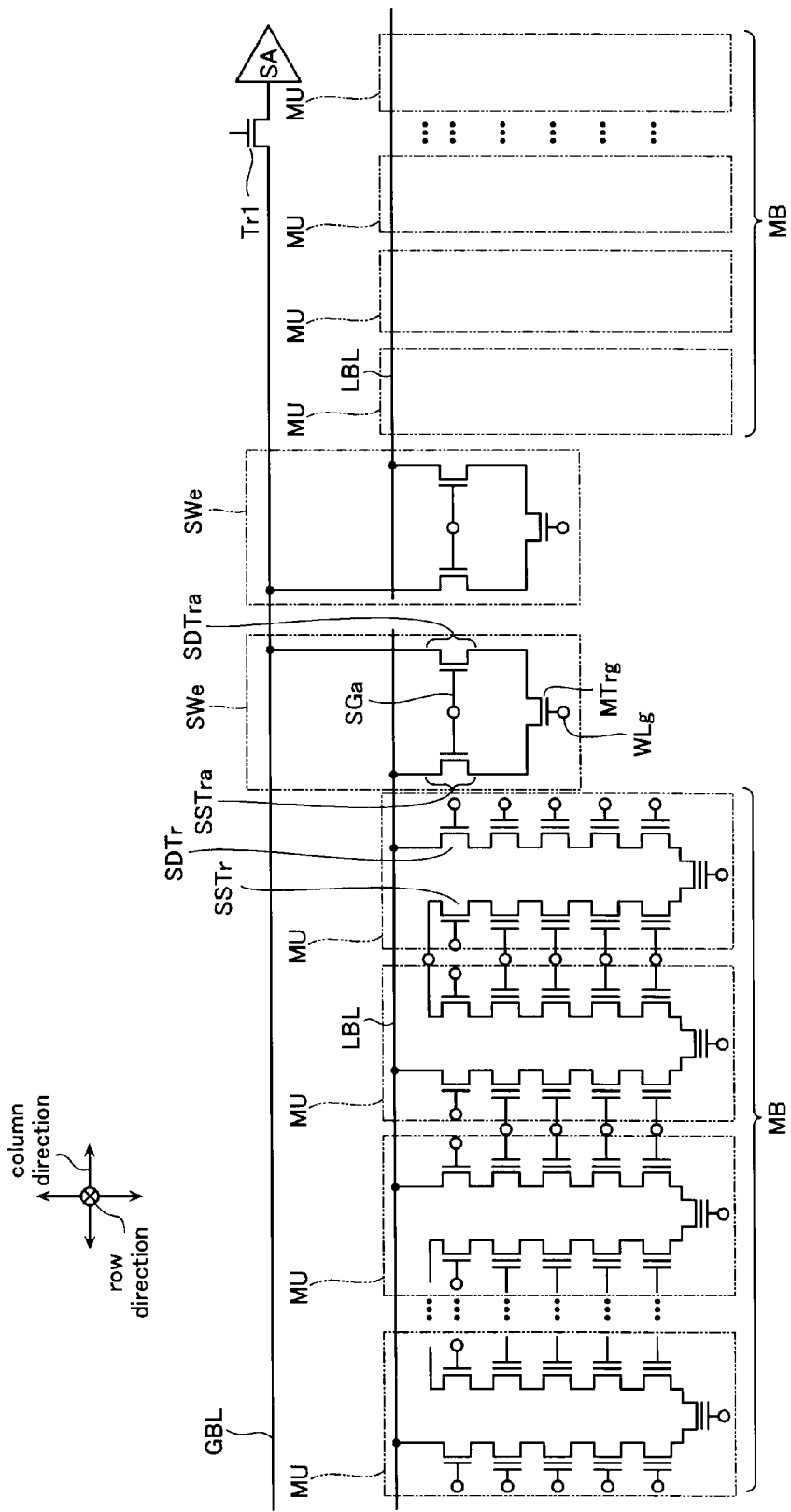
FIG. 23A is an equivalent circuit diagram of a nonvolatile semiconductor memory device in accordance with an eleventh embodiment.
Figure 23B:
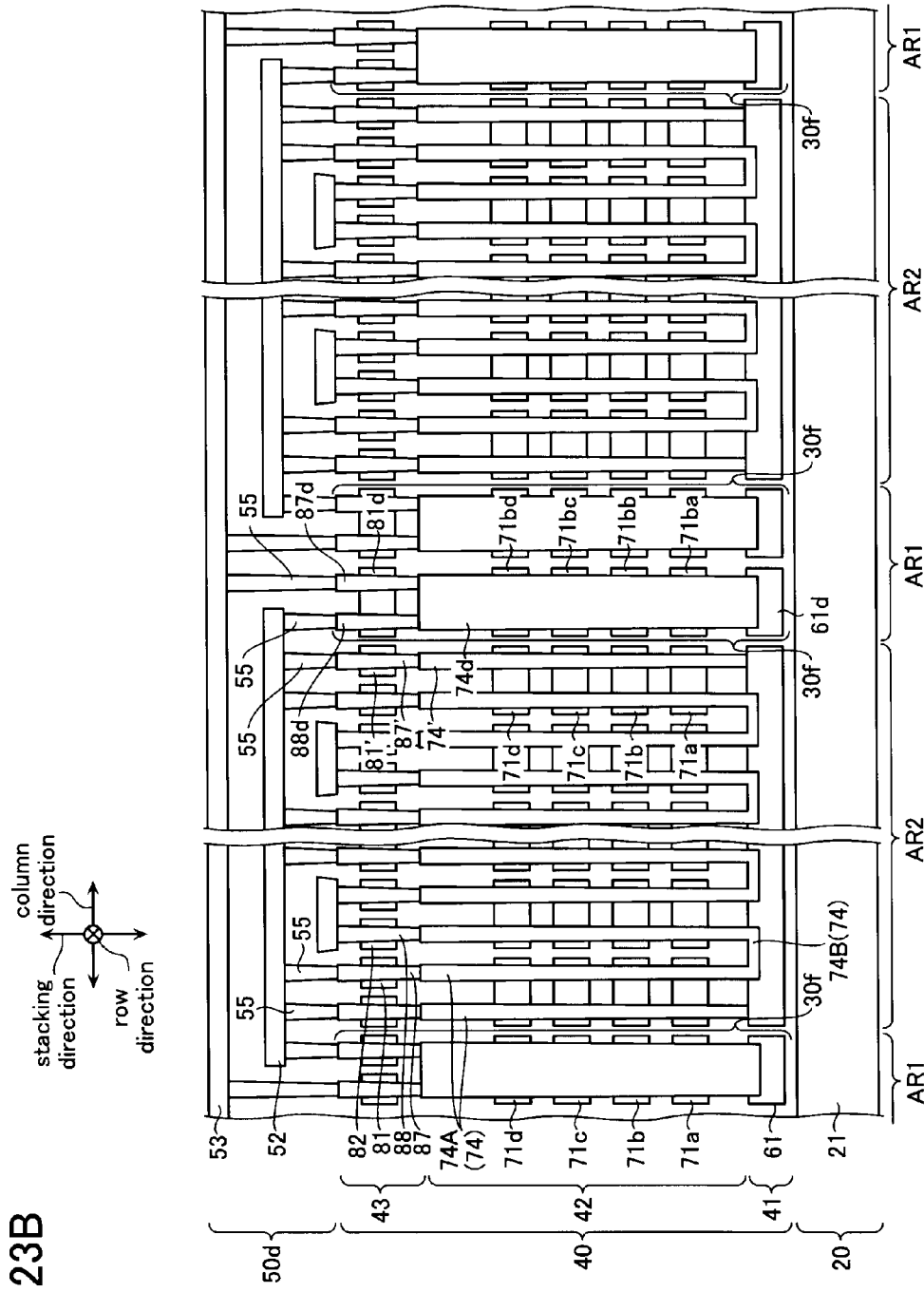
FIG. 23B is a cross-sectional view of the nonvolatile semiconductor memory device in accordance with the eleventh embodiment.

Next, a configuration of a nonvolatile semiconductor memory device in accordance with an eleventh embodiment is described with reference to FIGS. 23A and 23B. FIG. 23A is an equivalent circuit diagram of the nonvolatile semiconductor memory device in accordance with the eleventh embodiment. FIG. 23B is a cross-sectional view of the nonvolatile semiconductor memory device in accordance with the eleventh embodiment. Note that in the eleventh embodiment, identical symbols are assigned to configurations similar to those in the first through tenth embodiments and descriptions thereof are omitted.

As shown in FIG. 23B, the nonvolatile semiconductor memory device in accordance with the eleventh embodiment has two columnar semiconductor layers 74d arranged in the column direction and two switch circuits SWe (refer to FIG. 23A) arranged in the column direction in a single first region AR1. That is, each of these two columnar semiconductor layers 74d forms a single switch circuit SWe, and is connected to a separate second wiring layer 52 via the drain side columnar semiconductor layer 87d and the plug layer 55.

[Advantages of the Nonvolatile Semiconductor Memory Device in Accordance with the Eleventh Embodiment]

The nonvolatile semiconductor memory device in accordance with the eleventh embodiment has the switch circuits SWe connected to both ends of the second wiring layers 52. The nonvolatile semiconductor memory device in accordance with the eleventh embodiment therefore allows resistance of the second wiring layers 52 to be reduced in comparison with the eighth through tenth embodiments.

[Twelfth Embodiment]

[Configuration of a Nonvolatile Semiconductor Memory Device in Accordance with a Twelfth Embodiment]

Figure 24A:
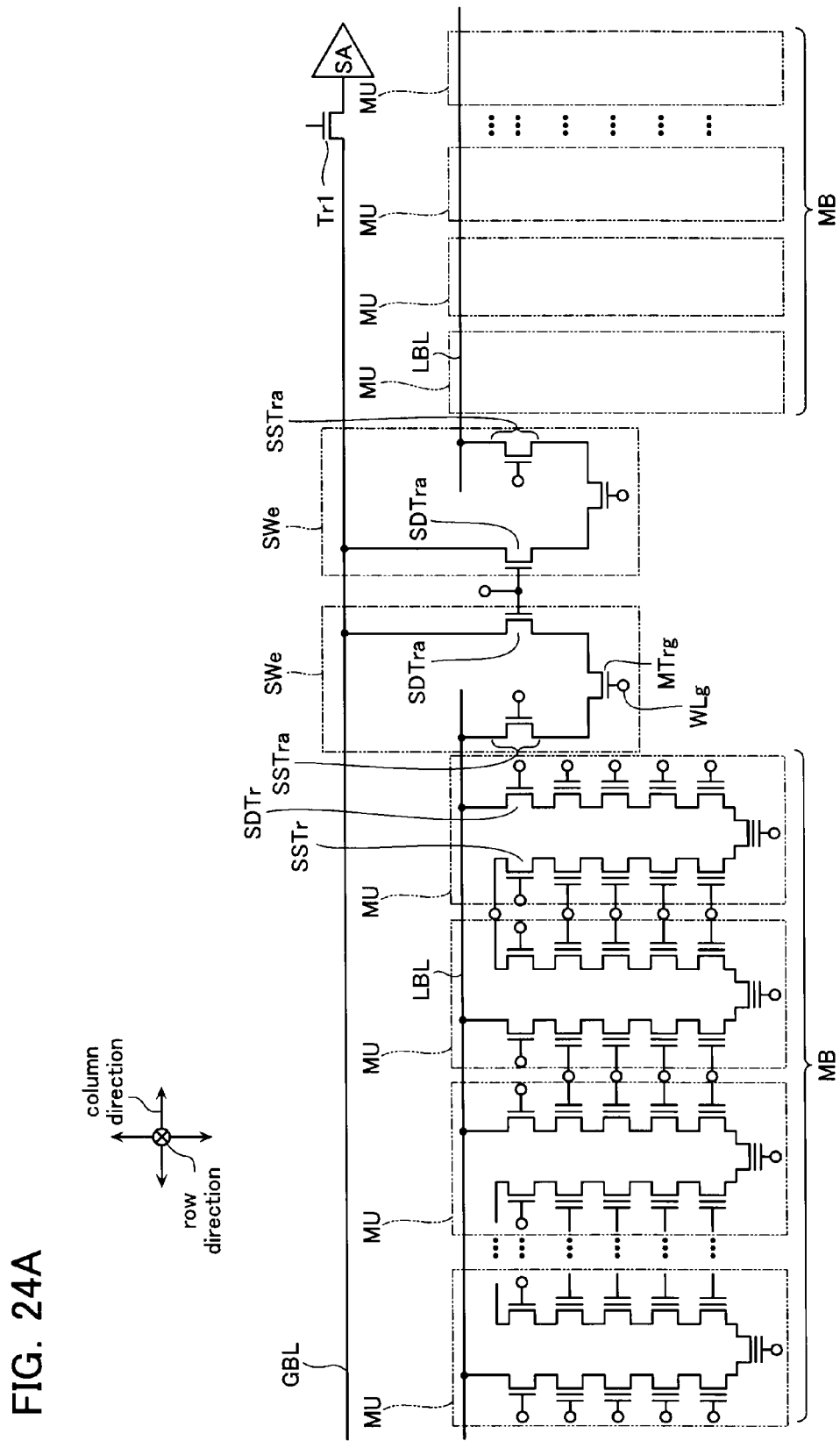
FIG. 24A is an equivalent circuit diagram of a nonvolatile semiconductor memory device in accordance with a twelfth embodiment.
Figure 24B:
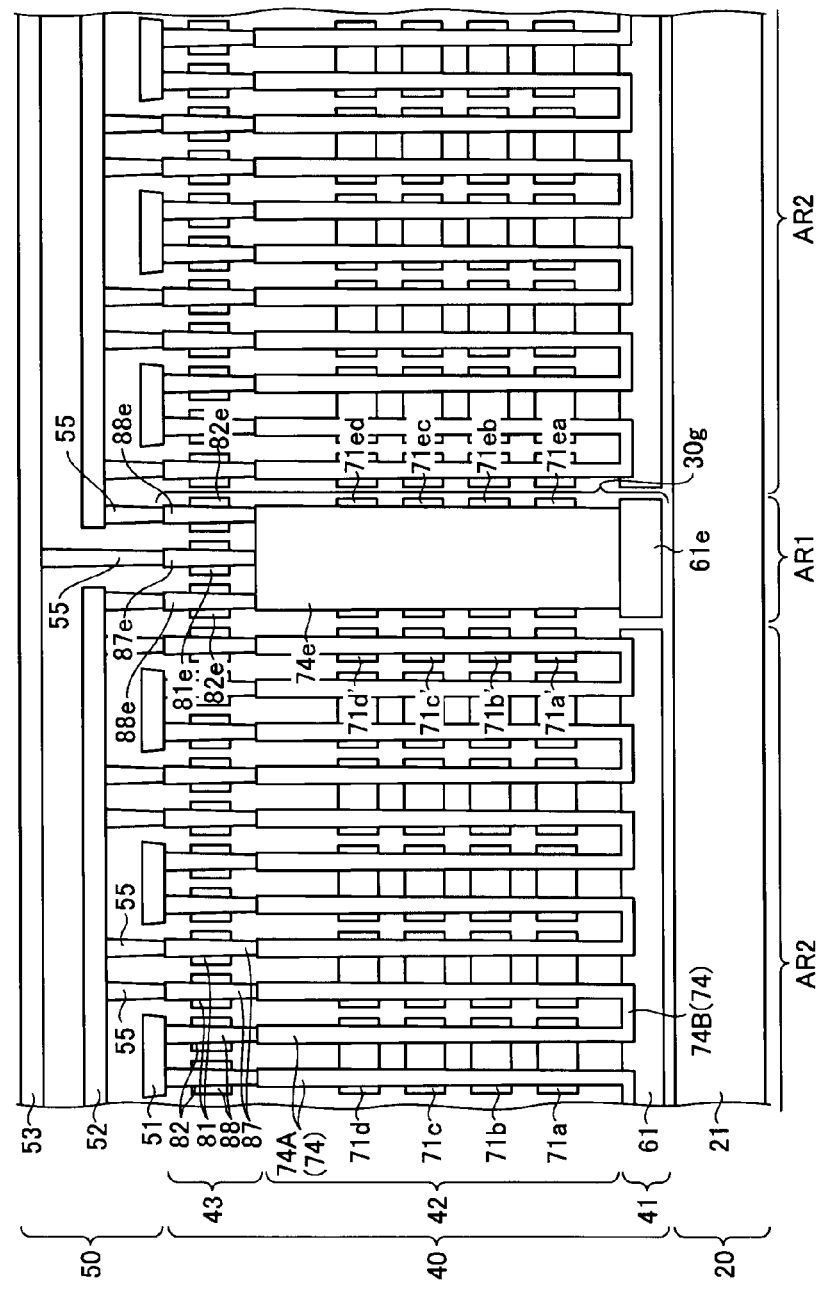
FIG. 24B is a cross-sectional view of the nonvolatile semiconductor memory device in accordance with the twelfth embodiment.
Figure 25:
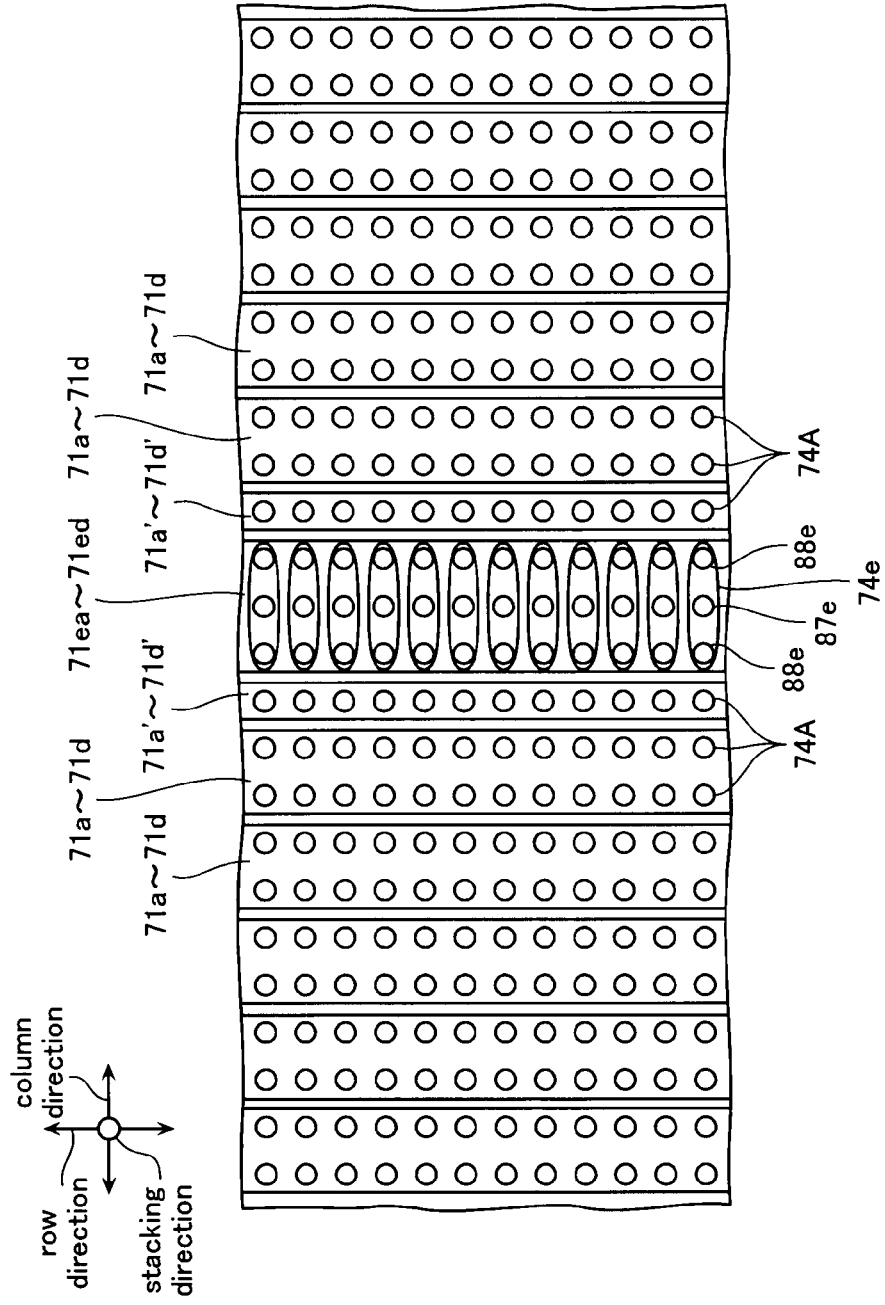
FIG. 25 is a top view of the nonvolatile semiconductor memory device in accordance with the twelfth embodiment.

Next, a configuration of a nonvolatile semiconductor memory device in accordance with a twelfth embodiment is described with reference to FIGS. 24A, 24B, and 25. FIG. 24A is an equivalent circuit diagram of the nonvolatile semiconductor memory device in accordance with the twelfth embodiment, and FIG. 24B is a cross-sectional view of the nonvolatile semiconductor memory device in accordance with the twelfth embodiment. FIG. 25 is a top view of the nonvolatile semiconductor memory device in accordance with the twelfth embodiment. Note that in the twelfth embodiment, identical symbols are assigned to configurations similar to those in the first through eleventh embodiments and descriptions thereof are omitted.

As shown in FIG. 24A, in the nonvolatile semiconductor memory device in accordance with this embodiment, the two switch circuits SWe are disposed symmetrically in the column direction in the first region AR1. These two switch circuits SWe have a cross-sectional shape as in FIG. 24B.

As shown in FIG. 24B, a switch circuit region 30g is formed between memory layers 40 adjacent in the column direction. Arranged in the column direction in the switch circuit region 30g are the two switch circuits SWe. The switch circuit region 30g is shared by two memory layers 40 adjacent in the column direction and is configured to allow the third wiring layer 53 to be electrically connected to the two memory layers 40 via the second wiring layer 52.

A back gate conductive layer 61e, word line conductive layers 71ea-71ed, and a columnar semiconductor layer 74e are formed in the switch circuit region 30g. The back gate conductive layer 61e, word line conductive layers 71ea-71ed, and columnar semiconductor layer 74e are formed longer in the column direction than the back gate conductive layer 61d, word line conductive layers 71da-71dd, and columnar semiconductor layer 74d of the ninth embodiment, but, in other respects, configurations are similar to those of the ninth embodiment. Specifically, a width in the column direction of the columnar semiconductor layer 74e is configured to be such as to contain three of the columnar portions 74A of the memory layer 40. The previously mentioned two switch circuits SWe are formed by the single columnar semiconductor layer 74e.

In addition, a drain side conductive layer 81e, source side conductive layers 82e, a drain side columnar semiconductor layer 87e, and source side columnar semiconductor layers 88e are formed in the switch circuit region 30g. The drain side conductive layer 81e, source side conductive layers 82e, drain side columnar semiconductor layer 87e, and source side columnar semiconductor layers 88e may be manufactured in the same layer, in an identical manufacturing process, and so as to have an identical shape and material as the drain side conductive layer 81, source side conductive layer 82, drain side columnar semiconductor layer 87, and source side columnar semiconductor layer 88.

The drain side conductive layer 81e is formed extending in the row direction in a layer above the word line conductive layer 71ed. The source side conductive layers 82e, two of which are disposed so as to sandwich the drain side conductive layer 81e in the column direction, are formed extending in the row direction. The drain side columnar semiconductor layer 87e is formed so as to penetrate the drain side conductive layer 81e. The drain side columnar semiconductor layer 87e is formed so as to be surrounded by the drain side conductive layer 81e with a drain side gate insulating layer (SiO$_2$) interposed therebetween. The source side columnar semiconductor layers 88e are formed so as to penetrate the source side conductive layers 82e. The source side columnar semiconductor layers 88e are formed so as to be surrounded by the source side conductive layers 82e with a source side gate insulating layer (SiO$_2$) interposed therebetween.

[Advantages of the Nonvolatile Semiconductor Memory Device in Accordance with the Twelfth Embodiment]

The nonvolatile semiconductor memory device in accordance with the twelfth embodiment displays similar advantages to the eighth embodiment. Furthermore, in the nonvolatile semiconductor memory device in accordance with the twelfth embodiment, an occupied area in the column direction can be reduced more than in the eighth embodiment.

[Thirteenth Embodiment]

[Configuration of a Nonvolatile Semiconductor Memory Device in Accordance with a Thirteenth Embodiment]

Figure 26:
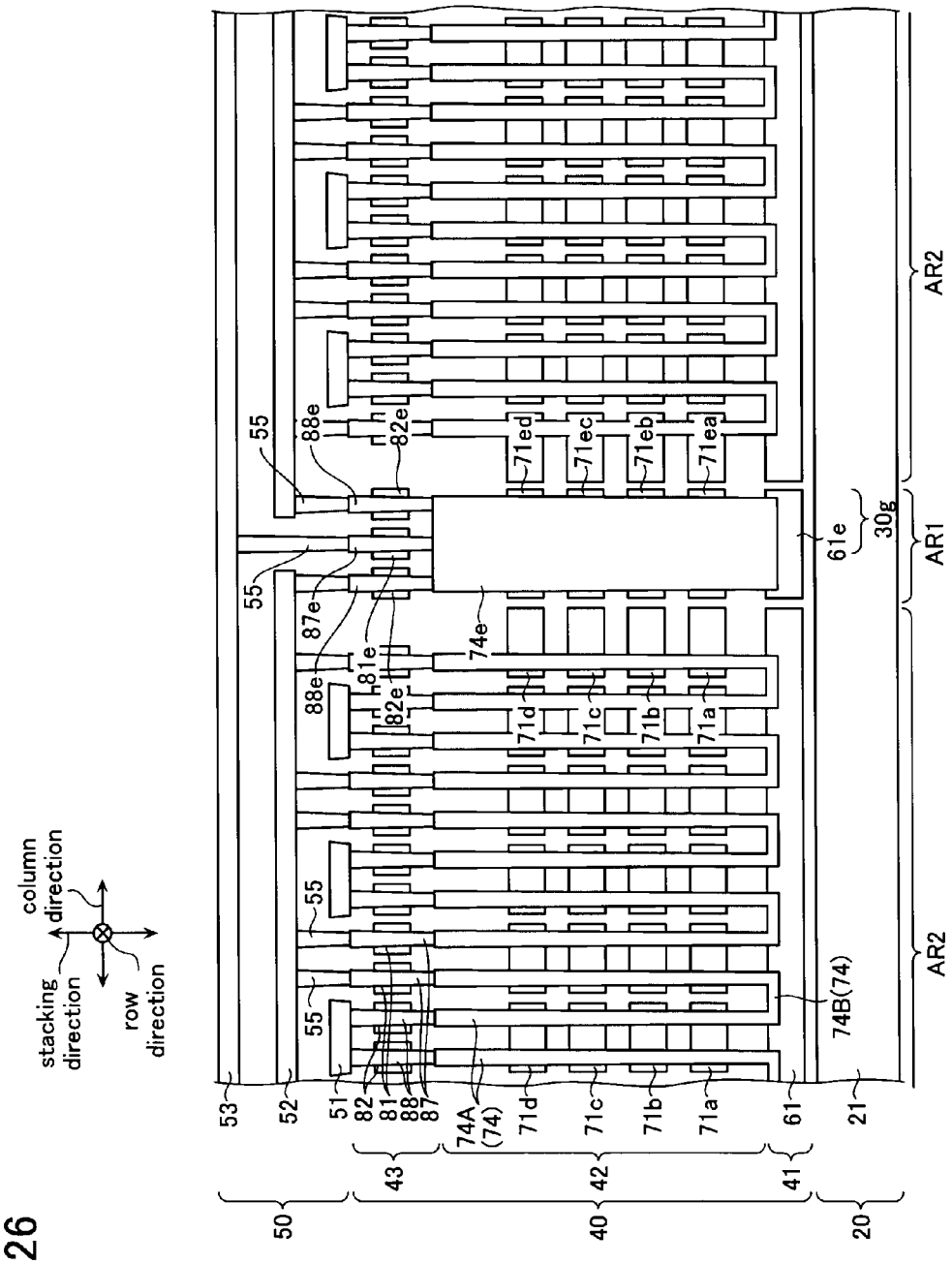
FIG. 26 is a cross-sectional view of a nonvolatile semiconductor memory device in accordance with a thirteenth embodiment.
Figure 27:
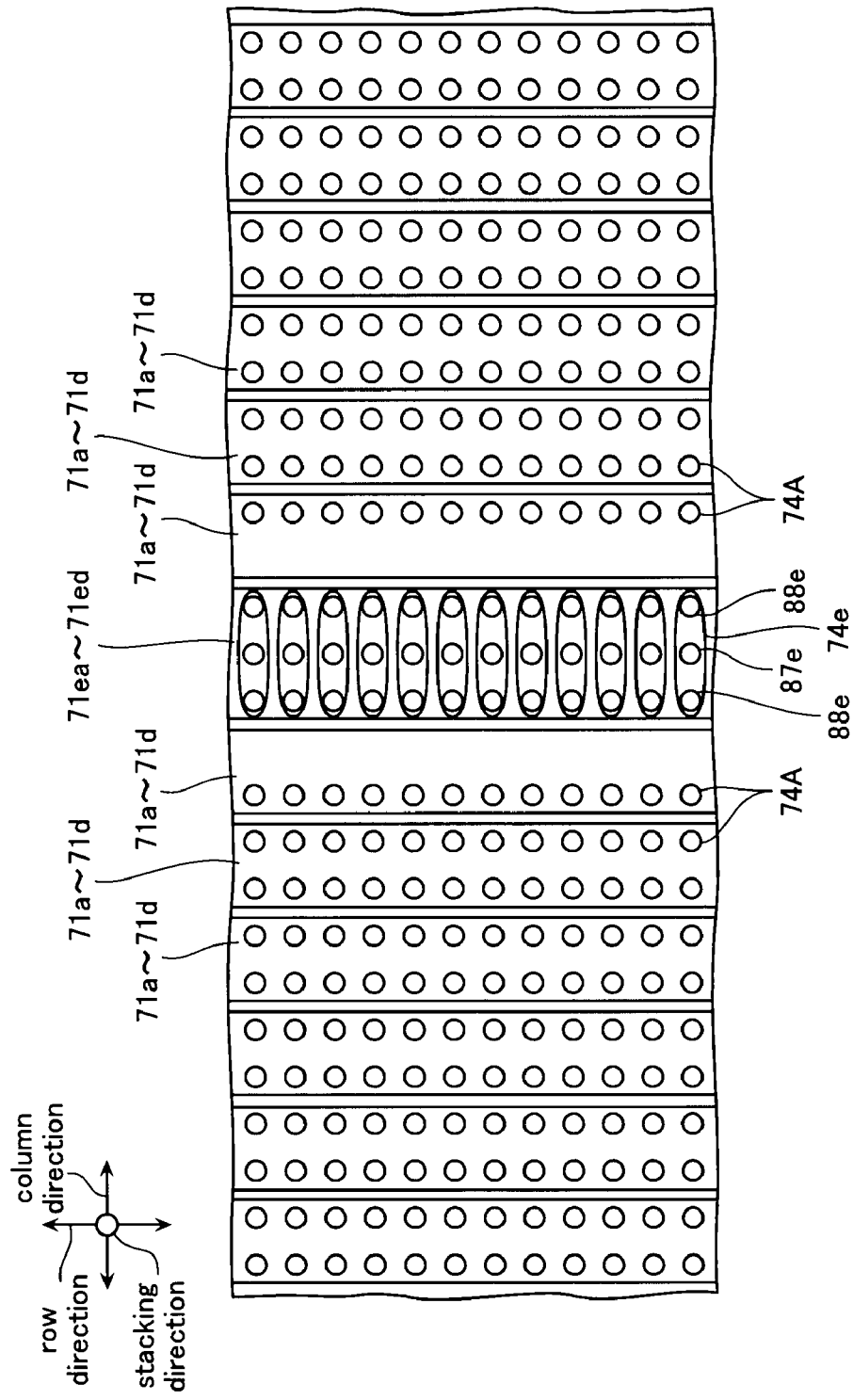
FIG. 27 is a top view of the nonvolatile semiconductor memory device in accordance with the thirteenth embodiment.

Next, a configuration of a nonvolatile semiconductor memory device in accordance with a thirteenth embodiment is described with reference to FIGS. 26 and 27. FIG. 26 is a cross-sectional view of the nonvolatile semiconductor memory device in accordance with the thirteenth embodiment. FIG. 27 is a top view of the nonvolatile semiconductor memory device in accordance with the thirteenth embodiment. Note that in the thirteenth embodiment, identical symbols are assigned to configurations similar to those in the first through twelfth embodiments and descriptions thereof are omitted.

As shown in FIGS. 26 and 27, the nonvolatile semiconductor memory device in accordance with the thirteenth embodiment has the word line conductive layers 71a-71d formed having the same width in the column direction even at the extremity of the memory layer 40, similarly to the tenth embodiment.

[Advantages of the Nonvolatile Semiconductor Memory Device in Accordance with the Thirteenth Embodiment]

The nonvolatile semiconductor memory device in accordance with the thirteenth embodiment displays similar advantages to the twelfth embodiment. Furthermore, the nonvolatile semiconductor memory device in accordance with the thirteenth embodiment allows lithography during manufacture to be readily executed, similarly to the ninth embodiment. Moreover, there is thus no risk of the pattern being broken after exposure.

[Fourteenth Embodiment]

[Configuration of a Nonvolatile Semiconductor Memory Device in Accordance with a Fourteenth Embodiment]

Figure 28:
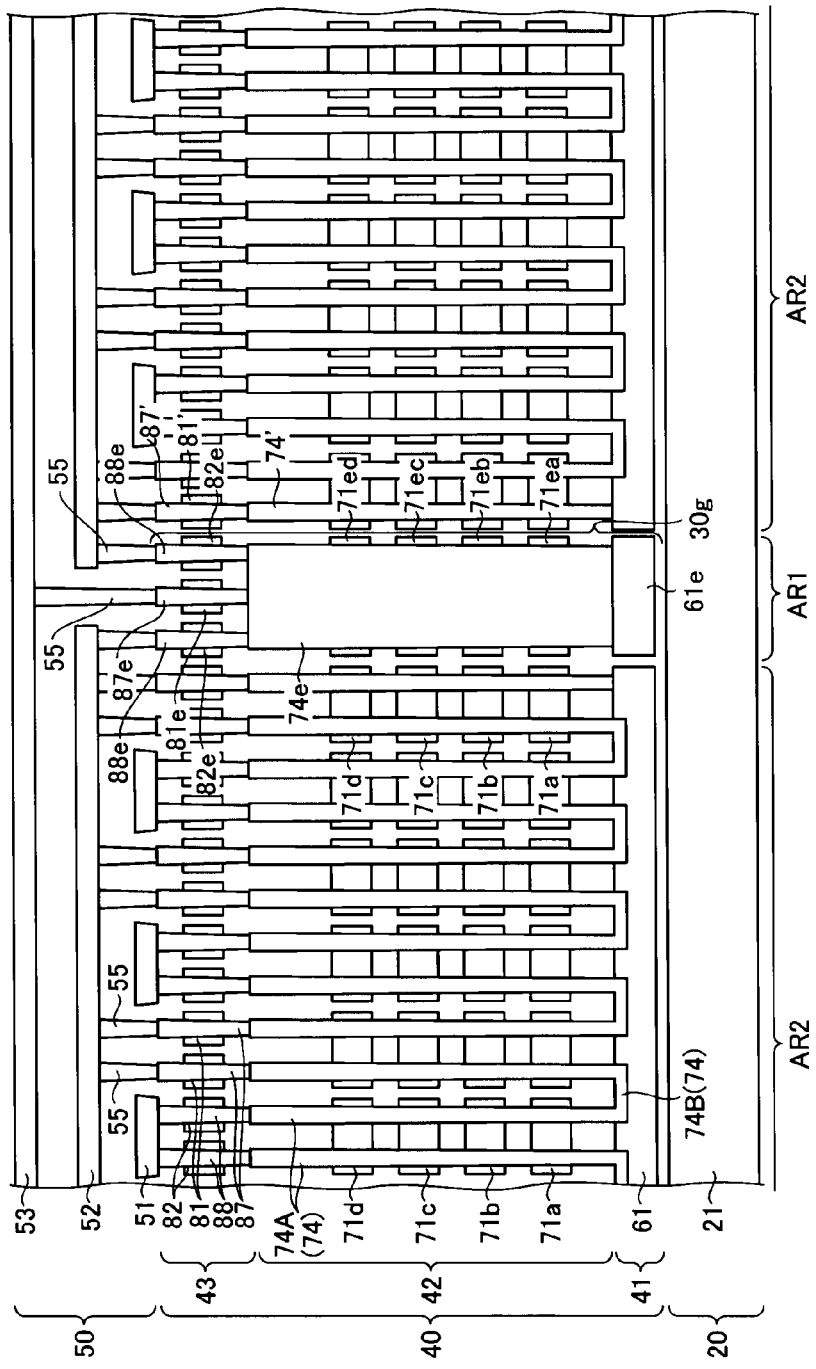
FIG. 28 is a cross-sectional view of a nonvolatile semiconductor memory device in accordance with a fourteenth embodiment.
Figure 29:
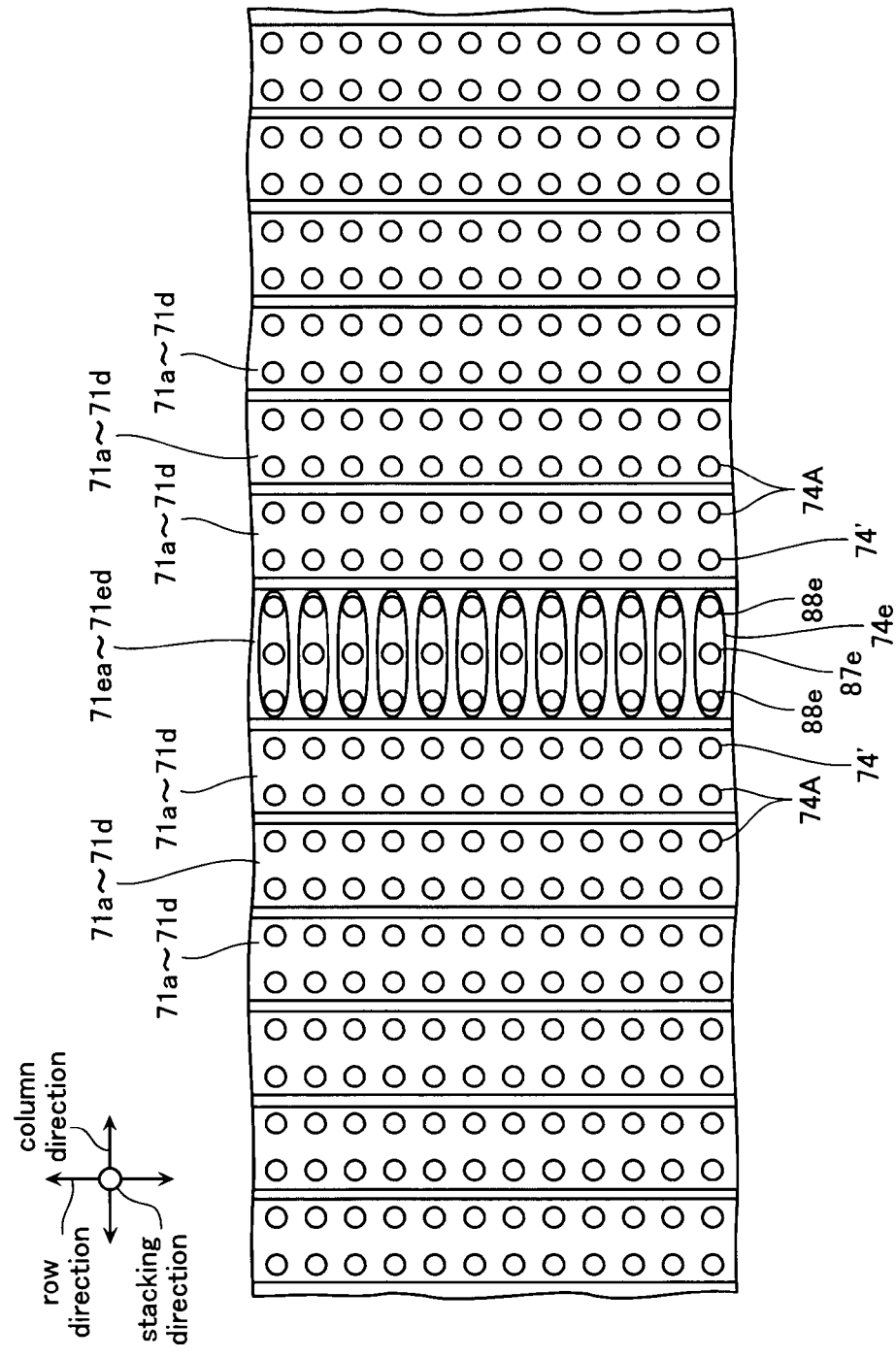
FIG. 29 is a top view of the nonvolatile semiconductor memory device in accordance with the fourteenth embodiment.

Next, a configuration of a nonvolatile semiconductor memory device in accordance with a fourteenth embodiment is described with reference to FIGS. 28 and 29. FIG. 28 is a cross-sectional view of the nonvolatile semiconductor memory device in accordance with the fourteenth embodiment. FIG. 29 is a top view of the nonvolatile semiconductor memory device in accordance with the fourteenth embodiment. Note that in the fourteenth embodiment, identical symbols are assigned to configurations similar to those in the first through thirteenth embodiments and descriptions thereof are omitted.

As shown in FIGS. 28 and 29, in the nonvolatile semiconductor memory device in accordance with the fourteenth embodiment, the memory layer 40 includes the dummy columnar semiconductor layer 74', the dummy conductive layer 81', and the dummy columnar semiconductor layer 87', similarly to the eleventh embodiment.

[Advantages of the Nonvolatile Semiconductor Memory Device in Accordance with the Fourteenth Embodiment]

The nonvolatile semiconductor memory device in accordance with the fourteenth embodiment includes the word line conductive layers 71a-71d, and the columnar portion 74A and dummy columnar semiconductor layer 74' formed with a certain periodic pattern along the second region AR2. Consequently, lithography during manufacture can be executed even more readily in the nonvolatile semiconductor memory device in accordance with the fourteenth embodiment than in the thirteenth embodiment.

[Fifteenth Embodiment]

[Configuration of a Nonvolatile Semiconductor Memory Device in Accordance with a Fifteenth Embodiment]

Figure 30:
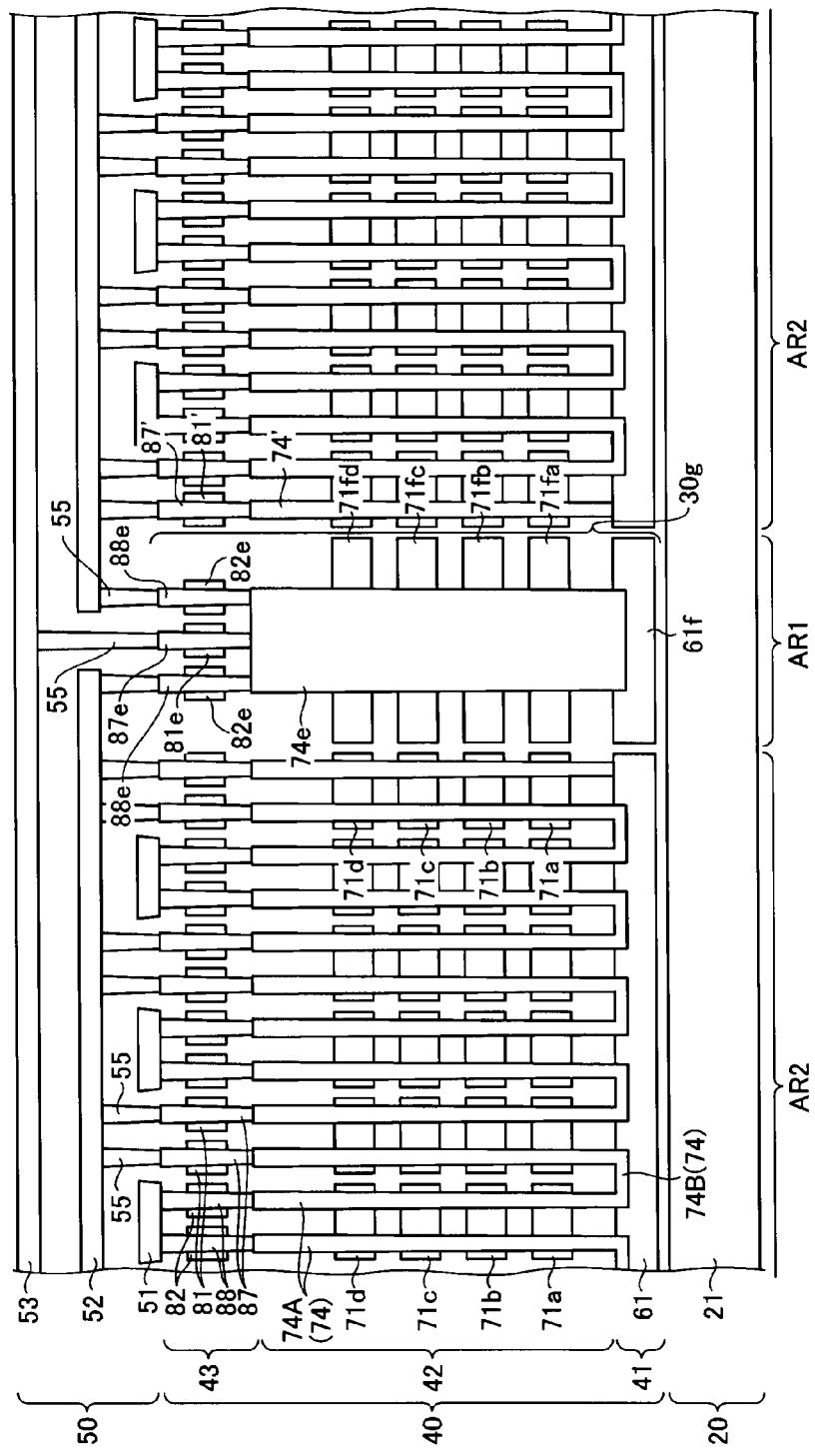
FIG. 30 is a cross-sectional view of a nonvolatile semiconductor memory device in accordance with a fifteenth embodiment.
Figure 31:
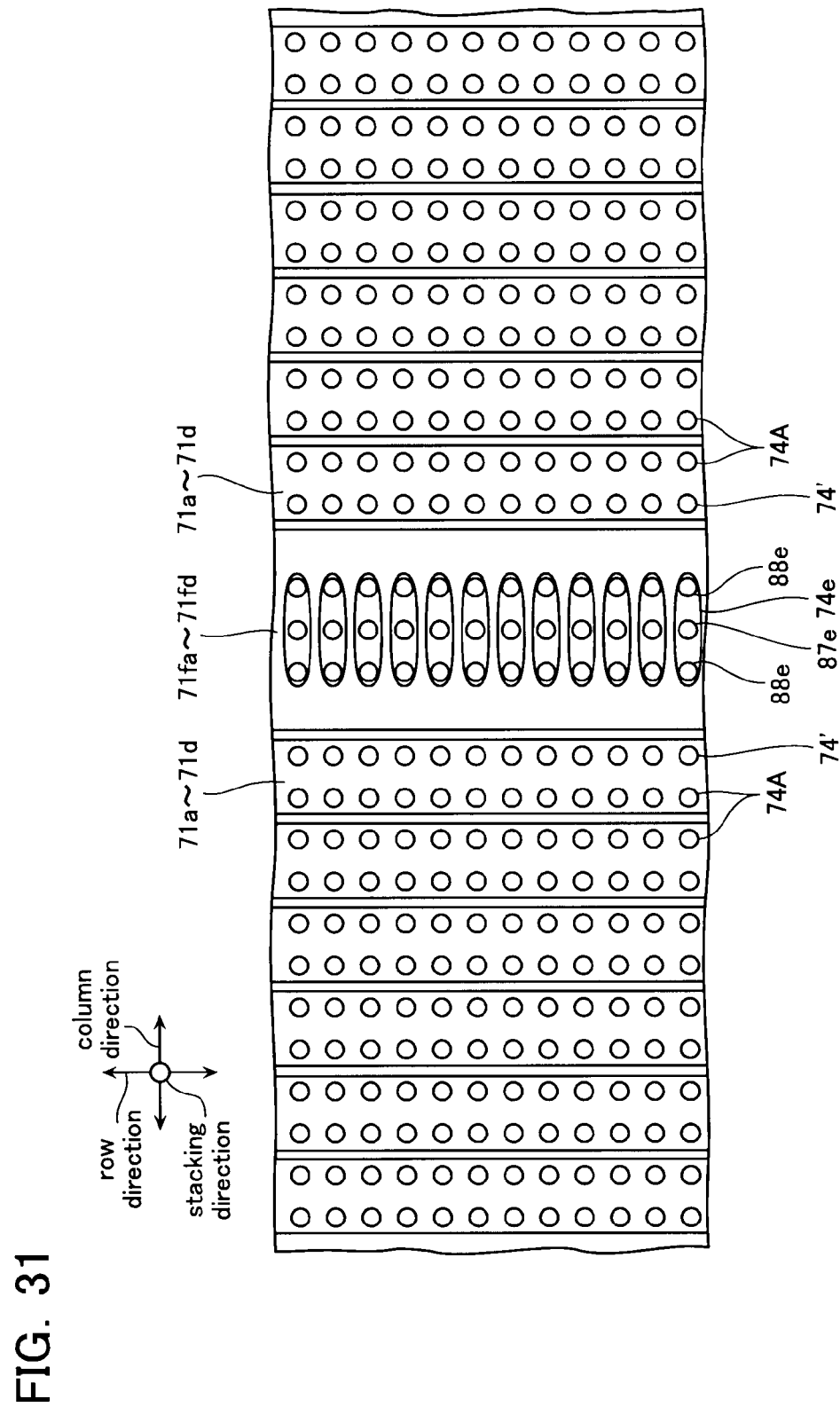
FIG. 31 is a top view of the nonvolatile semiconductor memory device in accordance with the fifteenth embodiment.

Next, a configuration of a nonvolatile semiconductor memory device in accordance with a fifteenth embodiment is described with reference to FIGS. 30 and 31. FIG. 30 is a cross-sectional view of the nonvolatile semiconductor memory device in accordance with the fifteenth embodiment. FIG. 31 is a top view of the nonvolatile semiconductor memory device in accordance with the fifteenth embodiment. Note that in the fifteenth embodiment, identical symbols are assigned to configurations similar to those in the first through fourteenth embodiments and descriptions thereof are omitted.

As shown in FIGS. 30 and 31, the switch circuit region 30g in accordance with the fifteenth embodiment includes a back gate conductive layer 61f and word line conductive layers 71fa-71fd that are formed longer (for example, two times longer) in the column direction than those of the fourteenth embodiment.

[Advantages of the Nonvolatile Semiconductor Memory Device in Accordance with the Fifteenth Embodiment]

The nonvolatile semiconductor memory device in accordance with the fifteenth embodiment includes the back gate conductive layer 61f and the word line conductive layers 71fa-71fd that are formed longer in the column direction than those of the fourteenth embodiment. Wiring resistance of the back gate conductive layer 61f and word line conductive layers 71fa-71fd can therefore be suppressed in comparison with the fourteenth embodiment.

[Sixteenth Embodiment]

[Configuration of a Nonvolatile Semiconductor Memory Device in Accordance with a Sixteenth Embodiment]

Figure 32:
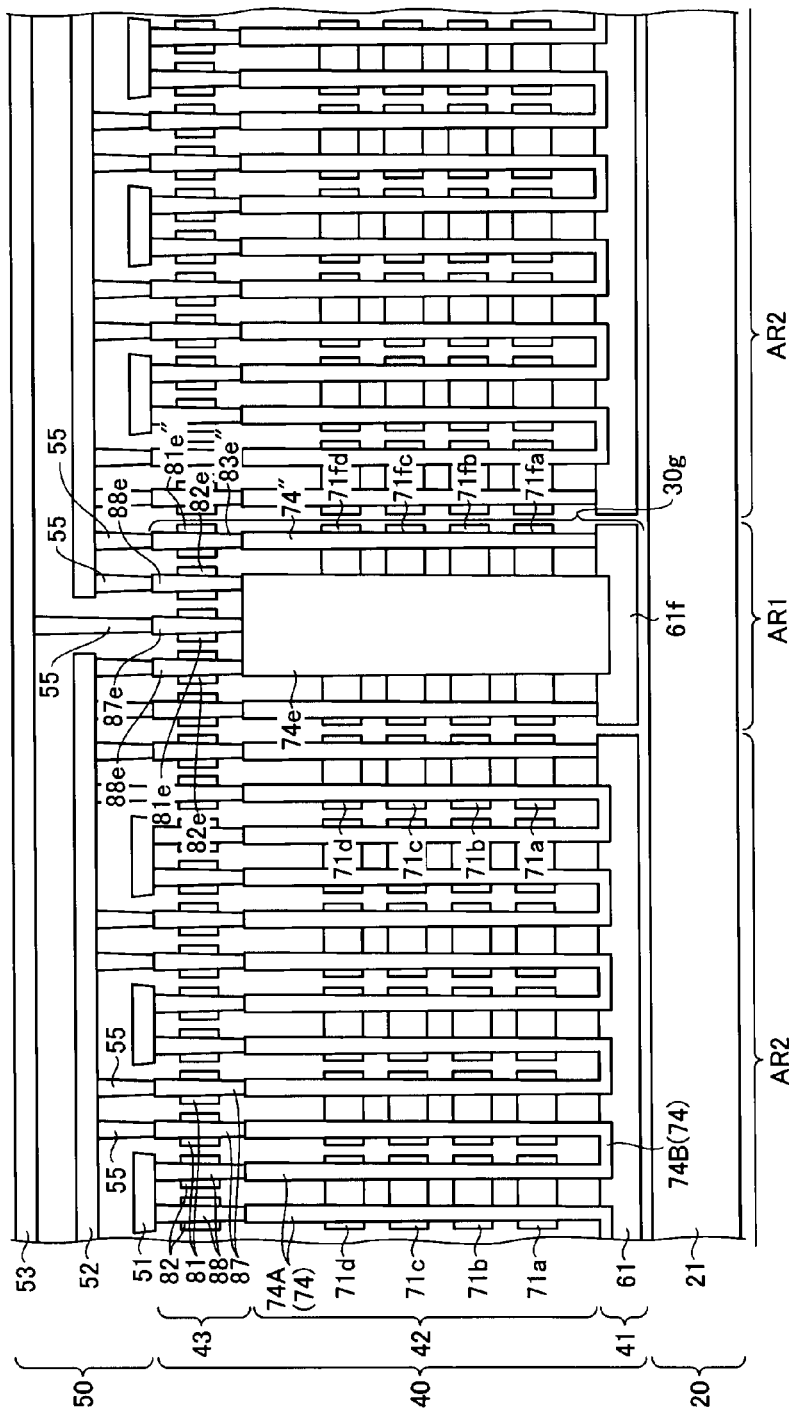
FIG. 32 is a cross-sectional view of a nonvolatile semiconductor memory device in accordance with a sixteenth embodiment.
Figure 33:
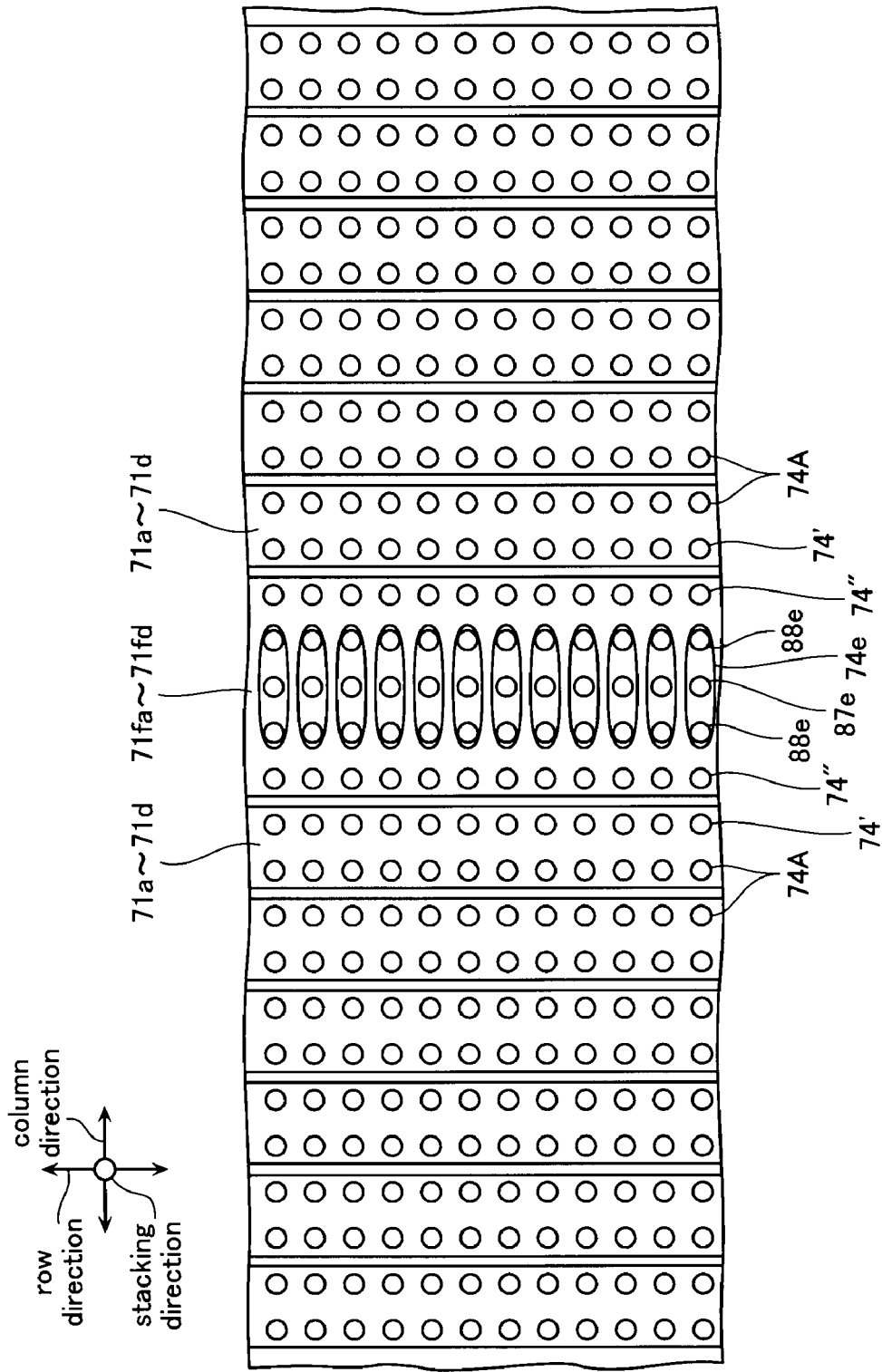
FIG. 33 is a top view of the nonvolatile semiconductor memory device in accordance with the sixteenth embodiment.

Next, a configuration of a nonvolatile semiconductor memory device in accordance with a sixteenth embodiment is described with reference to FIGS. 32 and 33. FIG. 32 is a cross-sectional view of the nonvolatile semiconductor memory device in accordance with the sixteenth embodiment. FIG. 33 is a top view of the nonvolatile semiconductor memory device in accordance with the sixteenth embodiment. Note that in the sixteenth embodiment, identical symbols are assigned to configurations similar to those in the first through fifteenth embodiments and descriptions thereof are omitted.

As shown in FIGS. 32 and 33, the switch circuit region 30g in accordance with the sixteenth embodiment includes a dummy columnar semiconductor layer 74" extending in the stacking direction so as to penetrate the word line conductive layers 71fa-71fd. The dummy columnar semiconductor layer 74" is provided at both end vicinities in the column direction of the word line conductive layers 71fa-71fd so as to sandwich the columnar semiconductor layer 74e. The dummy columnar semiconductor layer 74" is formed reaching the back gate conductive layer 61f.

Additionally as shown in FIGS. 32 and 33, the switch circuit region 30g includes a dummy conductive layer 81e" and a dummy columnar semiconductor layer 83e". The dummy conductive layer 81e" is formed in the same layer as the drain side conductive layer 81e and source side conductive layer 82e. The dummy columnar semiconductor layer 83e" is formed in a column shape extending upwardly from an upper surface of the dummy columnar semiconductor layer 74" so as to penetrate the dummy conductive layer 81e".

[Advantages of the Nonvolatile Semiconductor Memory Device in Accordance with the Sixteenth Embodiment]

The nonvolatile semiconductor memory device in accordance with the sixteenth embodiment displays similar advantages to the fifteenth embodiment. Furthermore, the nonvolatile semiconductor memory device in accordance with the sixteenth embodiment includes the dummy columnar semiconductor layers 74' and 74" and the columnar portion 74A of the U-shaped columnar semiconductor layer 74 formed cyclically with a fixed pattern, and therefore allows lithography during manufacture to be executed more readily than in the fifteenth embodiment.

[Seventeenth Embodiment]

[Configuration of a Nonvolatile Semiconductor Memory Device in Accordance with a Seventeenth Embodiment]

Figure 34:
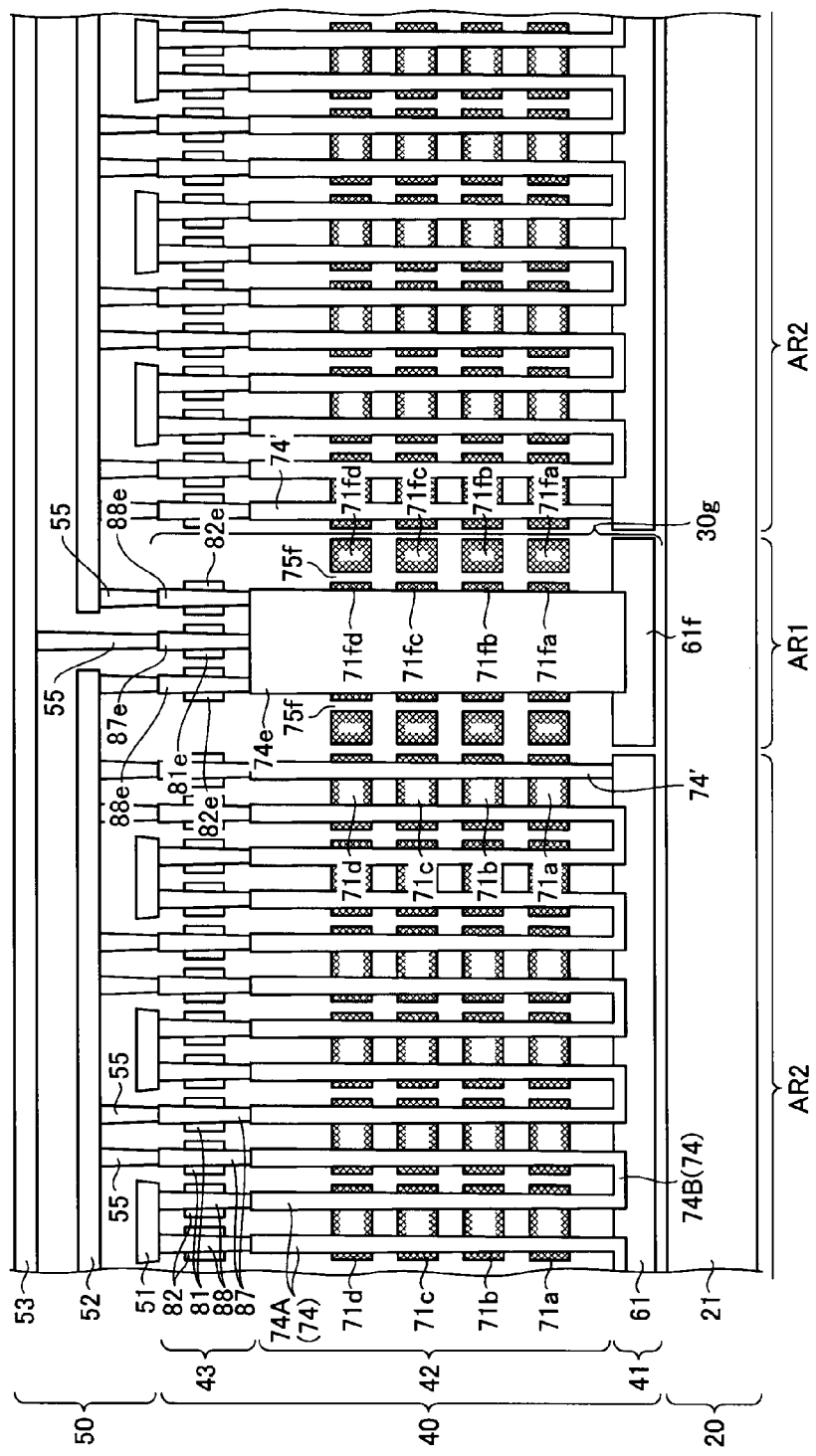
FIG. 34 is a cross-sectional view of a nonvolatile semiconductor memory device in accordance with a seventeenth embodiment.
Figure 35:
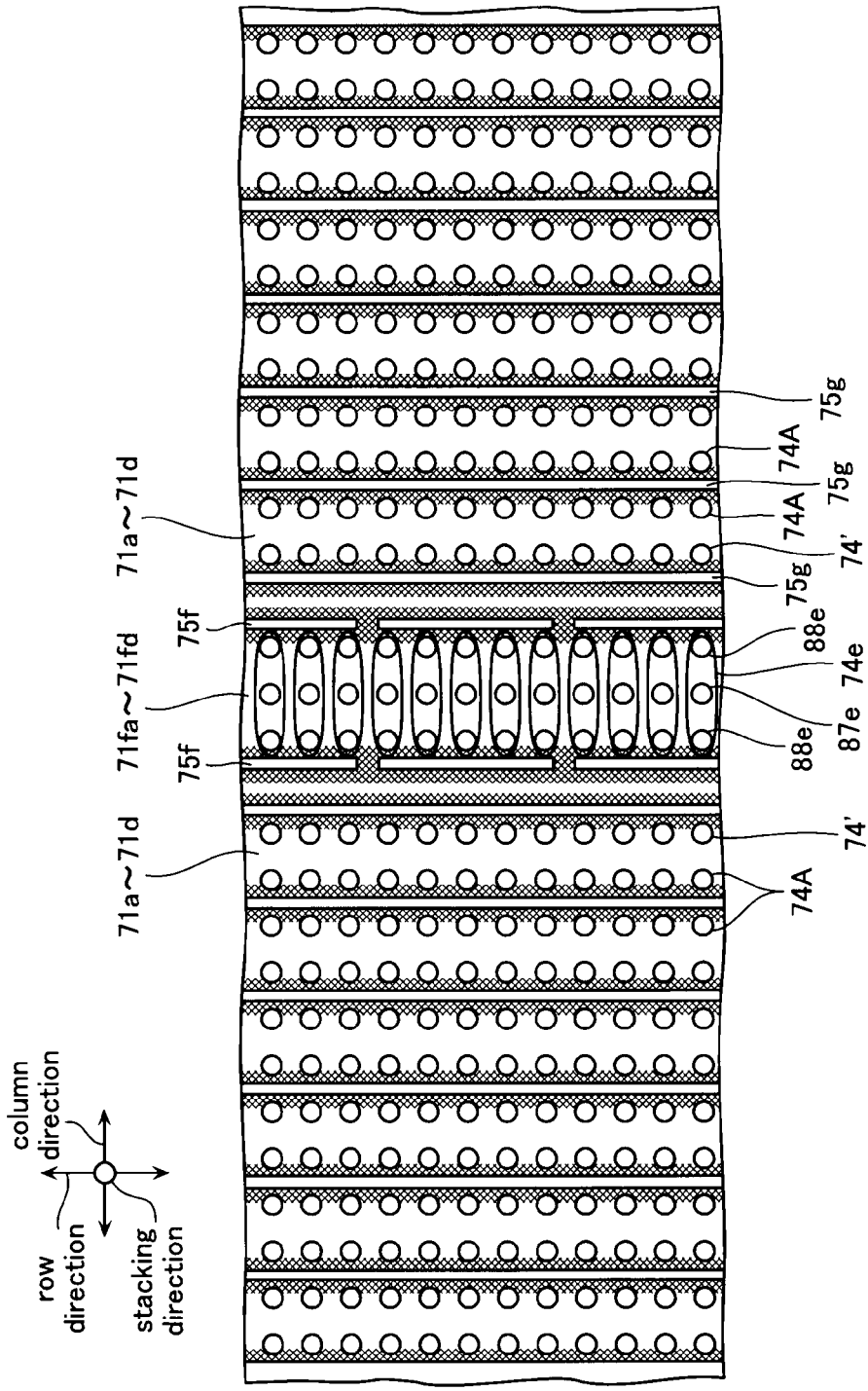
FIG. 35 is a top view of the nonvolatile semiconductor memory device in accordance with the seventeenth embodiment.

Next, a configuration of a nonvolatile semiconductor memory device in accordance with a seventeenth embodiment is described with reference to FIGS. 34 and 35. FIG. 34 is a cross-sectional view of the nonvolatile semiconductor memory device in accordance with the seventeenth embodiment. FIG. 35 is a top view of the nonvolatile semiconductor memory device in accordance with the seventeenth embodiment. Note that in the seventeenth embodiment, identical symbols are assigned to configurations similar to those in the first through sixteenth embodiments and descriptions thereof are omitted.

The nonvolatile semiconductor memory device in accordance with the seventeenth embodiment has the word line conductive layers 71a-71d in the memory layer 40 and the word line conductive layers 71fa-71fd in the switch circuit region 30g silicided to achieve a lowering of resistance of wiring. The portion shown with hatching in FIGS. 34 and 35 represents the silicided portion.

In the nonvolatile semiconductor memory device in accordance with the seventeenth embodiment, the word line conductive layers 71fa-71fd include trenches 75f extending in the row direction and having a certain pitch in the row direction, as shown in FIGS. 34 and 35. To silicide via these trenches 75f, titanium, nickel, and so on, are deposited inside the trenches 75f using CVD or the like, whereby at least the word line conductive layers 71fa-71fd in a periphery of these trenches 75f are silicided. The trenches 75f are provided in the vicinity of the columnar semiconductor layer 74e, resulting in the word line conductive layers 71fa-71fd in the vicinity of the columnar semiconductor layer 74e also being silicided.

Further, since the trenches 75f are formed with a certain pitch in the row direction as previously mentioned, a width in the column direction of the word line conductive layers 71fa-71fd is substantially identical to that of the sixteenth embodiment. Note that siliciding of the word line conductive layers 71a-71d in the memory layer 40 is performed via trenches 75g provided during formation of the word line conductive layers 71a-71d by RIE.

[Advantages of the Nonvolatile Semiconductor Memory Device in Accordance with the Seventeenth Embodiment]

In the nonvolatile semiconductor memory device in accordance with the seventeenth embodiment, the word line conductive layers 71fa-71fd include a silicided layer. Moreover, the existence of the trenches 75f causes the silicided layer to be formed not only in an outer peripheral portion (near the trenches 75g) but also in the vicinity of the columnar semiconductor layer 74e. The nonvolatile semiconductor memory device in accordance with the seventeenth embodiment therefore allows wiring resistance of the word line conductive layers 71fa-71fd to be further suppressed in comparison with the sixteenth embodiment.

[Eighteenth Embodiment]

[Configuration of a Nonvolatile Semiconductor Memory Device in Accordance with an Eighteenth Embodiment]

Figure 36:
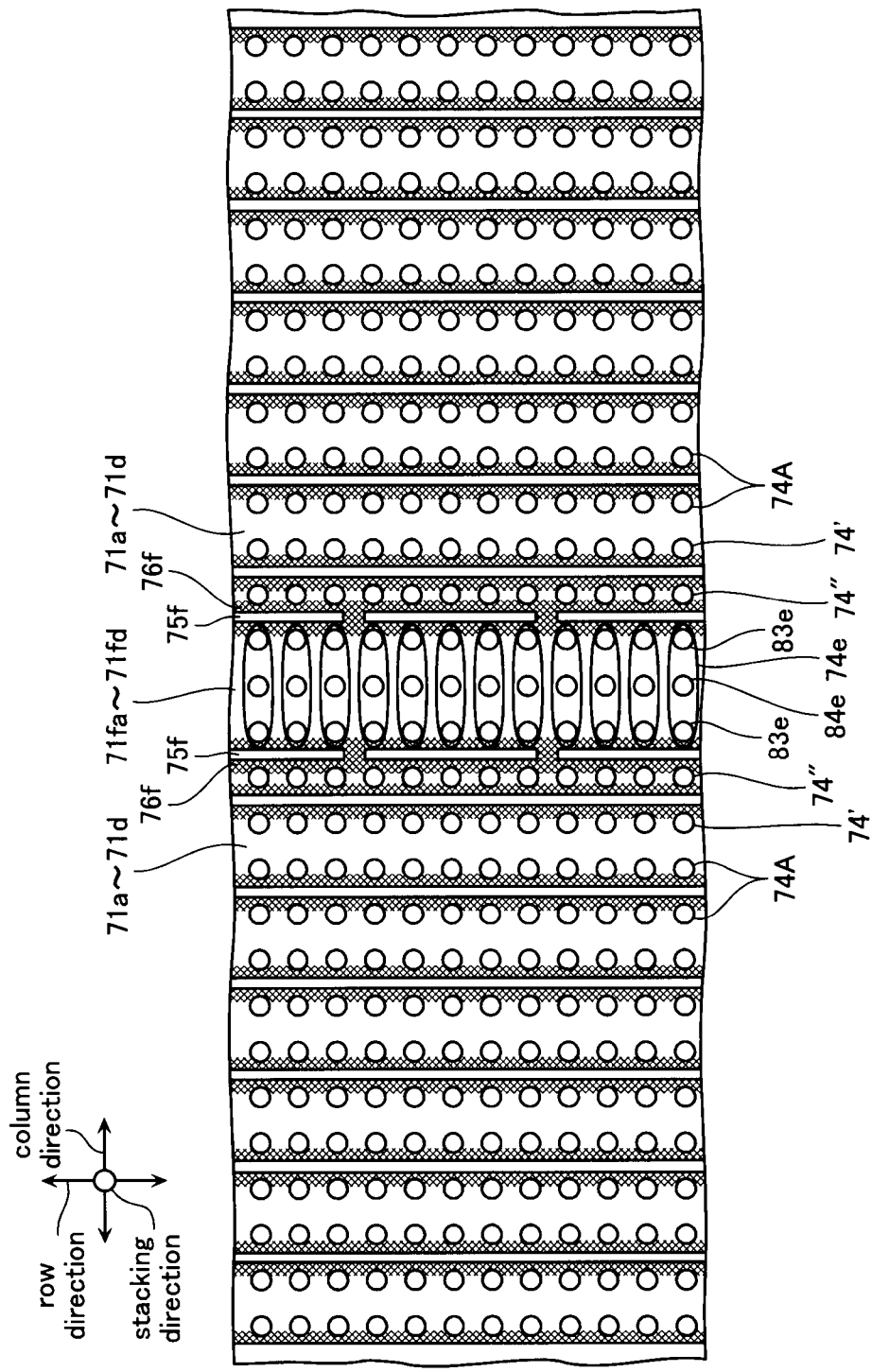
FIG. 36 is a top view of a nonvolatile semiconductor memory device in accordance with an eighteenth embodiment.

Next, a configuration of a nonvolatile semiconductor memory device in accordance with an eighteenth embodiment is described with reference to FIG. 36. FIG. 36 is a top view of the nonvolatile semiconductor memory device in accordance with the eighteenth embodiment. Note that in the eighteenth embodiment, identical symbols are assigned to configurations similar to those in the first through seventeenth embodiments and descriptions thereof are omitted.

As shown in FIG. 36, in addition to the configuration of the seventeenth embodiment, the nonvolatile semiconductor memory device in accordance with the eighteenth embodiment includes the dummy columnar semiconductor layer 74", similarly to the sixteenth embodiment.

[Advantages of the Nonvolatile Semiconductor Memory Device in Accordance with the Eighteenth Embodiment]

The nonvolatile semiconductor memory device in accordance with the eighteenth embodiment displays similar advantages to the seventeenth embodiment. Furthermore, the nonvolatile semiconductor memory device in accordance with the eighteenth embodiment includes the dummy columnar semiconductor layers 74' and 74" and the columnar portion 74A of the U-shaped columnar semiconductor layer 74 formed cyclically with a fixed pattern, and therefore allows lithography during manufacture to be executed more readily than in the seventeenth embodiment.

[Nineteenth Embodiment]

[Configuration of a Nonvolatile Semiconductor Memory Device in Accordance with a Nineteenth Embodiment]

Figure 37:
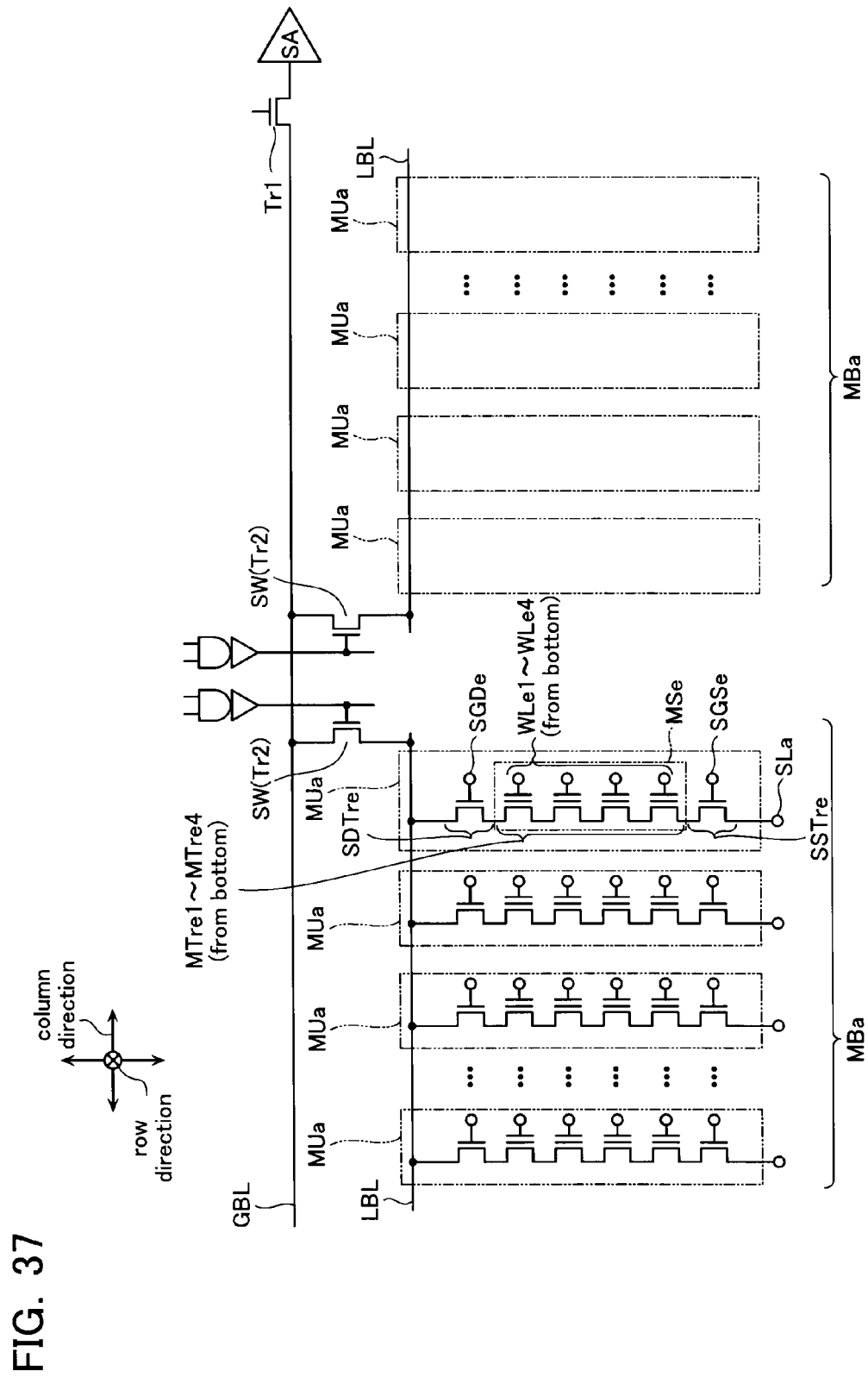
FIG. 37 is an equivalent circuit diagram of a nonvolatile semiconductor memory device in accordance with a nineteenth embodiment.

Next, a configuration of a nonvolatile semiconductor memory device in accordance with a nineteenth embodiment is described with reference to FIG. 37. FIG. 37 is a circuit diagram of the nonvolatile semiconductor memory device in accordance with the nineteenth embodiment. Note that in the nineteenth embodiment, identical symbols are assigned to configurations similar to those in the first through eighteenth embodiments and descriptions thereof are omitted.

As shown in FIG. 37, the nonvolatile semiconductor memory device in accordance with the nineteenth embodiment includes memory blocks MBa (memory units MUa) which differ from those in the first through eighteenth embodiments. Each of the memory units MUa includes a memory string MSe, a drain side select transistor SDTre, and a source side select transistor SSTre.

The memory string MSe includes memory transistors MTre1-MTre4 connected in series. In the memory block MBa, gates of the memory transistors MTre1-MTre4 are commonly connected to word lines WLe1-WLe4, respectively. The drain side select transistor SDTre has its source connected to a drain of the memory transistor MTre4 and its drain connected to the local bit line LBL. Gates of the drain side select transistors SDTre arranged in a line in the row direction are commonly connected to a drain side select gate line SGDe. The source side select transistor SSTre has its source connected to a source line SLa and its drain connected to a source of the memory transistor MTre1. Gates of the source side select transistors SSTre arranged in a line in the row direction are commonly connected to a source side select gate line SGSe.

Figure 38:
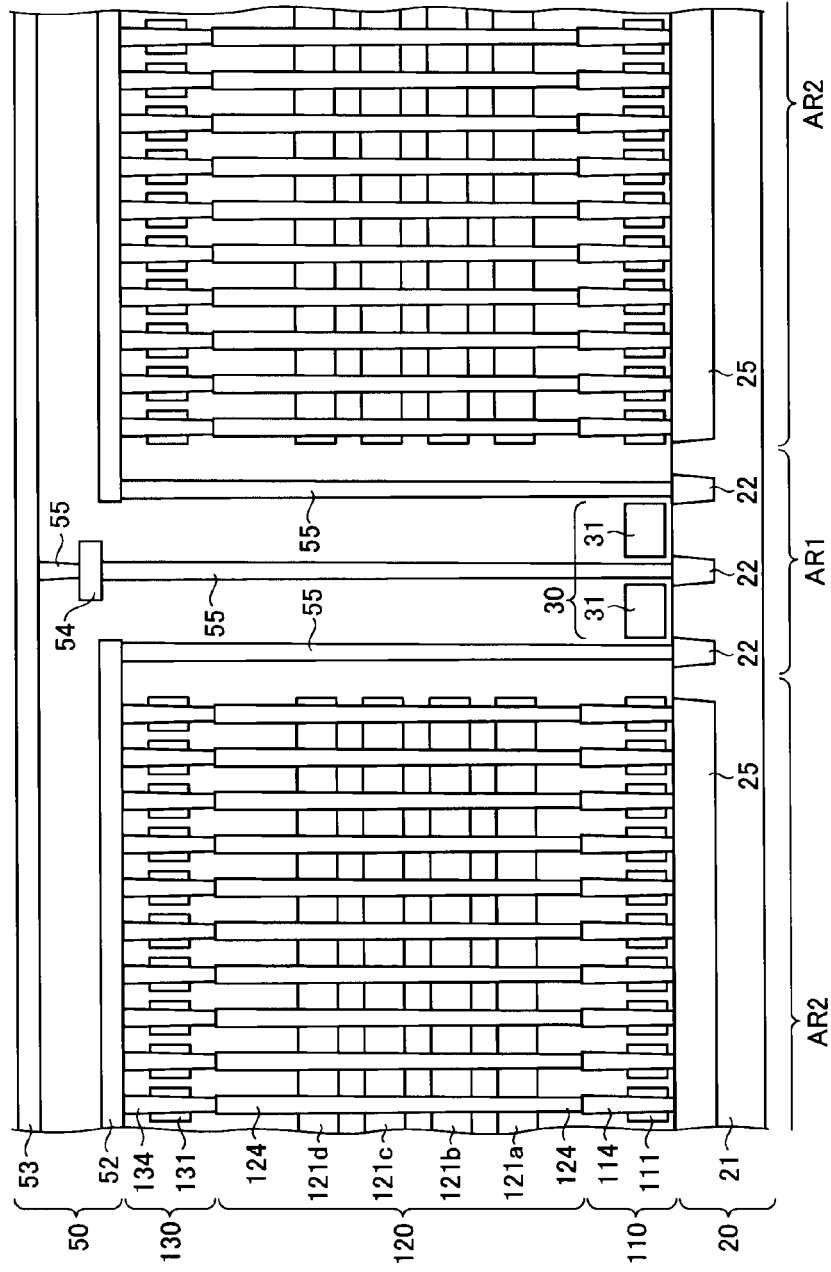
FIG. 38 is a cross-sectional view of the nonvolatile semiconductor memory device in accordance with the nineteenth embodiment.
Figure 39:
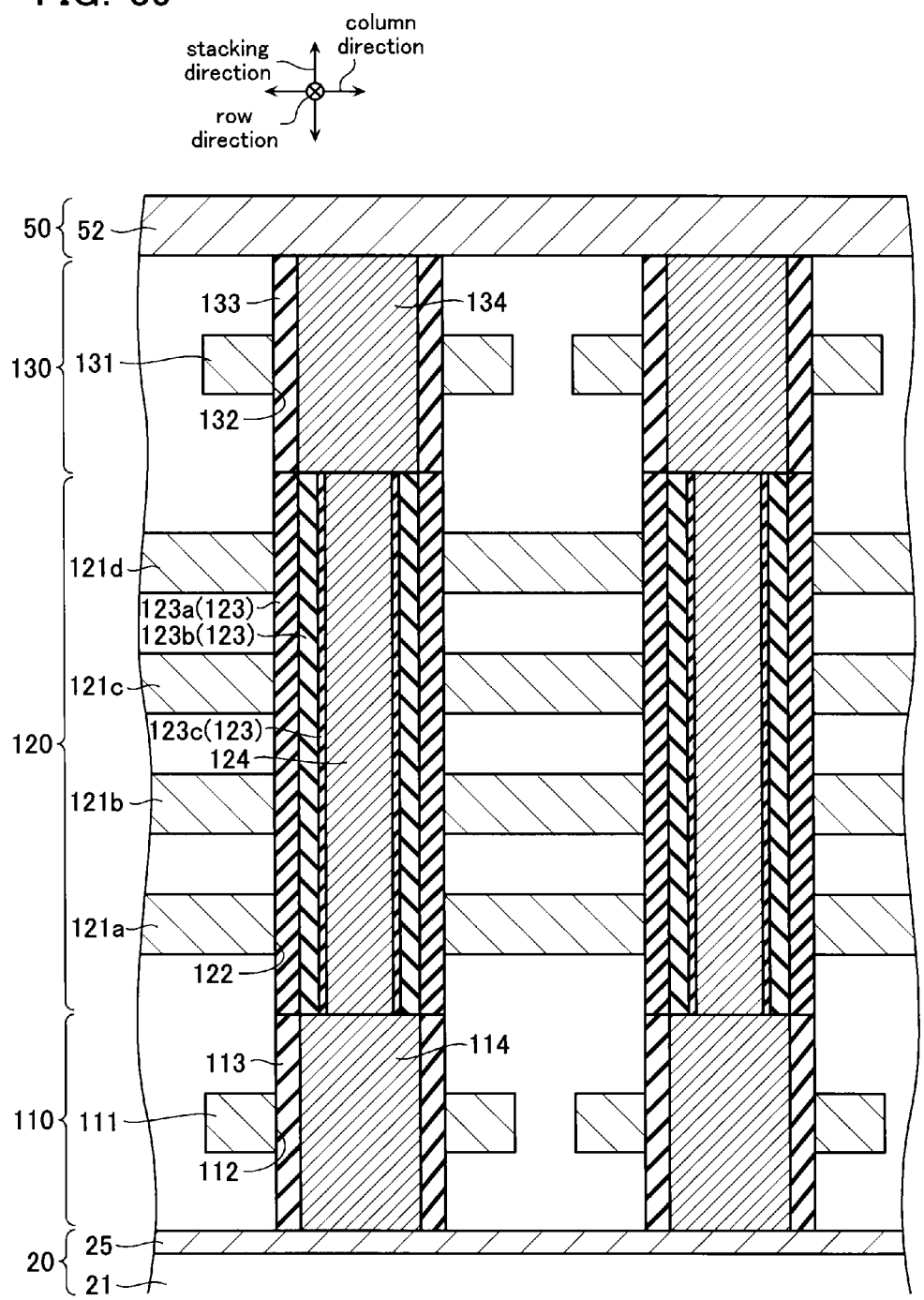
FIG. 39 is an enlarged cross-sectional view of the nonvolatile semiconductor memory device in accordance with the nineteenth embodiment.

Next, a stacking structure of the nonvolatile semiconductor memory device in accordance with the nineteenth embodiment configured to realize the above-described circuit configuration is described with reference to FIGS. 38 and 39. FIG. 38 is a cross-sectional view of the nonvolatile semiconductor memory device in accordance with the nineteenth embodiment. FIG. 39 is an enlarged view of FIG. 38.

Included on the substrate 20 of the nonvolatile semiconductor memory device in accordance with the nineteenth embodiment, from a lower layer to an upper layer, are a source side select transistor layer 110, a memory transistor layer 120, a drain side select transistor layer 130, and the wiring layer 50, as shown in FIGS. 38 and 39. The substrate 20 functions as the source line SLa. The source side select transistor layer 110 functions as the source side select transistor SSTre. The memory transistor layer 120 functions as the memory transistors MTre1-MTre4. The drain side select transistor layer 130 functions as the drain side select transistor SDTre.

As shown in FIG. 38, the substrate 20 includes a conductive layer 25 in addition to the configuration of the first embodiment. The conductive layer 25 is formed on an upper surface of the substrate 21 in the second region AR2.

As shown in FIG. 38, the source side select transistor layer 110 includes a source side conductive layer 111 in the same layer as the conductive layer 31 in the switch circuit region 30. The source side conductive layer 111 functions as the source side select gate line SGSe and as a gate of the source side select transistor SSTre. The source side conductive layer 111 is formed in stripes extending in the row direction and having a certain pitch in the column direction. The source side conductive layer 111 is constituted by polysilicon (poly-Si).

As shown in FIG. 39, the source side select transistor layer 110 includes a source side hole 112 penetrating the source side conductive layer 111. The source side hole 112 is formed in a matrix in the column direction and the row direction.

As shown in FIG. 39, the source side select transistor layer 110 includes a source side gate insulating layer 113 and a source side columnar semiconductor layer 114 within the source side hole 112. The source side columnar semiconductor layer 114 functions as a body of the source side select transistor SSTre.

The source side gate insulating layer 113 is formed with a certain thickness in a side surface of the source side hole 112. The source side gate insulating layer 113 is constituted by silicon oxide ($SiO_2$). The source side columnar semiconductor layer 114 is formed so as to fill the source side hole 112 and so as to extend in a column shape in the stacking direction and to be in contact with the source side gate insulating layer 113. The source side columnar semiconductor layer 114 is constituted by polysilicon (poly-Si).

Expressing the above-described configuration in other words, the source side columnar semiconductor layer 114 is formed so as to be surrounded by the source side gate insulating layer 113, and the source side gate insulating layer 113 is formed so as to be surrounded by the source side conductive layer 111.

As shown in FIGS. 38 and 39, the memory transistor layer 120 includes word line conductive layers 121a-121d having a certain pitch in the stacking direction. The word line conductive layers 121a-121d function as the word lines WLe1-WLe4 and as gates of the memory transistors MTre1-MTre4. The word line conductive layers 121a-121d are formed in a plate-like shape extending in the row direction and the column direction in the second region AR2. The word line conductive layers 121a-121d are constituted by polysilicon (poly-Si).

As shown in FIG. 39, the memory transistor layer 120 includes a memory hole 122 penetrating the word line conductive layers 121a-121d. The memory hole 122 is disposed in a matrix in the row direction and the column direction and is formed at a position aligning with the source side hole 112.

As shown in FIG. 39, the memory transistor layer 120 includes a memory gate insulating layer 123 and a memory columnar semiconductor layer 124 within the memory hole 122. The memory columnar semiconductor layer 124 functions as a body of the memory transistors MTre1-MTre4.

As shown in FIG. 39, the memory gate insulating layer 123 includes a block insulating layer 123a, a charge storage layer 123b, and a tunnel insulating layer 123c. The block insulating layer 123a is formed with a certain thickness in a side surface of the memory hole 122. The block insulating layer 123a is constituted by silicon oxide ($SiO_2$). The charge storage layer 123b is formed in contact with the block insulating layer 123a with a certain thickness. The charge storage layer 123b is constituted by silicon nitride (SiN). The tunnel insulating layer 123c is formed in contact with the charge storage layer 123b with a certain thickness. The tunnel insulating layer 123c is constituted by silicon oxide ($SiO_2$).

The memory columnar semiconductor layer 124 is formed so as to fill the memory hole 122 and so as to extend in a column shape in the stacking direction and to be in contact with the tunnel insulating layer 123c. The memory columnar semiconductor layer 124 is constituted by polysilicon (poly-Si).

Note that, expressing the above-described configuration in other words, the memory columnar semiconductor layer 124 is formed so as to be surrounded by the memory gate insulating layer 123, and the memory gate insulating layer 123 is formed so as to be surrounded by the word line conductive layers 121a-121d.

As shown in FIGS. 38 and 39, the drain side select transistor layer 130 includes a drain side conductive layer 131. The drain side conductive layer 131 functions as the drain side select gate line SGDe and as a gate of the drain side select transistor SDTre. The drain side conductive layer 131 is formed in stripes extending in the row direction and having a certain pitch in the column direction. The drain side conductive layer 131 is constituted by polysilicon (poly-Si).

As shown in FIG. 39, the drain side select transistor layer 130 includes a drain side hole 132 formed so as to penetrate the drain side conductive layer 131. The drain side hole 132 is disposed in a matrix in the row direction and the column direction and formed at a position aligning with the memory hole 122.

As shown in FIG. 39, the drain side select transistor layer 130 includes a drain side gate insulating layer 133 and a drain side columnar semiconductor layer 134 within the drain side hole 132. The drain side columnar semiconductor layer 134 functions as a body of the drain side select transistor SDTre.

The drain side gate insulating layer 133 is formed with a certain thickness in a side surface of the drain side hole 132. The drain side gate insulating layer 133 is constituted by silicon oxide ($SiO_2$). The drain side columnar semiconductor layer 134 is formed so as to fill the drain side hole 132 and so as to extend in a column shape in the stacking direction and to be in contact with the drain side gate insulating layer 133. The drain side columnar semiconductor layer 134 is formed having its upper surface in contact with a lower surface of the second wiring layer 52. The drain side columnar semiconductor layer 134 is constituted by polysilicon (poly-Si).

Note that, expressing the above-described configuration in other words, the drain side columnar semiconductor layer 134 is formed so as to be surrounded by the drain side gate insulating layer 133, and the drain side gate insulating layer 133 is formed so as to be surrounded by the drain side conductive layer 131.

[Advantages of the Nonvolatile Semiconductor Memory Device in Accordance with the Nineteenth Embodiment]

The nonvolatile semiconductor memory device in accordance with the nineteenth embodiment displays similar advantages to the first embodiment.

[Twentieth Embodiment]

[Configuration of a Nonvolatile Semiconductor Memory Device in Accordance with a Twentieth Embodiment]

Next, a configuration of a nonvolatile semiconductor memory device in accordance with a twentieth embodiment is described with reference to FIGS. 40 and 41. The twentieth embodiment has features in peripheral circuits (transfer circuits 18a and 18b to be described hereafter) of the memory block MB and the switch circuit SWa. In the above-described first through nineteenth embodiments, the word lines WL1-WL8, the back gate line BG, the drain side select gate line SGD, and the source side select gate line SGS are configured continuously without division within a single memory block MB. In contrast, in the twentieth embodiment, the word lines WL1-WL8, the back gate line BG, the drain side select gate line SGD, and the source side select gate line SGS are provided separately for each of a plurality of certain regions (blocks) within the single memory block MB.

Figure 40:
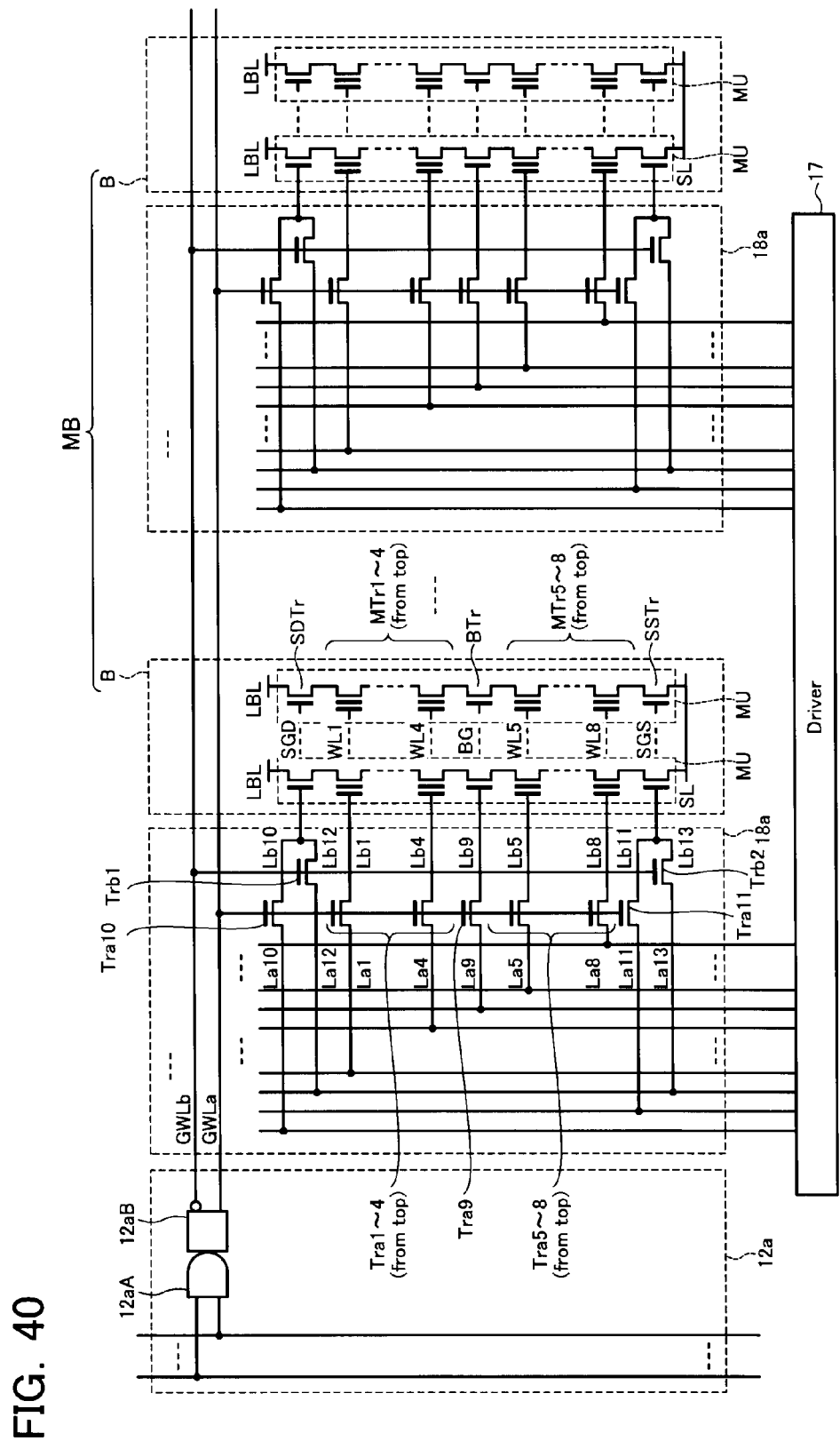
FIG. 40 is an equivalent circuit diagram of a nonvolatile semiconductor memory device in accordance with a twentieth embodiment.
Figure 41:
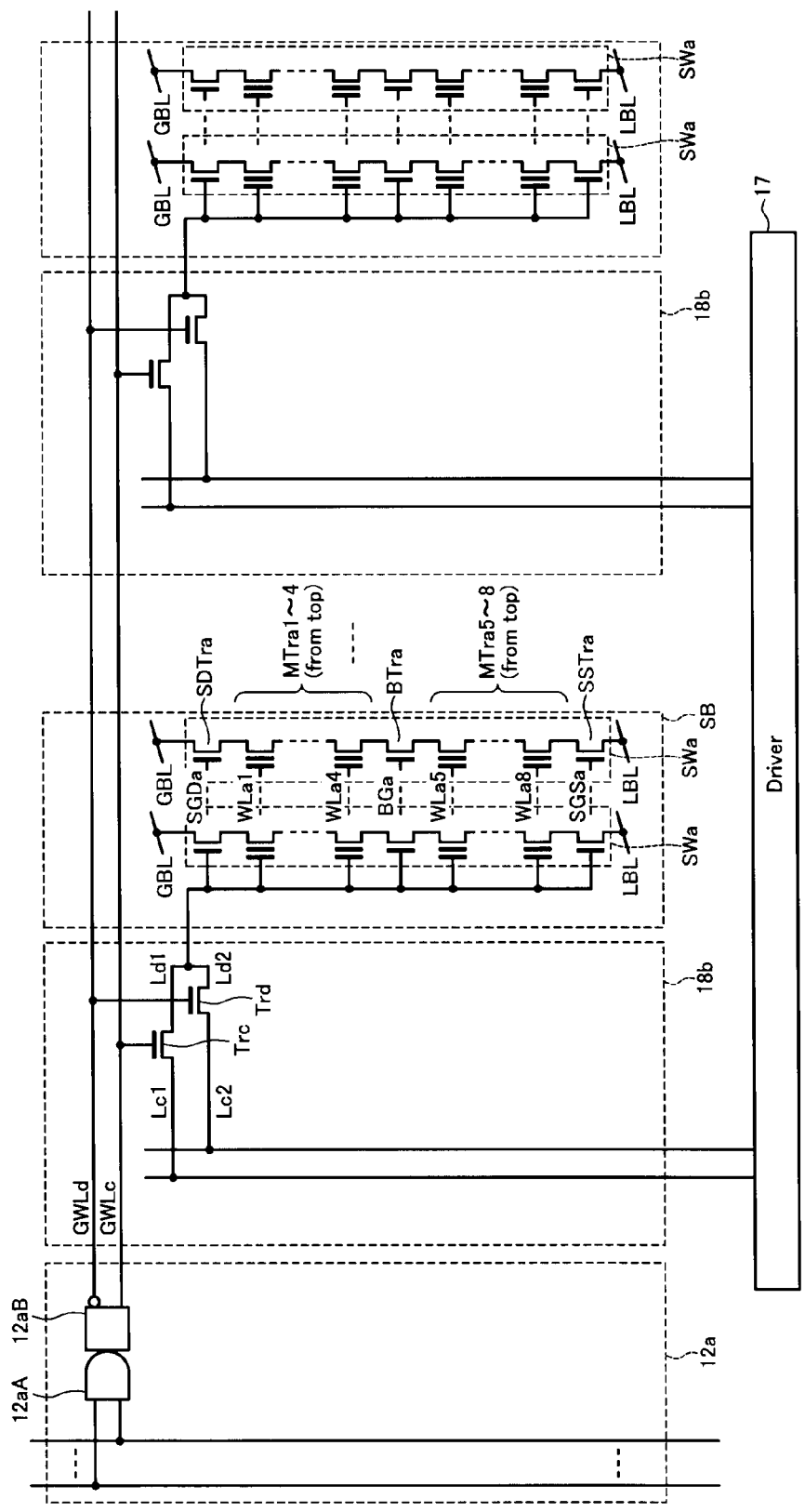
FIG. 41 is an equivalent circuit diagram of the nonvolatile semiconductor memory device in accordance with the twentieth embodiment.

FIGS. 40 and 41 are circuit diagrams of the nonvolatile semiconductor memory device in accordance with the twentieth embodiment. FIG. 40 shows the relationship between the memory block MB and its peripheral circuits, and FIG. 41 shows the relationship between the switch circuit SWa and its peripheral circuits. Note that in the twentieth embodiment, identical symbols are assigned to configurations similar to those in the first through nineteenth embodiments and descriptions thereof are omitted.

First, the relationship between the memory block MB and its peripheral circuits is described with reference to FIG. 40. As shown in FIG. 40, the nonvolatile semiconductor memory device in accordance with the twentieth embodiment includes the memory block MB, global word lines GWLa and GWLb, a row decoder 12a, a driver 17, and a transfer circuit 18a.

The memory block MB has a configuration substantially similar to that of the fourth embodiment, and the like, and includes a plurality of memory strings MS in a matrix. However, the memory block MB in the twentieth embodiment is divided into a plurality of blocks B. A plurality of memory strings MS are disposed within each of the blocks B. The word lines WL1-WL8, the back gate line BG, the drain side select gate line SGD, and the source side select gate line SGS are each separately provided for each of the blocks B. Accordingly, the separately-provided word lines WL1-WL8 are provided to each block B and commonly connected to gates of a plurality of the memory transistors MTr1-MTr8, respectively. Similarly, the separately-provided back gate line BG is provided for each block B and commonly connected to a gate of a plurality of the back gate transistors BTr. The separately-provided drain side select gate line SGD is provided to each block B and commonly connected to a gate of a plurality of the drain side select transistors SDTr. The separately-provided source side select gate line SGS is provided to each block B and commonly connected to a gate of a plurality of the source side select transistors SSTr. Note that although the memory units MU are shown in FIG. 40 in a linear fashion that differs from that of FIG. 8 (fourth embodiment) and so on, they are no different in configuration to those of the fourth embodiment and so on.

As shown in FIG. 40, the global word lines GWLa and GWLb extend so as to straddle a plurality of the blocks B and transfer circuits 18a. The global word lines GWLa and GWLb are commonly connected to the plurality of transfer circuits 18a. Specifically, the global word line GWLa is connected to gates of transfer transistors Tra1-Tra11 in the plurality of transfer circuits 18a. The global word line GWLb is connected to gates of transfer transistors Trb1 and Trb2 in the plurality of transfer circuits 18a.

The row decoder 12a inputs a common control signal to the plurality of transfer circuits 18a. The row decoder 12a includes an address decoder 12aA and a level shifter 12aB. The address decoder 12aA receives an address signal from outside, converts that address signal and outputs the converted address signal to the level shifter 12aB. The level shifter 12aB outputs a voltage-level-shifted signal and an inverted signal of that voltage-level-shifted signal to the global word lines GWLa and GWLb.

The driver 17 is commonly utilized by a plurality of the memory blocks MB. The driver 17 inputs respective drive signals to the plurality of transfer circuits 18a.

A plurality of the transfer circuits 18a are provided in a direction parallel to the substrate. The transfer circuits 18a are provided to each of the blocks B. The transfer circuits 18a are respectively connected to the word lines WL1-WL8, the back gate line BG, the drain side select gate line SGD, and the source side select gate line SGS in each of the blocks B. The transfer circuits 18a are supplied with the drive signal from the driver 17 and, on the basis of control signals supplied from the global word lines GWLa and GWLb (row decoder 12a), transfer the drive signal from the driver 17 to the word lines WL1-WL8, the back gate line BG, the drain side select gate line SGD, and the source side select gate line SGS.

Each of the transfer circuits 18a includes the transfer transistors Tra1-Tra11, Trb1, and Trb2. When a block B subject to control by a transfer circuit 18a is selected, the transfer transistors Tra1-Tra11 of that transfer circuit 18a become conductive. In contrast, when a block B subject to control by a transfer circuit 18a is unselected, the transfer transistors Trb1 and Trb2 of that transfer circuit 18a become conductive.

Drains of the transfer transistors Tra1-Tra11, Trb1, and Trb2 are respectively connected via lines La1-La13 to output terminals of the driver 17.

Gates of the transfer transistors Tra1-Tra11 are commonly connected to the single global word line GWLa. Sources of the transfer transistors Tra1-Tra8 are respectively connected via lines Lb1-Lb8 to the word lines WL1-WL8. A source of the transfer transistor Tra9 is connected via line Lb9 to the back gate line BG. Sources of the transfer transistors Tra10 and Tra11 are respectively connected via lines Lb10 and Lb11 to the drain side select gate line SGD, and the source side select gate line SGS.

Gates of the transfer transistors Trb1 and Trb2 are commonly connected to the single global word line GWLb. Sources of transfer transistors Trb1 and Trb2 are respectively connected via lines Lb12 and Lb13 to the drain side select gate line SGD, and the source side select gate line SGS.

Next, the relationship between the switch circuit SWa and its peripheral circuits is described with reference to FIG. 41. As shown in FIG. 41, the nonvolatile semiconductor memory device in accordance with the twentieth embodiment includes a switch block SB, global word lines GWLc and GWLd, the row decoder 12a, the driver 17, and a transfer circuit 18b.

A plurality of the switch blocks SB are provided in a direction parallel to the substrate. Each of the switch blocks SB includes a plurality of the switch circuits SWa. Each of the switch circuits SWa has a configuration substantially similar to that of the fourth embodiment and so on. The word lines WLa1-WLa8, the back gate line BGa, the drain side select gate line SGDa, and the source side select gate line SGSa are each separately provided to each of the switch blocks SB. The separately-provided word lines WLa1-WLa8 are provided to each switch block SB and commonly connected to gates of a plurality of the memory transistors MTra1-MTra8. Similarly, the separately-provided back gate line BGa is provided to each switch block SB and commonly connected to a gate of a plurality of the back gate transistors BTra. The separately-provided drain side select gate line SGDa is provided to each block B and commonly connected to a gate of a plurality of the drain side select transistors SDTra. The separately-provided source side select gate line SGSa is provided to each block B and commonly connected to a gate of a plurality of the source side select transistors SSTra. Note that although the switch circuits SWa are shown in FIG. 41 in a linear fashion that differs from that of FIG. 8 and so on, they are no different in configuration to those of the fourth embodiment and so on.

The global word lines GWLc and GWLd extend so as to straddle a plurality of the switch blocks SB and transfer circuits 18b. The global word lines GWLc and GWLd are commonly connected to the plurality of transfer circuits 18b. Specifically, a gate of a transfer transistor Trc in the plurality of transfer circuits 18b is connected to the global word line GWLc. A gate of a transfer transistor Trd in the plurality of transfer circuits 18b is connected to the global word line GWLd.

The row decoder 12a inputs a common control signal to the plurality of transfer circuits 18b, in addition to the above-mentioned control of the transfer circuit 18a.

The driver 17 is commonly utilized by a plurality of the switch blocks SB. The driver 17 inputs respective drive signals to the plurality of transfer circuits 18b, in addition to the above-mentioned input of drive signals to the transfer circuit 18a.

A plurality of the transfer circuits 18b are provided in a direction parallel to the substrate. The transfer circuits 18b are provided to each of the switch blocks SB. The transfer circuits 18b are respectively connected to the word lines WLa1-WLa8, the back gate line BGa, the drain side select gate line SGDa, and the source side select gate line SGSa in each of the switch blocks SB. The transfer circuits 18b are supplied with the drive signal from the driver 17 and, on the basis of control signals from the global word lines GWLc and GWLd (row decoder 12a), transfer the drive signal from the driver 17 to the word lines WLa1-WLa8, the back gate line BGa, the source side select gate line SGSa, and the drain side select gate line SGDa.

Each of the transfer circuits 18b includes the transfer transistors Trc and Trd. When a switch block SB subject to control by a transfer circuit 18b is selected, the transfer transistor Trc of that transfer circuit 18b becomes conductive. In contrast, when a switch block SB subject to control by a transfer circuit 18b is unselected, the transfer transistor Trd of that transfer circuit 18b becomes conductive.

Drains of the transfer transistors Trc and Trd are respectively connected via lines Lc1 and Lc2 to output terminals of the driver 17. A gate of the transfer transistor Trc is connected to the global word line GWLc. A source of the transfer transistor Trc is connected via line Ld1 to the word lines WLa1-WLa8, the back gate line BGa, and the select gate lines SGDa and SGSa. A gate of the transfer transistor Trd is connected to the global word line GWLd. A source of the transfer transistor Trd is connected via line Ld2 to the word lines WLa1-WLa8, the back gate line BGa, and the select gate lines SGDa and SGSa.

Figure 42:
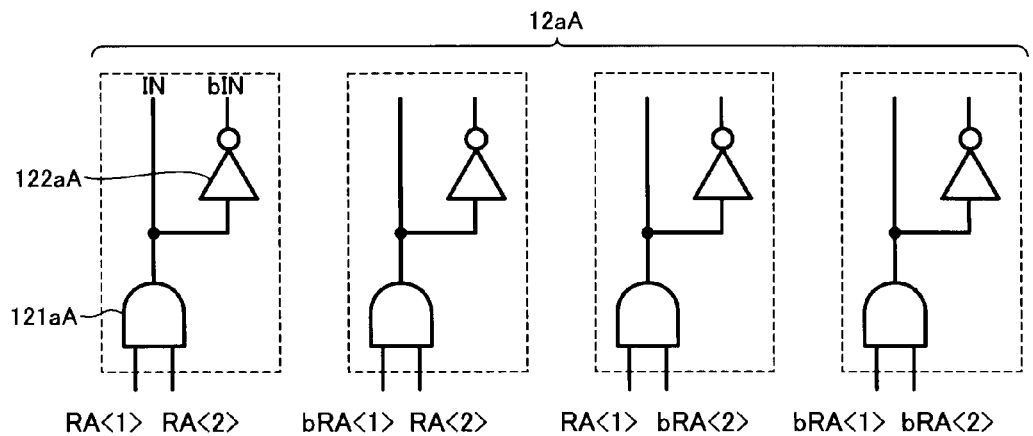
FIG. 42 is a circuit diagram showing an address decoder 12aA of FIGS. 40 and 41.

Next, a specific configuration of the address decoder 12aA included in the row decoder 12a is described with reference to FIG. 42. As shown in FIG. 42, the address decoder 12aA includes an AND circuit 121aA and a NOT circuit 122aA. The two input terminals of the AND circuit 121aA receive a signal RA (RA<1>, bRA<1>, RA<2>, and bRA<2>) from outside and output a signal IN. The NOT circuit 122aA receives the signal IN and outputs an inverted signal bIN which is the signal IN inverted.

A first AND circuit 121aA receives the signal RA<1> at one of its input terminals and receives the signal RA<2> at the other of its input terminals. A second AND circuit 121aA receives the signal bRA<1> at one of its input terminals and receives the signal RA<2> at the other of its input terminals. A third AND circuit 121aA receives the signal RA<1> at one of its input terminals and receives the signal bRA<2> at the other of its input terminals. A fourth AND circuit 121aA receives the signal bRA<1> at one of its input terminals and receives the signal bRA<2> at the other of its input terminals.

Figure 43:
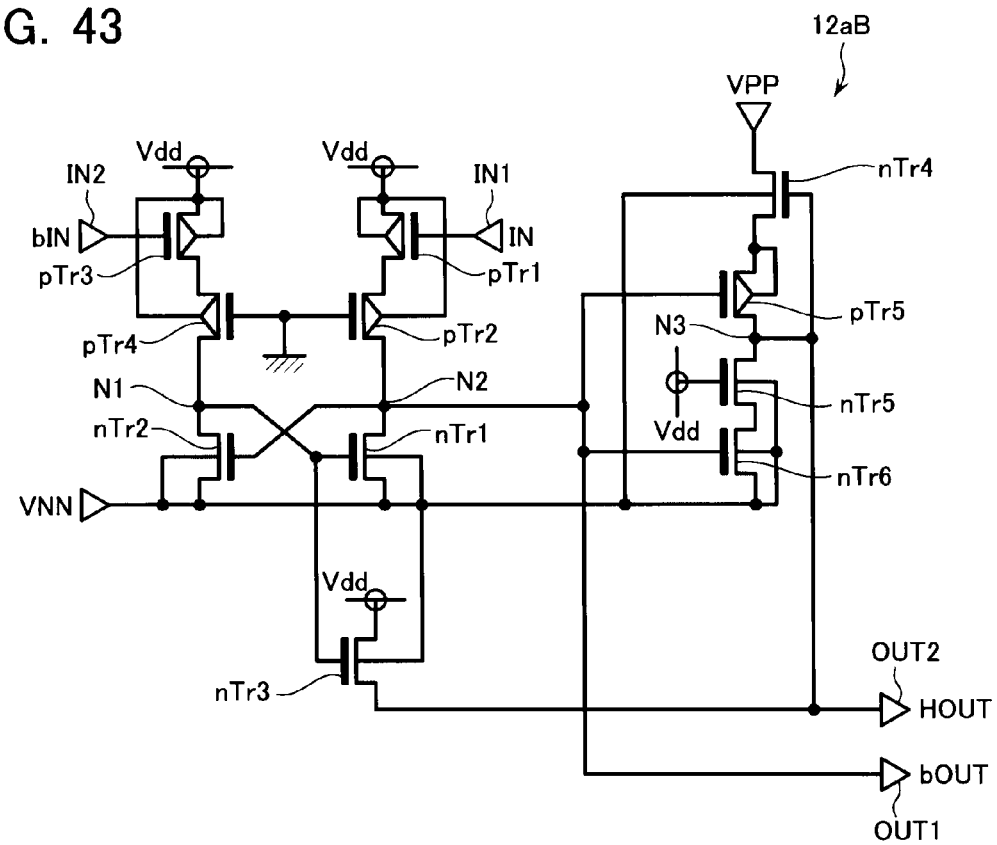
FIG. 43 is a circuit diagram showing a level shifter 12aB of FIGS. 40 and 41.

Next, a specific configuration of the level shifter 12aB is described with reference to FIG. 43. As shown in FIG. 43, the level shifter 12aB receives as input at its input terminals IN1 and IN2 the signals IN and bIN from the address decoder 12aA, and outputs from its output terminals OUT1 and OUT2 a signal bOUT and a signal HOUT. When the signal IN="1" and the signal bIN="0", the signal bOUT has a voltage VNN and the signal HOUT has a voltage VPP. Further, when the signal IN="0" and the signal bIN="1", the signal bOUT has a voltage Vdd and the signal HOUT has a voltage VNN. Here, the voltage Vdd is a power supply voltage, the voltage VNN is a voltage lower than the voltage Vdd (for example, a negative voltage), and the voltage VPP is a voltage higher than the voltage Vdd.

As shown in FIG. 43, the level shifter 12aB includes PMOS transistors pTr1-pTr5 and NMOS transistors nTr1-nTr6.

The PMOS transistors pTr1 and pTr2, and the NMOS transistor nTr1 are connected in series, the PMOS transistor pTr1 having its source applied with the power supply voltage Vdd and the NMOS transistor nTr1 having its source applied with the voltage VNN. Similarly, the PMOS transistors pTr3 and pTr4, and the NMOS transistor nTr2 are connected in series, the PMOS transistor pTr3 having its source applied with the power supply voltage Vdd and the NMOS transistor nTr2 having its source applied with the voltage VNN.

In addition, a gate of the PMOS transistor pTr1 receives the signal IN, and a gate of the PMOS transistor pTr3 receives the signal bIN. A gate of the PMOS transistor pTr2 and a gate of the PMOS transistor pTr4 are grounded. A gate of the NMOS transistor nTr1 is connected to a node N1 between the PMOS transistor pTr4 and the NMOS transistor nTr2, and a gate of the NMOS transistor nTr2 is connected to a node N2 between the PMOS transistor pTr2 and the NMOS transistor nTr1. Note that the node N2 is connected to the output terminal OUT1.

The NMOS transistor nTr3 has its drain connected to the power supply voltage Vdd and its source connected to the output terminal OUT2. Moreover, the NMOS transistor nTr3 has its gate connected to the gate of the NMOS transistor nTr1 (node N1).

The NMOS transistor nTr4, the PMOS transistor pTr5, and the NMOS transistors nTr5 and nTr6 are connected in series, the NMOS transistor nTr4 having its drain applied with the voltage VPP and the NMOS transistor nTr6 having its source applied with the voltage VNN.

In addition, a gate of the NMOS transistor nTr4 and a node N3 between the PMOS transistor pTr5 and the NMOS transistor nTr5 are connected to the output terminal OUT2. A gate of the PMOS transistor pTr5 and a gate of the NMOS transistor nTr6 are connected to the node N2. A gate of the NMOS transistor nTr5 is applied with the power supply voltage Vdd.

Figure 44:
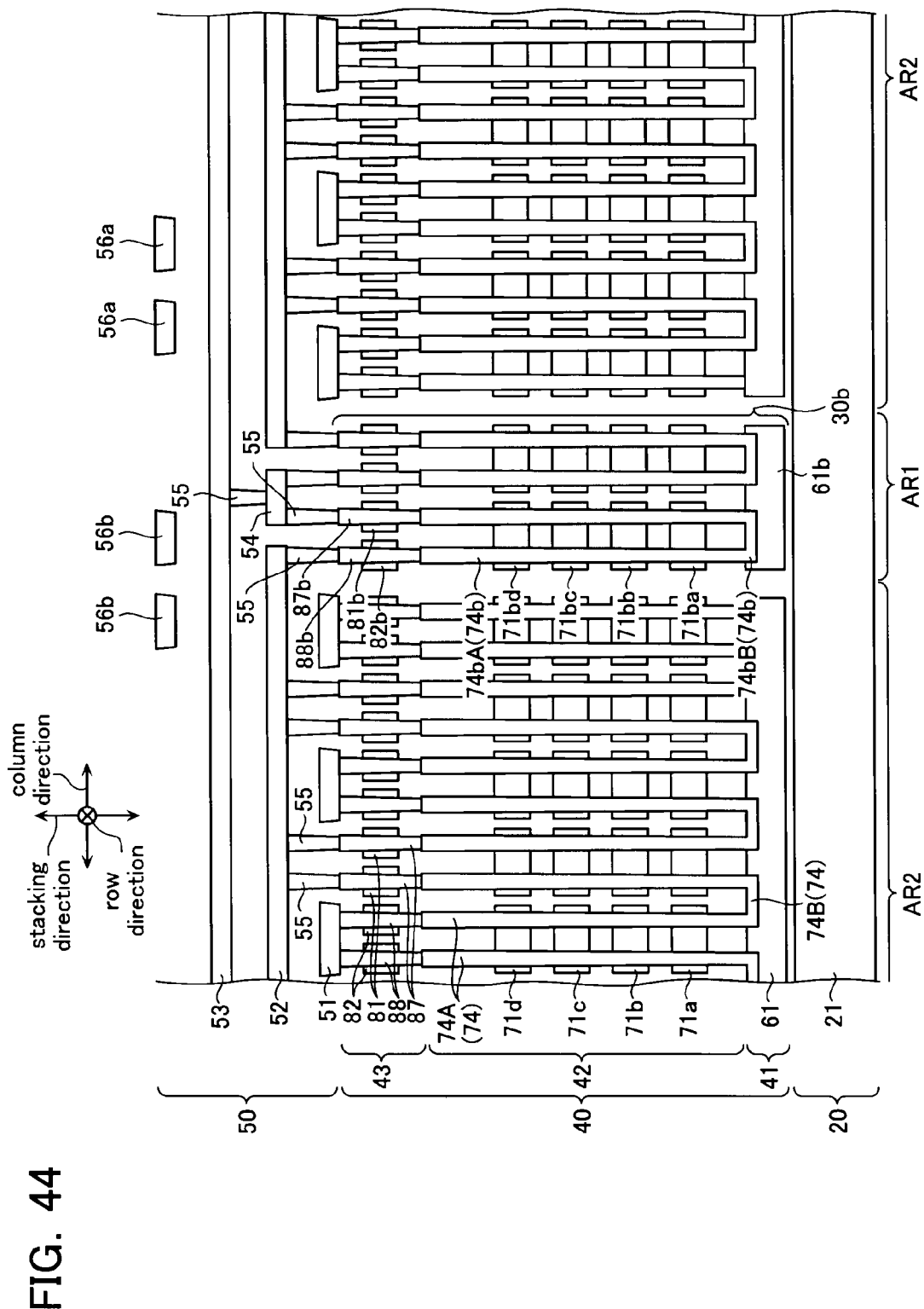
FIG. 44 is a cross-sectional view of the nonvolatile semiconductor memory device in accordance with the twentieth embodiment.
Figure 45:
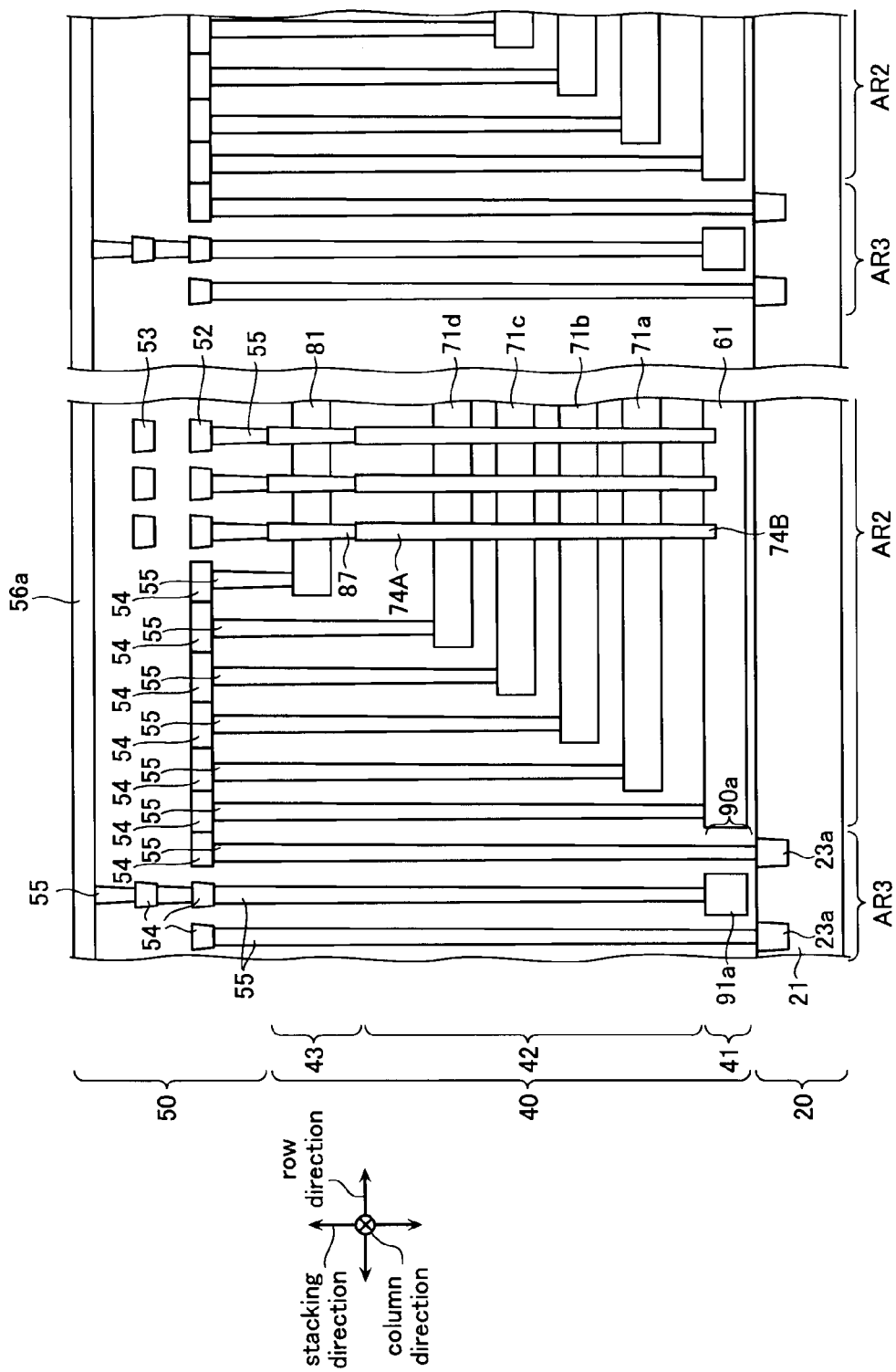
FIG. 45 is a cross-sectional view of the nonvolatile semiconductor memory device in accordance with the twentieth embodiment.
Figure 46:
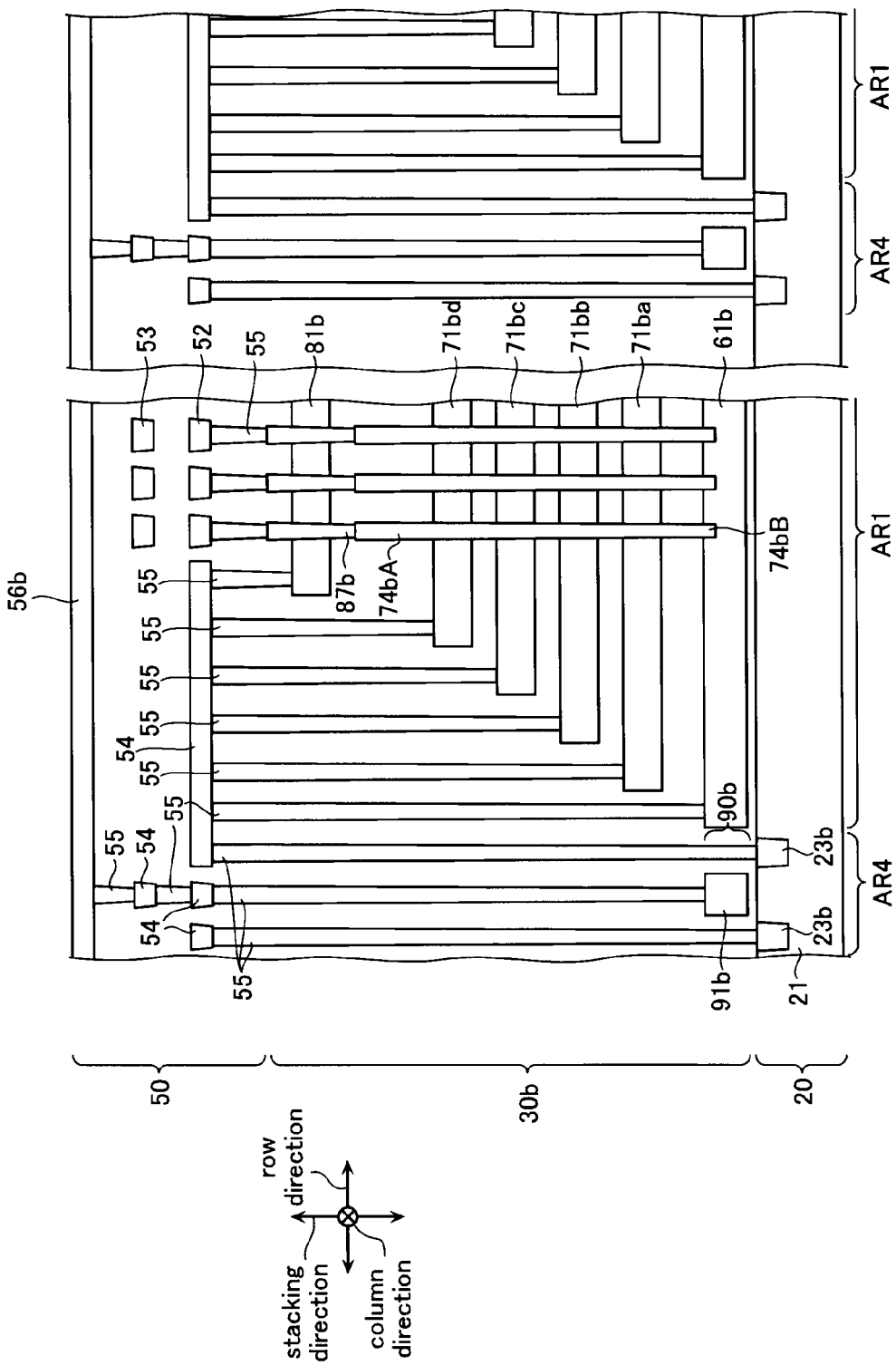
FIG. 46 is a cross-sectional view of the nonvolatile semiconductor memory device in accordance with the twentieth embodiment.

Next, a stacking structure of the nonvolatile semiconductor memory device in accordance with the twentieth embodiment is described with reference to FIGS. 44-46. FIG. 44 is a cross-sectional view in the column direction of the nonvolatile semiconductor memory device in accordance with the twentieth embodiment. FIG. 45 is a cross-sectional view in the row direction of the nonvolatile semiconductor memory device in accordance with the twentieth embodiment and shows an end portion in the row direction of the second region AR2. FIG. 46 is a cross-sectional view in the row direction of the nonvolatile semiconductor memory device in accordance with the twentieth embodiment and shows an end portion in the row direction of the first region AR1.

As shown in FIG. 44, the stacking structure of the nonvolatile semiconductor memory device in accordance with the twentieth embodiment has a configuration substantially similar to that of the fourth embodiment (FIG. 9). The twentieth embodiment differs from the fourth embodiment in having wiring layers 56a and 56b further provided. The wiring layer 56a functions as the global word lines GWLa and GWLb. The wiring layer 56b functions as the global word lines GWLc and GWLd. The wiring layers 56a and 56b are provided in a layer above the third wiring layer 53 with a certain pitch in the column direction. The wiring layers 56a and 56b are configured by, for example, a stacking structure of tungsten (W)/titanium nitride (TiN)/titanium (Ti).

Next, description proceeds with reference to FIG. 45. As shown in FIG. 45, the wiring layer 56a (global word lines GWLa and GWLb) extends in the row direction straddling a plurality of the second regions AR2.

In addition, as shown in FIG. 45, a third region AR3 is provided adjacent to the end portion in the row direction of each of the second regions AR2. The third region AR3 has the transfer circuit 18a provided therein.

A plurality of diffusion layers 23a are provided in the substrate 21 in the third region AR3. Moreover, a transfer circuit region 90a is provided above the substrate 20 in the third region AR3. The transfer circuit region 90a functions as the transfer circuit 18a.

The diffusion layer 23a is formed on an upper surface of the substrate 21 with a certain pitch in the column direction. The diffusion layer 23a is one having, for example, an impurity implanted in silicon (Si). A pair of diffusion layers 23a function as sources and drains of the transfer transistors Tra1-Tra11, Trb1 and Trb2. One of the pair of diffusion layers 23a is connected via the wiring layer 54 and the plug layer 55 to the driver 17 (not shown). That is, the wiring layer 54 and the plug layer 55 connecting the diffusion layer 23a and the driver 17 function as the lines La1-La13. In addition, the other of the pair of diffusion layers 23a is electrically connected via the wiring layer 54 and the plug layer 55 to one from among the back gate conductive layer 61, the word line conductive layers 71a-71d, the drain side conductive layer 81, and the source side conductive layer 82 (word lines WL1-WL8, back gate line BG, drain side select gate line SGD, and source side select gate line SGS), respectively (not fully shown). That is, the wiring layer 54 and the plug layer 55 connecting the diffusion layer 23a and each of the layers 61, 71a-71d, 81, and 82 function as the lines Lb1-Lb13.

The transfer circuit region 90a includes a conductive layer 91a functioning as gates of the transfer transistors Tra1-Tra11, Trb1, and Trb2. The conductive layer 91a is formed straddling the pair of diffusion layers 23a with an insulating layer (not shown) formed on the substrate 21 interposed therebetween. The conductive layer 91a is constituted by, for example, polysilicon (poly-Si). The conductive layer 91a is connected via the wiring layer 54 and the plug layer 55 to the wiring layer 56a (global word lines GWLa and GWLb).

As shown in FIG. 46, the wiring layer 56b (global word lines GWLc and GWLd) extends in the row direction straddling a plurality of the first regions AR1.

In addition, as shown in FIG. 46, a fourth region AR4 is provided adjacent to the end portion in the row direction of each of the first regions AR1. The fourth region AR4 has the transfer circuit 18b provided therein.

A plurality of diffusion layers 23b are provided in the substrate 21 in the fourth region AR4. Moreover, a transfer circuit region 90b is provided above the substrate 20 in the fourth region AR4. The transfer circuit region 90b functions as the transfer circuit 18b.

The diffusion layer 23b is formed on the upper surface of the substrate 21 with a certain pitch in the column direction. The diffusion layer 23b is one having, for example, an impurity implanted in silicon (Si), and a pair of diffusion layers 23b function as sources and drains of the transfer transistors Trc and Trd. One of the pair of diffusion layers 23b is connected via the wiring layer 54 and the plug layer 55 to the driver 17 (not shown). That is, the wiring layer 54 and the plug layer 55 connecting the diffusion layer 23b and the driver 17 function as the lines Lc1 and Lc2. In addition, the other of the pair of diffusion layers 23b is commonly connected electrically via the wiring layer 54 and the plug layer 55 to the back gate conductive layer 61b, the word line conductive layers 71ba-71bd, the drain side conductive layer 81b, and the source side conductive layer 82b (word lines WLa1-WLa8, back gate line BGa, drain side select gate line SGDa, and source side select gate line SGSa), respectively (not fully shown). That is, the wiring layer 54 and the plug layer 55 connecting the diffusion layer 23b and each of the layers 61b, 71ba-71bd, 81b, and 82b function as the lines Ld1 and Ld2.

The transfer circuit region 90b includes a conductive layer 91b functioning as gates of the transfer transistors Trc and Trd. The conductive layer 91b is formed straddling the pair of diffusion layers 23b with an insulating layer (not shown) formed on the substrate 21 interposed therebetween. The conductive layer 91b is constituted by, for example, polysilicon (poly-Si). The conductive layer 91b is connected via the wiring layer 54 and the plug layer 55 to the wiring layer 56b (global word lines GWLc and GWLd).

[Advantages of the Nonvolatile Semiconductor Memory Device in Accordance with the Twentieth Embodiment]

The nonvolatile semiconductor memory device in accordance with the twentieth embodiment displays similar advantages to the first embodiment.

In addition, the twentieth embodiment has the word lines WL1-WL8, the back gate line BG, the drain side select gate line SGD, and the source side select gate line SGS each separately provided to each of the blocks B. Further, the word lines WL1-WL8, the back gate line BG, the drain side select gate line SGD, and the source side select gate line SGS are selectively connected to the driver 17 by the plurality of transfer circuits 18a (transfer transistors Tra1-Tra11, Trb1, and Trb2). In addition, the plurality of transfer circuits 18a are controlled by the common row decoder 12a via the global word lines GWLa and GWLb. Consequently, wiring length of the word lines WL1-WL8 and so on is short and wiring resistance of those lines can be reduced in comparison with the first through nineteenth embodiments. That is, the twentieth embodiment allows suppression of delay in various operations of the memory block MB.

Furthermore, the word lines WL1-WL8, the back gate line BG, the drain side select gate line SGD, and the source side select gate line SGS are constituted by polysilicon through manufacturing processes thereof, thereby becoming high resistance. In contrast, the lines La1-La13 and Lb1-Lb13 utilized in the global word lines GWLa and GWLb and the transfer circuits 18a may be constituted by metal and so on, and thereby made low resistance. The transfer circuits 18a in the twentieth embodiment therefore allow reduction of the wiring resistance from the driver 17 to the gates of the memory transistors MTr1-MTr8, the gate of the back gate transistor BTr, the gate of the drain side select transistor SDTr, and the gate of the source side select transistor SSTr.

In addition, the twentieth embodiment has the word lines WLa1-WLa8, the back gate line BGa, the drain side select gate line SGDa, and the source side select gate line SGSa each separately provided to each of the switch blocks SB. Further, the word lines WLa1-WLa8, the back gate line BGa, the drain side select gate line SGDa, and the source side select gate line SGSa are selectively connected to the driver 17 by the plurality of transfer circuits 18b (transfer transistors Trc and Trd). In addition, the plurality of transfer circuits 18b are controlled by the common row decoder 12a via the global word lines GWLc and GWLd. Consequently, wiring length of the word lines WLa1-WLa8 and so on is short and wiring resistance of those lines can be reduced, similarly to the word lines WL1-WL8 and so on. That is, the twentieth embodiment allows suppression of delay in various operations of the switch block SB.

Furthermore, the word lines WLa1-WLa8, the back gate line BGa, the drain side select gate line SGDa, and the source side select gate line SGSa are constituted by polysilicon through manufacturing processes thereof, thereby becoming high resistance. In contrast, the lines Lc1, Lc2, Ld1, and Ld2 utilized in the global word lines GWLc and GWLd and the transfer circuits 18b may be constituted by metal and so on, and thereby made low resistance. The transfer circuits 18b in the twentieth embodiment therefore allow reduction of the wiring resistance from the driver 17 to the gates of the memory transistors MTr1a-MTr8a, the gate of the back gate transistor BTra, the gate of the drain side select transistor SDTra, and the gate of the source side select transistor SSTra.

[Twenty-First Embodiment]

[Configuration of a Nonvolatile Semiconductor Memory Device in Accordance with a Twenty-First Embodiment]

Figure 47:
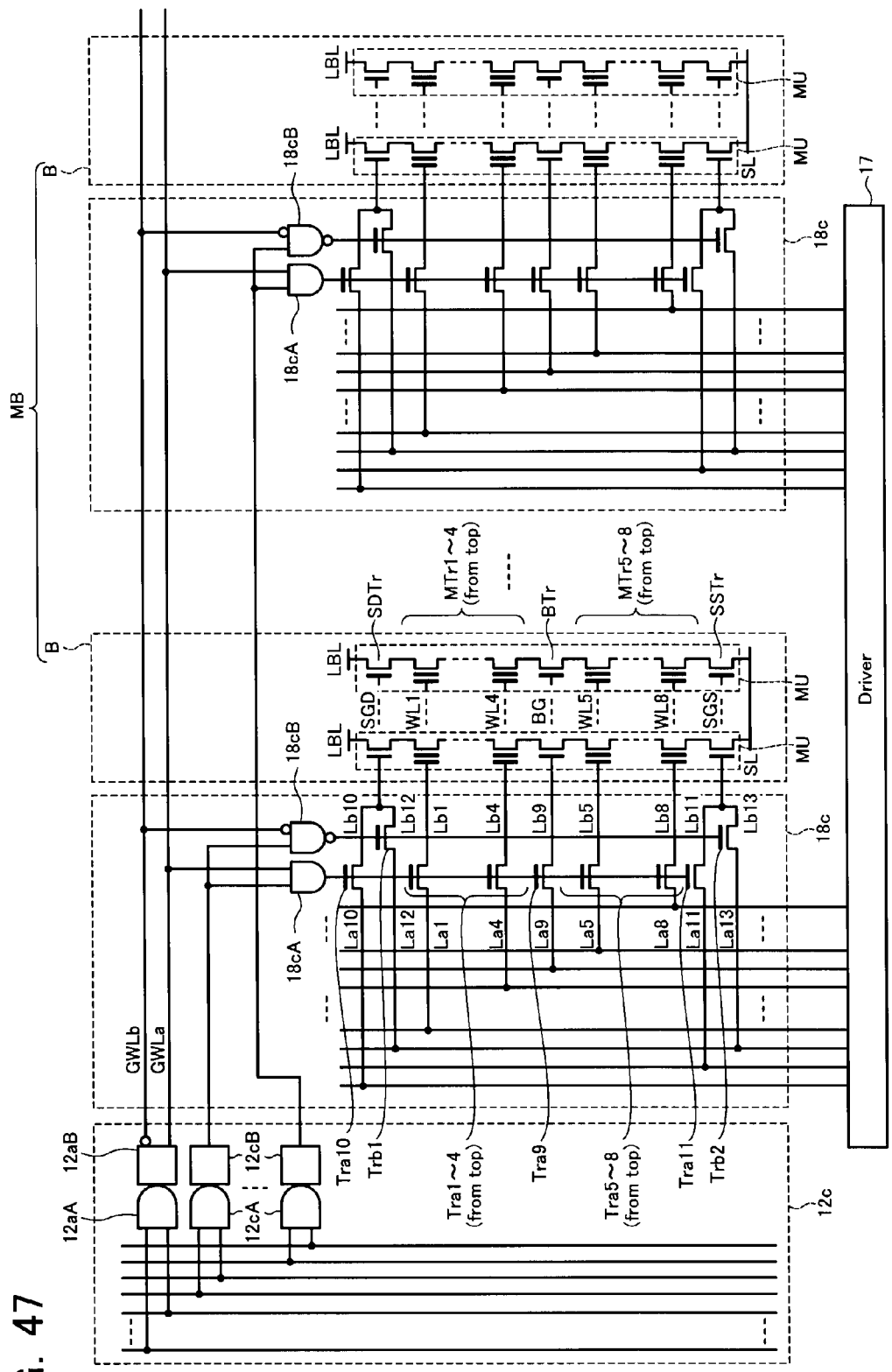
FIG. 47 is an equivalent circuit diagram of a nonvolatile semiconductor memory device in accordance with a twenty-first embodiment.
Figure 48:
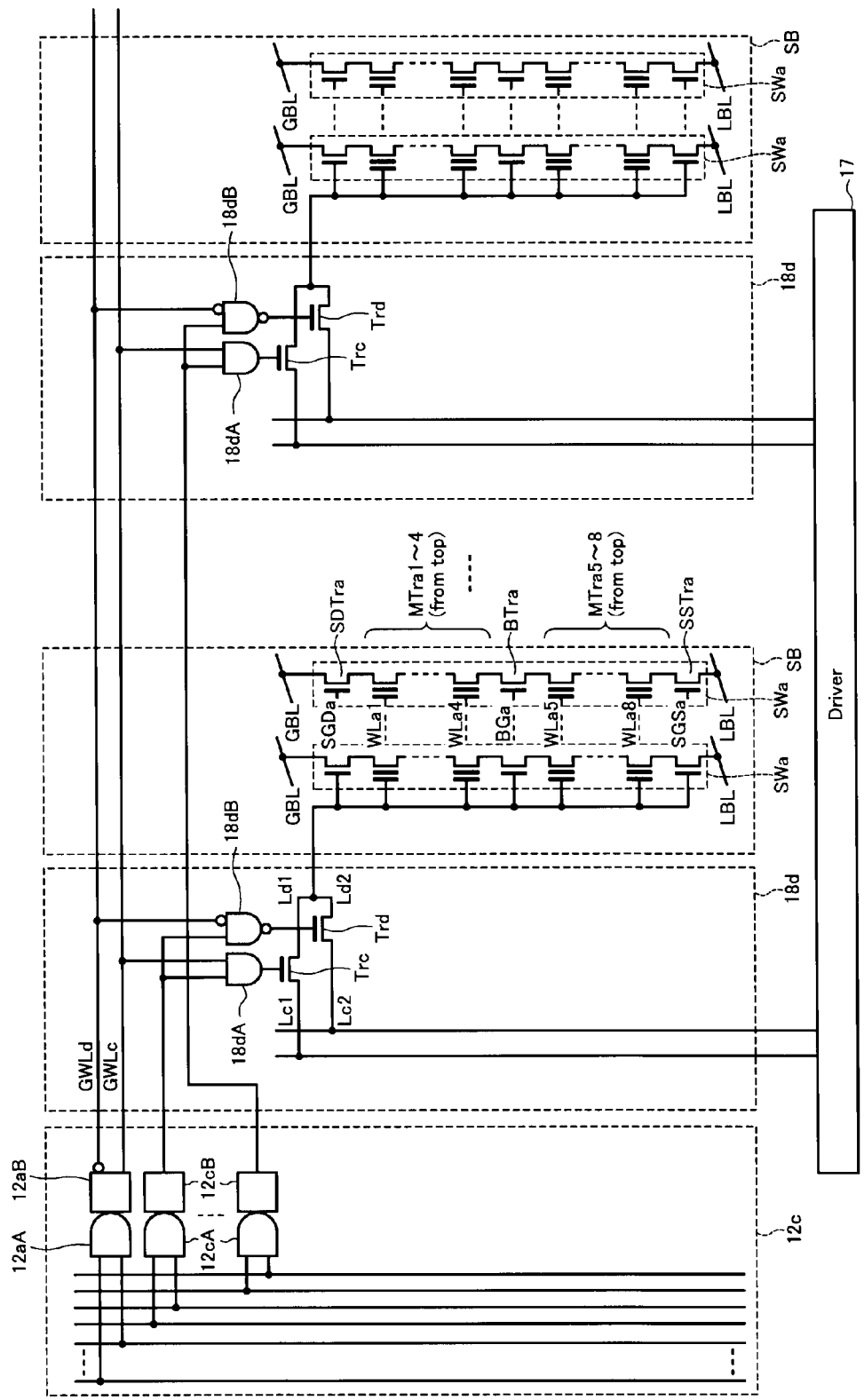
FIG. 48 is an equivalent circuit diagram of the nonvolatile semiconductor memory device in accordance with the twenty-first embodiment.

Next, a configuration of a nonvolatile semiconductor memory device in accordance with a twenty-first embodiment is described with reference to FIGS. 47 and 48. The twenty-first embodiment differs from the twentieth embodiment in having a plurality of transfer circuits 18c and 18d that are each independently controlled. FIGS. 47 and 48 are circuit diagrams of the nonvolatile semiconductor memory device in accordance with the twenty-first embodiment. FIG. 47 shows the relationship between the memory block MB and its peripheral circuits, and FIG. 48 shows the relationship between the switch circuit SWa and its peripheral circuits. Note that in the twenty-first embodiment, identical symbols are assigned to configurations similar to those in the first through twentieth embodiments and descriptions thereof are omitted.

First, the relationship between the memory block MB and its peripheral circuits is described with reference to FIG. 47. As shown in FIG. 47, the nonvolatile semiconductor memory device in accordance with the twenty-first embodiment includes a row decoder 12c and a transfer circuit 18c that differ from those of the twentieth embodiment.

The row decoder 12c inputs an independent control signal to each of a plurality of transfer circuits 18c. The row decoder 12c includes a plurality of address decoders 12cA and a plurality of level shifters 12cB in addition to the configuration of the twentieth embodiment. One each of the address decoders 12cA and the level shifters 12cB are provided to each one of the transfer circuits 18c. The address decoder 12cA receives an address signal from outside, converts that address signal and outputs the converted address signal to the level shifter 12cB. The level shifter 12cB outputs a voltage-level-shifted signal to one transfer circuit 18c.

The transfer circuit 18c includes an AND circuit 18cA and a NAND circuit 18cB in addition to the configuration of the twentieth embodiment. The AND circuit 18cA receives a signal from the global word line GWLa at one of its input terminals and receives a signal from the level shifter 12cB at the other of its input terminals. An output terminal of the AND circuit 18cA is connected to gates of the transfer transistors Tra1-Tra11. The NAND circuit 18cB receives an inverted signal of a signal from the global word line GWLb at one of its input terminals and receives a signal from the level shifter 12cB at the other of its input terminals. An output terminal of the NAND circuit 18cB is connected to gates of the transfer transistors Trb1 and Trb2.

Next, the relationship between the switch circuit SWa and its peripheral circuits is described with reference to FIG. 48. As shown in FIG. 48, the nonvolatile semiconductor memory device in accordance with the twenty-first embodiment includes the row decoder 12c and a transfer circuit 18d that differ from those of the twentieth embodiment.

The row decoder 12c inputs an independent control signal to each of a plurality of transfer circuits 18d, in addition to the above-mentioned control of the transfer circuit 18c. One each of the address decoders 12cA and the level shifters 12cB are provided to each one of the transfer circuits 18d. The level shifter 12cB outputs a voltage-level-shifted signal to one transfer circuit 18d.

The transfer circuit 18d includes an AND circuit 18dA and a NAND circuit 18 dB in addition to the configuration of the twentieth embodiment. The AND circuit 18dA receives a signal from the global word line GWLc at one of its input terminals and receives a signal from the level shifter 12cB at the other of its input terminals. An output terminal of the AND circuit 18dA is connected to a gate of the transfer transistor Trc. The NAND circuit 18 dB receives an inverted signal of a signal from the global word line GWLd at one of its input terminals and receives a signal from the level shifter 12cB at the other of its input terminals. An output terminal of the NAND circuit 18 dB is connected to a gate of the transfer transistor Trd.

[Advantages of the Nonvolatile Semiconductor Memory Device in Accordance with the Twenty-First Embodiment]

In the nonvolatile semiconductor memory device in accordance with the twenty-first embodiment, the row decoders 12c and 12d, and the transfer circuits 18c and 18d allow the driver 17 to be selectively connected only to the various lines included in a specific block B and switch block SB. The twenty-first embodiment can therefore reduce the time required for write back necessary in the twentieth embodiment.

[Twenty-Second Embodiment]
[Configuration of a Nonvolatile Semiconductor Memory Device in Accordance with a Twenty-Second Embodiment]

Figure 49:
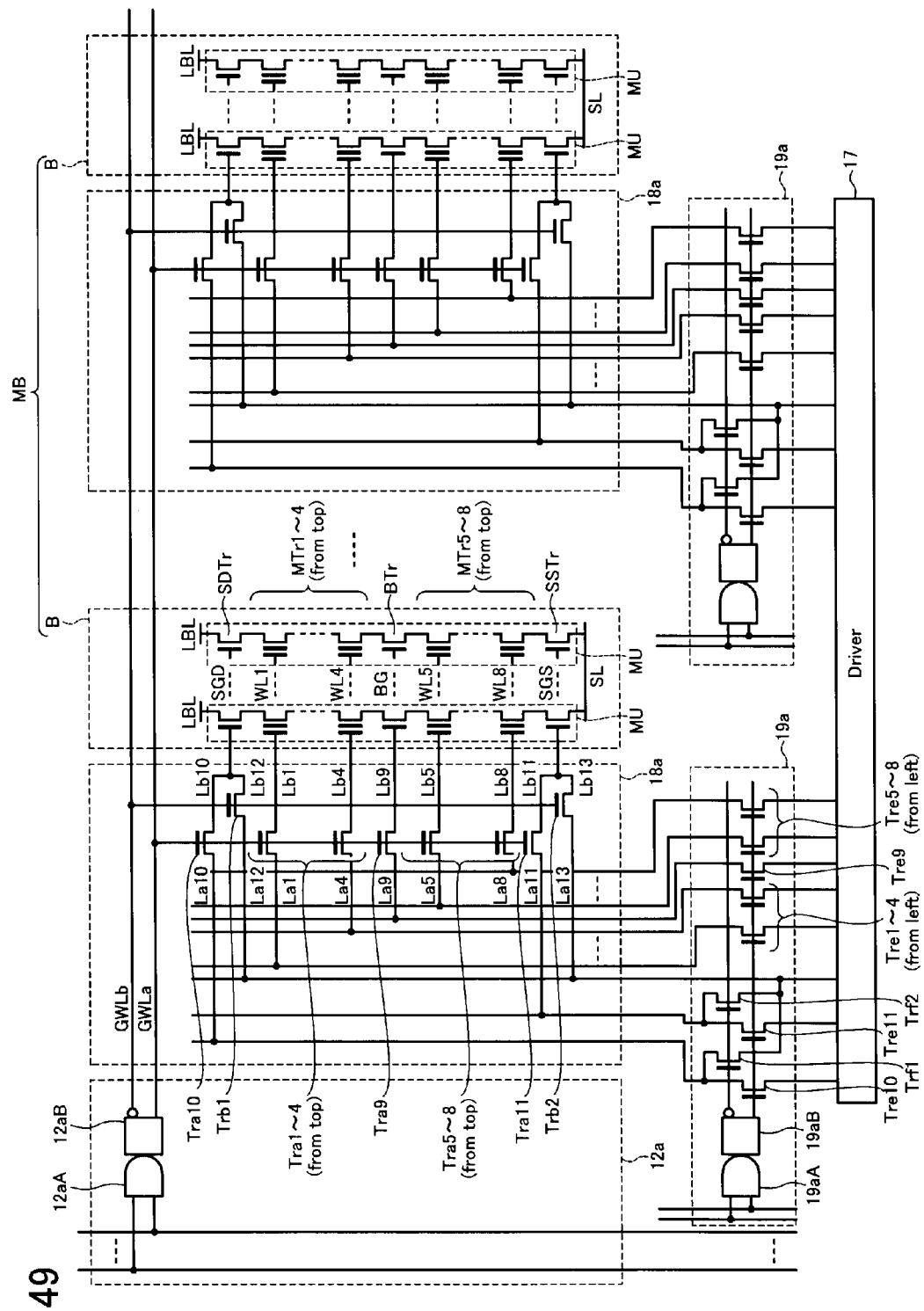
FIG. 49 is an equivalent circuit diagram of a nonvolatile semiconductor memory device in accordance with a twenty-second embodiment.
Figure 50:
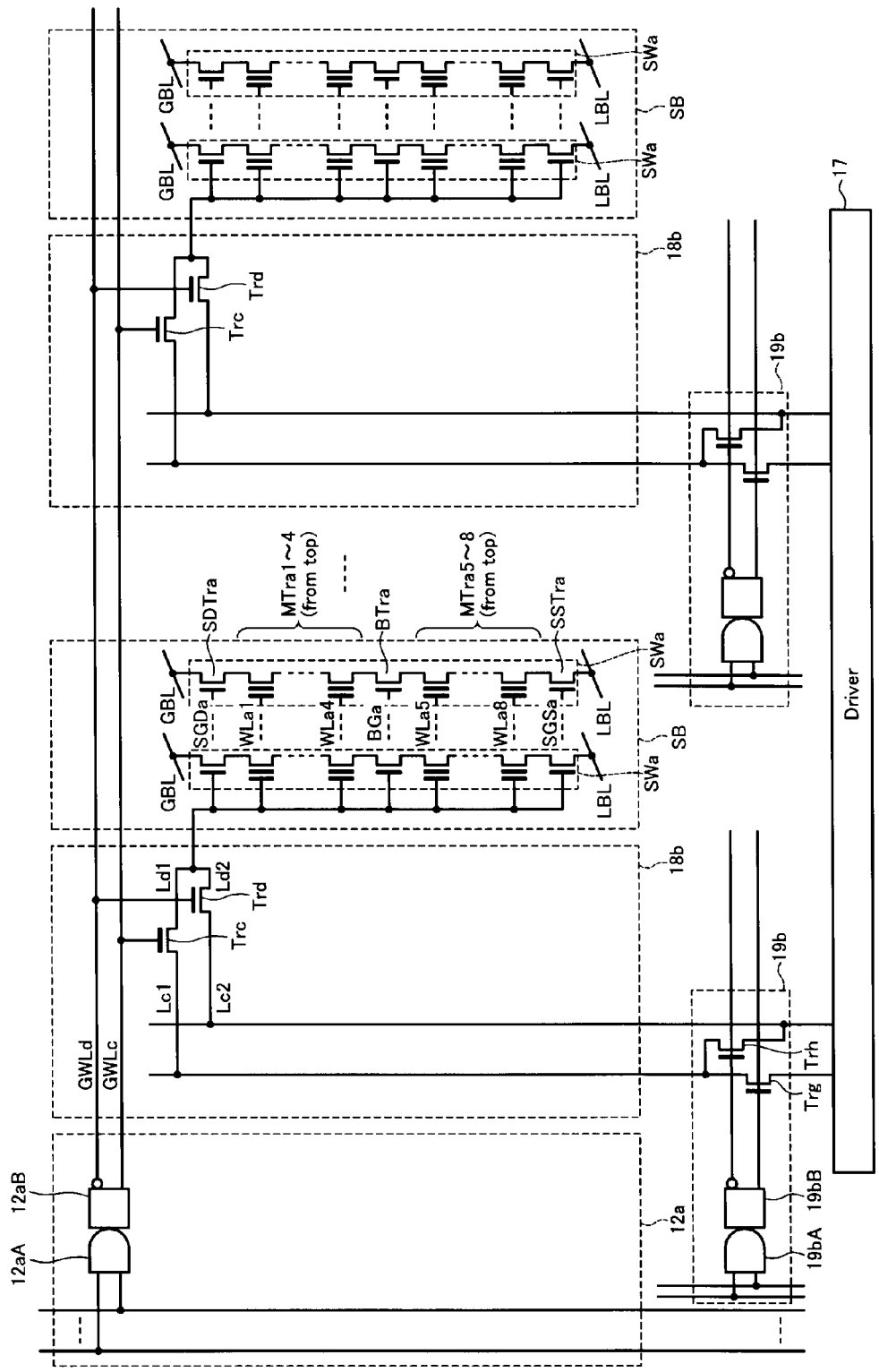
FIG. 50 is an equivalent circuit diagram of the nonvolatile semiconductor memory device in accordance with the twenty-second embodiment.

Next, a configuration of a nonvolatile semiconductor memory device in accordance with a twenty-second embodiment is described with reference to FIGS. 49 and 50. The twenty-second embodiment is similar to the twenty-first embodiment in having the plurality of transfer circuits 18c and 18d each independently controlled. However, the twenty-second embodiment differs from the twenty-first embodiment in realizing the above-described control by adding select circuits 19a and 19b to the row decoder 12a and transfer circuits 18a and 18b similar to those of the twentieth embodiment. FIGS. 49 and 50 are circuit diagrams of the nonvolatile semiconductor memory device in accordance with the twenty-second embodiment. FIG. 49 shows the relationship between the memory block MB and its peripheral circuits, and FIG. 50 shows the relationship between the switch circuit SWa and its peripheral circuits. Note that in the twenty-second embodiment, identical symbols are assigned to configurations similar to those in the first through twenty-first embodiments and descriptions thereof are omitted.

First, the relationship between the memory block MB and its peripheral circuits is described with reference to FIG. 49. As shown in FIG. 49, the nonvolatile semiconductor memory device in accordance with the twenty-second embodiment includes a plurality of select circuits 19a in addition to the configuration of the twentieth embodiment. The select circuit 19a is positioned apart from the memory block MB in the vicinity of the driver 17.

One select circuit 19a is provided to one transfer circuit 18a. That is, only the same number of select circuits 19a are required as there are memory blocks MB controlled by the pair of global word lines GWLa and GWLb. The select circuit 19a selectively inputs the drive signal from the driver 17 to the transfer circuit 18a. The select circuit 19a includes an address decoder 19aA, a level shifter 19aB, and transfer transistors Tre1-Tre11, Trf1, and Trf2.

The address decoder 19aA receives a signal from outside, converts that signal and outputs the converted signal to the level shifter 19aB. The level shifter 19aB outputs a voltage-level-shifted signal and its inverted signal to gates of the transfer transistors Tre1-Tre11, and Trf1 and Trf2.

When a block B subject to control by a transfer circuit 18a is selected, the transfer transistors Tre1-Tre11 become conductive. In contrast, when a block B subject to control by a transfer circuit 18a is unselected, the transfer transistors Trf1 and Trf2 become conductive.

The transfer transistors Tre1-Tre11, Trf1, and Trf2 have their drains connected to output terminals of the driver 17 and their sources connected, respectively, via the lines La1-La13 to drains of the transfer transistors Tra1-Tra11, Trb1, and Trb2. Gates of the transfer transistors Tre1-Tre11 receive the signal from the level shifter 19aB. Gates of the transfer transistors Trf1 and Trf2 receive the inverted signal from the level shifter 19aB.

Next, the relationship between the switch circuit SWa and its peripheral circuits is described with reference to FIG. 50. As shown in FIG. 50, the nonvolatile semiconductor memory device in accordance with the twenty-second embodiment includes a plurality of select circuits 19b in addition to the configuration of the twentieth embodiment. The select circuit 19b is positioned apart from the switch block SB in the vicinity of the driver 17.

One select circuit 19b is provided to one transfer circuit 18b. The required number of the select circuit 19b is equal to the number of switch blocks SB controlled by the pair of global word lines GWLc and GWLd. The select circuit 19b selectively inputs the drive signal from the driver 17 to the transfer circuit 18b. The select circuit 19b includes an address decoder 19bA, a level shifter 19bB, and transfer transistors Trg and Trh.

The address decoder 19bA receives a signal from outside, converts that signal and outputs the converted signal to the level shifter 19bB. The level shifter 19bB outputs a voltage-level-shifted signal and its inverted signal to gates of the transfer transistors Trg and Trh.

When a switch block SB subject to control by a transfer circuit 18b is selected, the transfer transistor Trg becomes conductive. In contrast, when a switch block SB subject to control by a transfer circuit 18b is unselected, the transfer transistor Trh becomes conductive.

The transfer transistors Trg and Trh have their drains connected to output terminals of the driver 17 and their sources connected, respectively, via the lines Lc1 and Lc2 to drains of the transfer transistors Trc and Trd. A gate of the transfer transistor Trg receives the signal from the level shifter 19bB. A gate of the transfer transistor Trh receives the inverted signal from the level shifter 19bB.

[Advantages of the Nonvolatile Semiconductor Memory Device in Accordance with the Twenty-Second Embodiment]

The nonvolatile semiconductor memory device in accordance with the twenty-second embodiment includes the row decoder 12a, the transfer circuits 18a and 18b, and the select circuits 19a and 19b, and thereby displays similar advantages to the twenty-first embodiment.

[Twenty-Third Embodiment]

[Configuration of a Nonvolatile Semiconductor Memory Device in Accordance with a Twenty-Third Embodiment]

Figure 51:
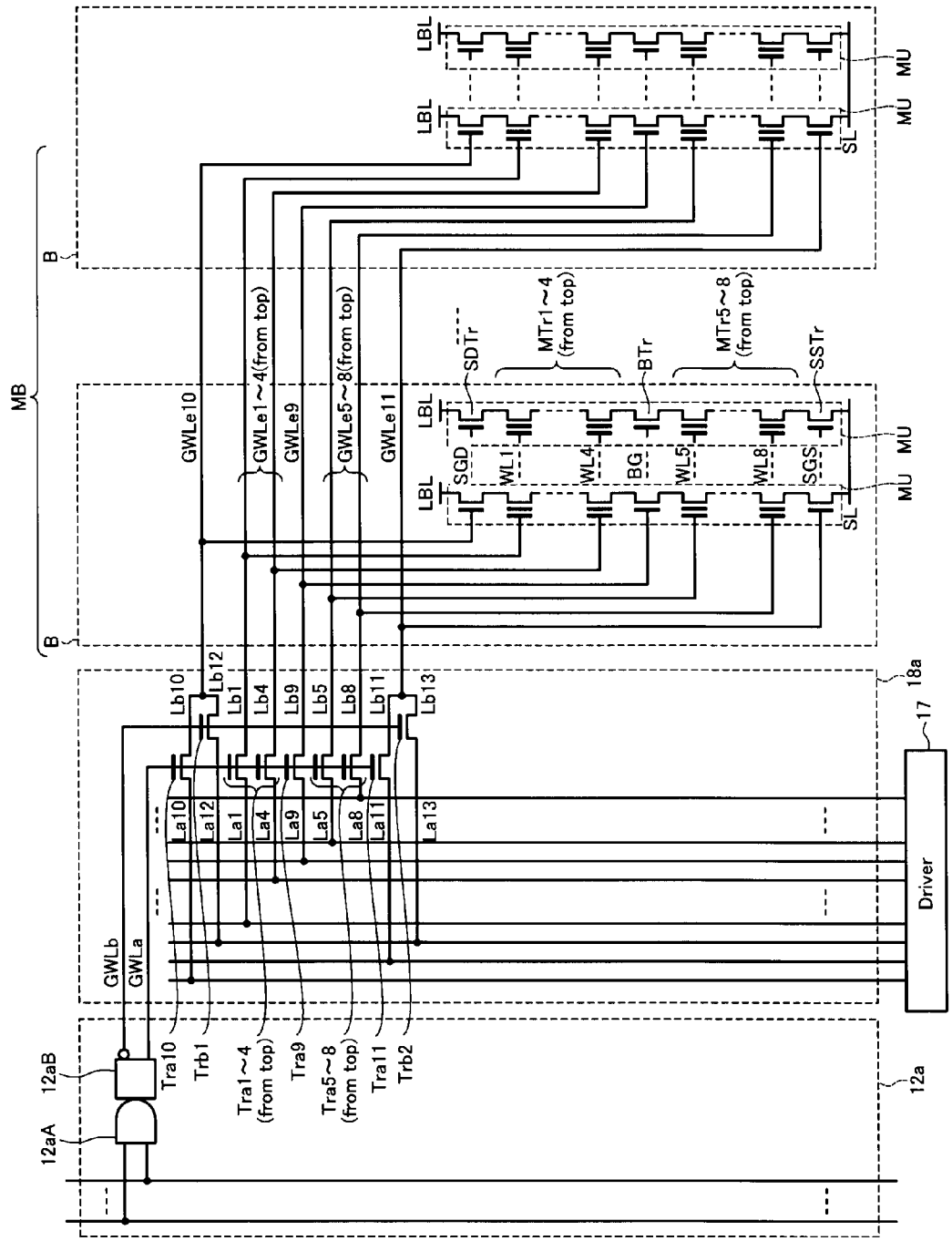
FIG. 51 is an equivalent circuit diagram of a nonvolatile semiconductor memory device in accordance with a twenty-third embodiment.
Figure 52:
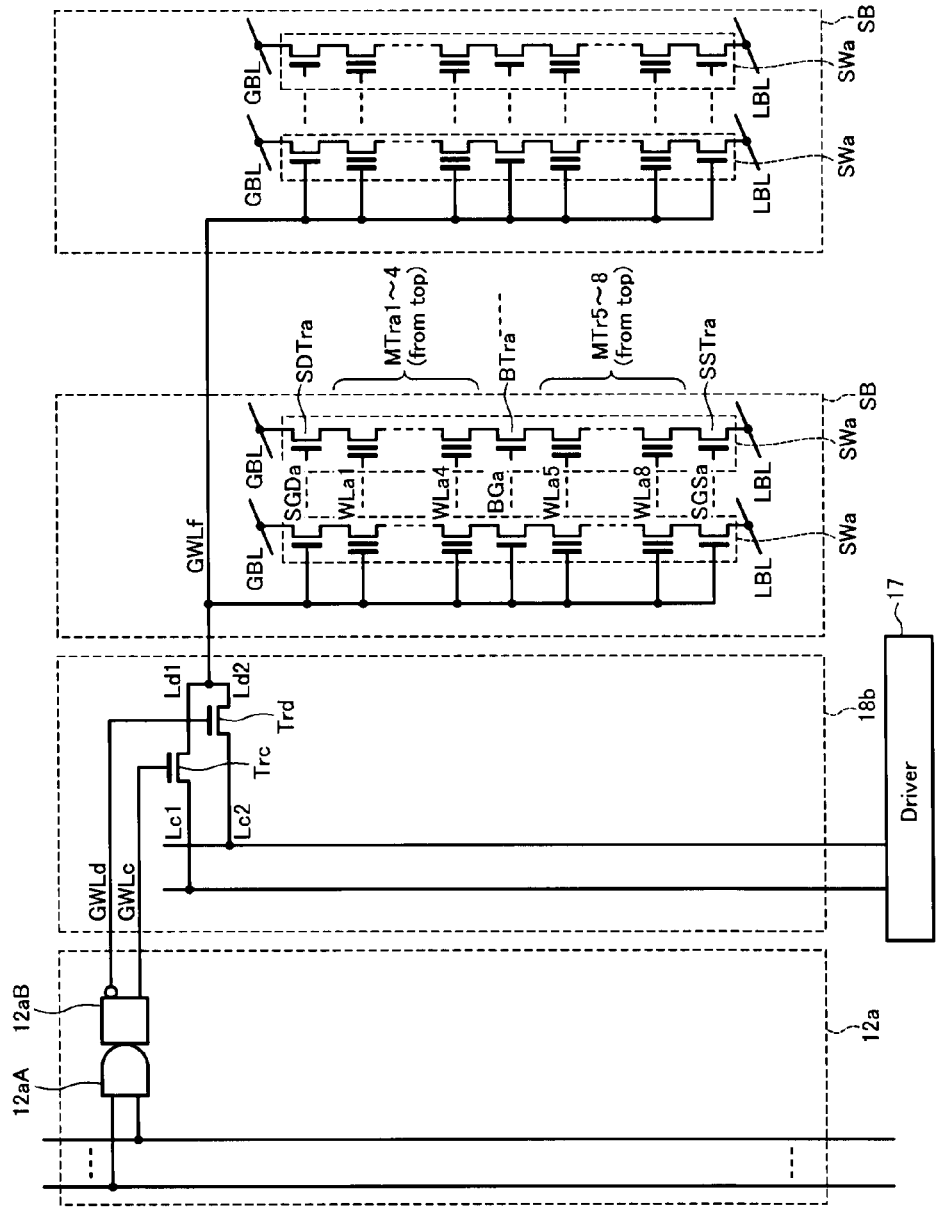
FIG. 52 is an equivalent circuit diagram of the nonvolatile semiconductor memory device in accordance with the twenty-third embodiment.

Next, a configuration of a nonvolatile semiconductor memory device in accordance with a twenty-third embodiment is described with reference to FIGS. 51 and 52. The twenty-third embodiment differs from the above-described embodiments in having output signals from the transfer circuits 18a and 18b transferred to a plurality of blocks B and switch blocks SB by global word lines GWLe1-GWLe11 and GWLf. FIGS. 51 and 52 are circuit diagrams of the nonvolatile semiconductor memory device in accordance with the twenty-third embodiment. FIG. 51 shows the relationship between the memory block MB and its peripheral circuits, and FIG. 52 shows the relationship between the switch circuit SWa and its peripheral circuits. Note that in the twenty-third embodiment, identical symbols are assigned to configurations similar to those in the first through twenty-second embodiments and descriptions thereof are omitted.

First, the relationship between the memory block MB and its peripheral circuits is described with reference to FIG. 51. As shown in FIG. 51, the nonvolatile semiconductor memory device in accordance with the twenty-third embodiment has a configuration substantially similar to that of the twentieth embodiment. However, in the twenty-third embodiment, only one transfer circuit 18a is provided commonly to a plurality of blocks B. In addition, the nonvolatile semiconductor memory device in accordance with the twenty-third embodiment includes the global word lines GWLe1-GWLe11.

The transfer circuit 18a is supplied with a drive signal from the driver 17 and selectively transfers the drive signal via the global word lines GWLe1-GWLe11 to the word lines WL1-WL8, the back gate line BG, the drain side select gate line SGD, and the source side select gate line SGS.

The global word lines GWLe1-GWLe11 are formed straddling a plurality of the blocks B aligned in the direction parallel to the substrate. The global word lines GWLe1-GWLe11 are connected to the transfer circuit 18a. Specifically, the global word lines GWLe1-GWLe11 are connected, respectively, via the lines Lb1-Lb11 to sources of the transfer transistors Tra1-Tra11. In addition, the global word lines GWLe10 and GWLe11 are connected, respectively, via the lines Lb12 and Lb13 to sources of the transfer transistors Trb1 and Trb2.

The global word lines GWLe1-GWLe8 are commonly connected to a plurality of word lines WL1-WL8 provided in the plurality of blocks B. The global word line GWLe9 is commonly connected to a plurality of back gate lines BG provided in the plurality of blocks B. The global word line GWLe10 is commonly connected to a plurality of drain side select gate lines SGD provided in the plurality of blocks B. The global word line GWLe11 is commonly connected to a plurality of source side select gate lines SGS provided in the plurality of blocks B.

Next, the relationship between the switch circuit SWa and its peripheral circuits is described with reference to FIG. 52. As shown in FIG. 52, the nonvolatile semiconductor memory device in accordance with the twenty-third embodiment has a configuration substantially similar to that of the twentieth embodiment. However, in the twenty-third embodiment, only one transfer circuit 18b is provided commonly to a plurality of switch blocks SB. In addition, the nonvolatile semiconductor memory device in accordance with the twenty-third embodiment includes the global word line GWLf.

The transfer circuit 18b is supplied with a drive signal from the driver 17 and selectively transfers the drive signal via the global word line GWLf to the word lines WLa1-WLa8, the back gate line BGa, the drain side select gate line SGDa, and the source side select gate line SGSa.

The global word line GWLf is formed straddling a plurality of the switch blocks SB aligned in the direction parallel to the substrate. The global word line GWLf is connected to the transfer circuit 18b. Specifically, the global word line GWLf is connected via the lines Ld1 and Ld2 to sources of the transfer transistors Trc and Trd.

The global word line GWLf is commonly connected to a plurality of word lines WLa1-WLa8, back gate lines BGa, drain side select gate lines SGDa, and source side select gate lines SGSa provided in the plurality of switch blocks SB.

Figure 53:
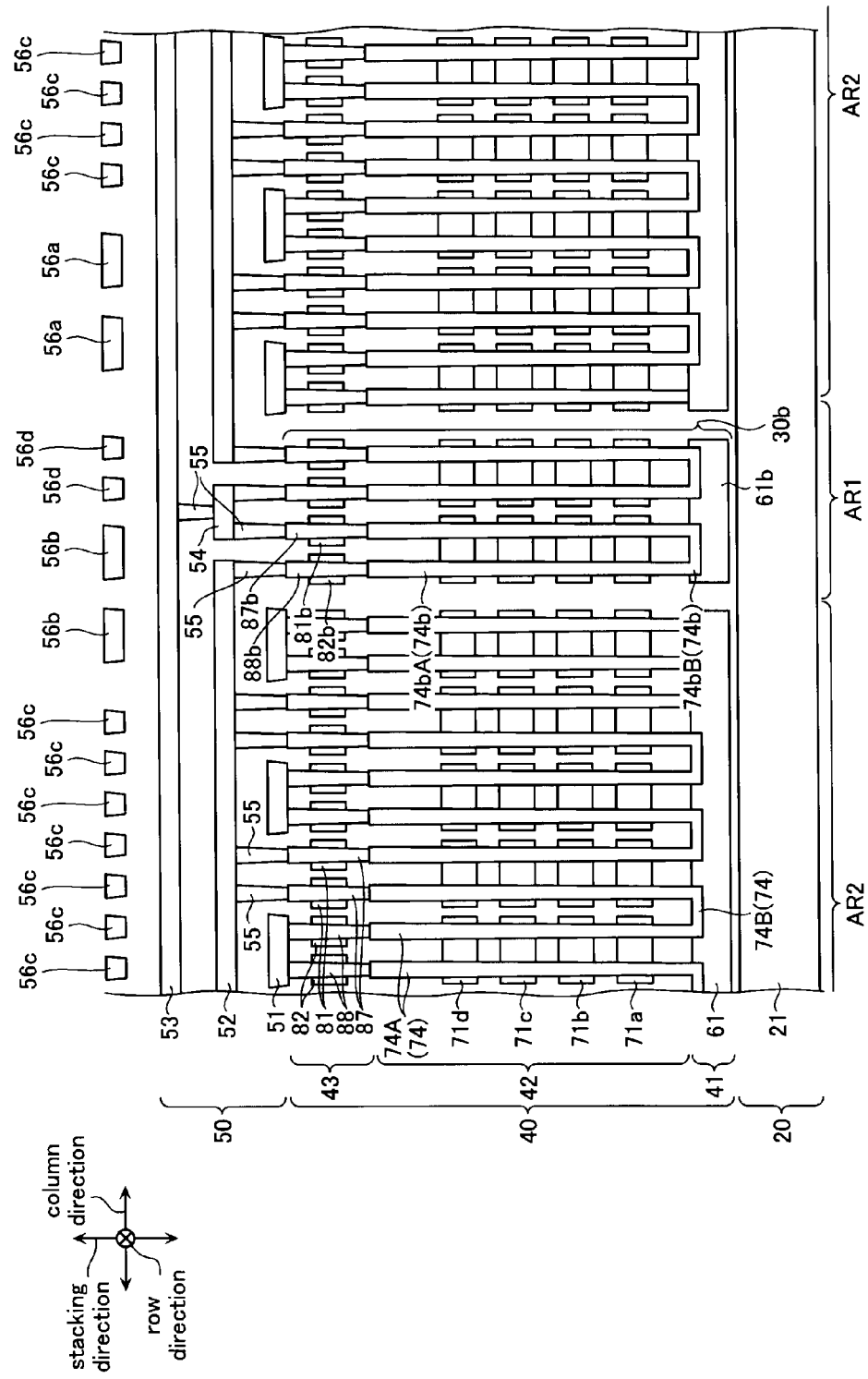
FIG. 53 is a cross-sectional view of the nonvolatile semiconductor memory device in accordance with the twenty-third embodiment.
Figure 54:
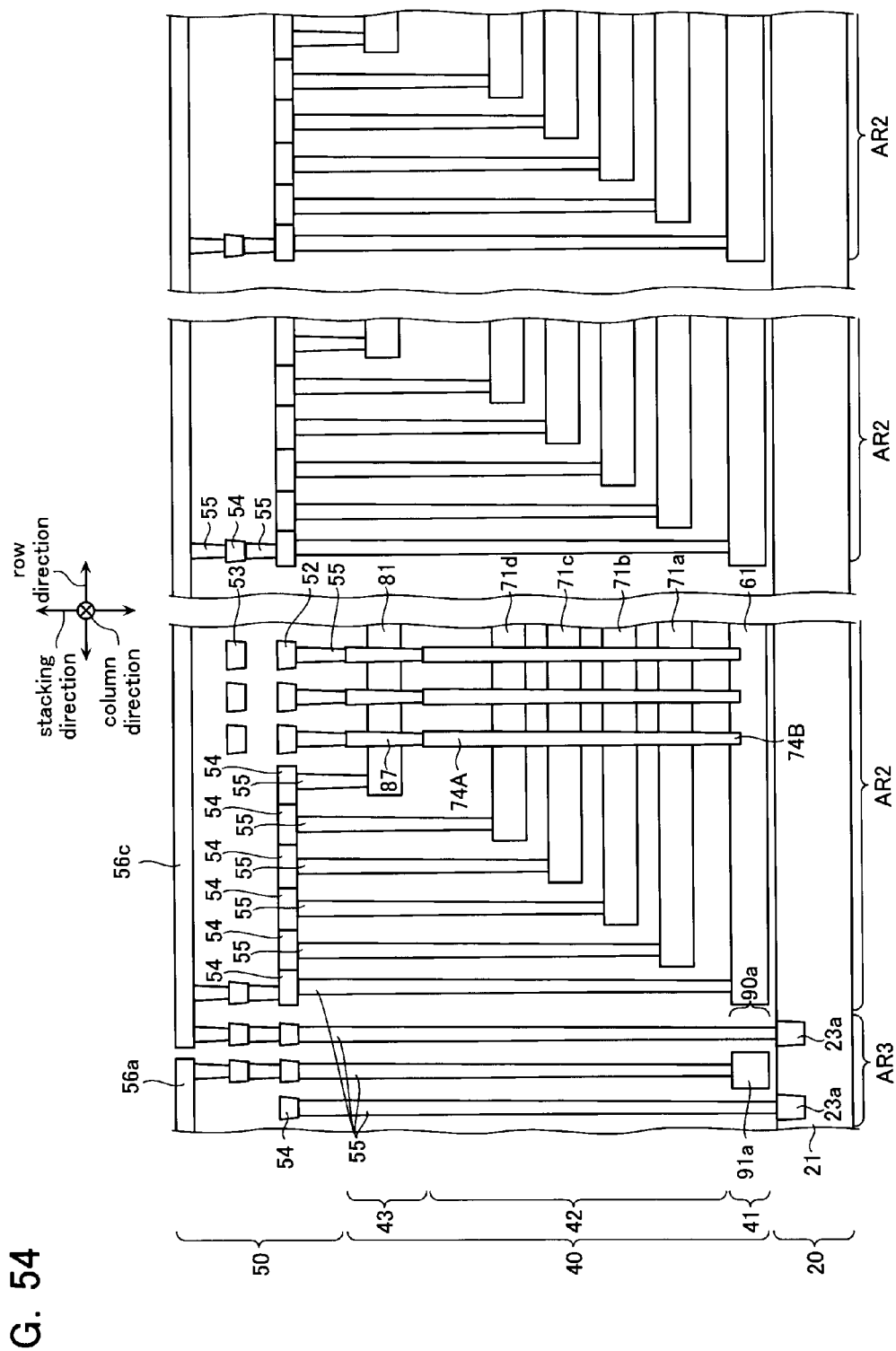
FIG. 54 is a cross-sectional view of the nonvolatile semiconductor memory device in accordance with the twenty-third embodiment.
Figure 55:
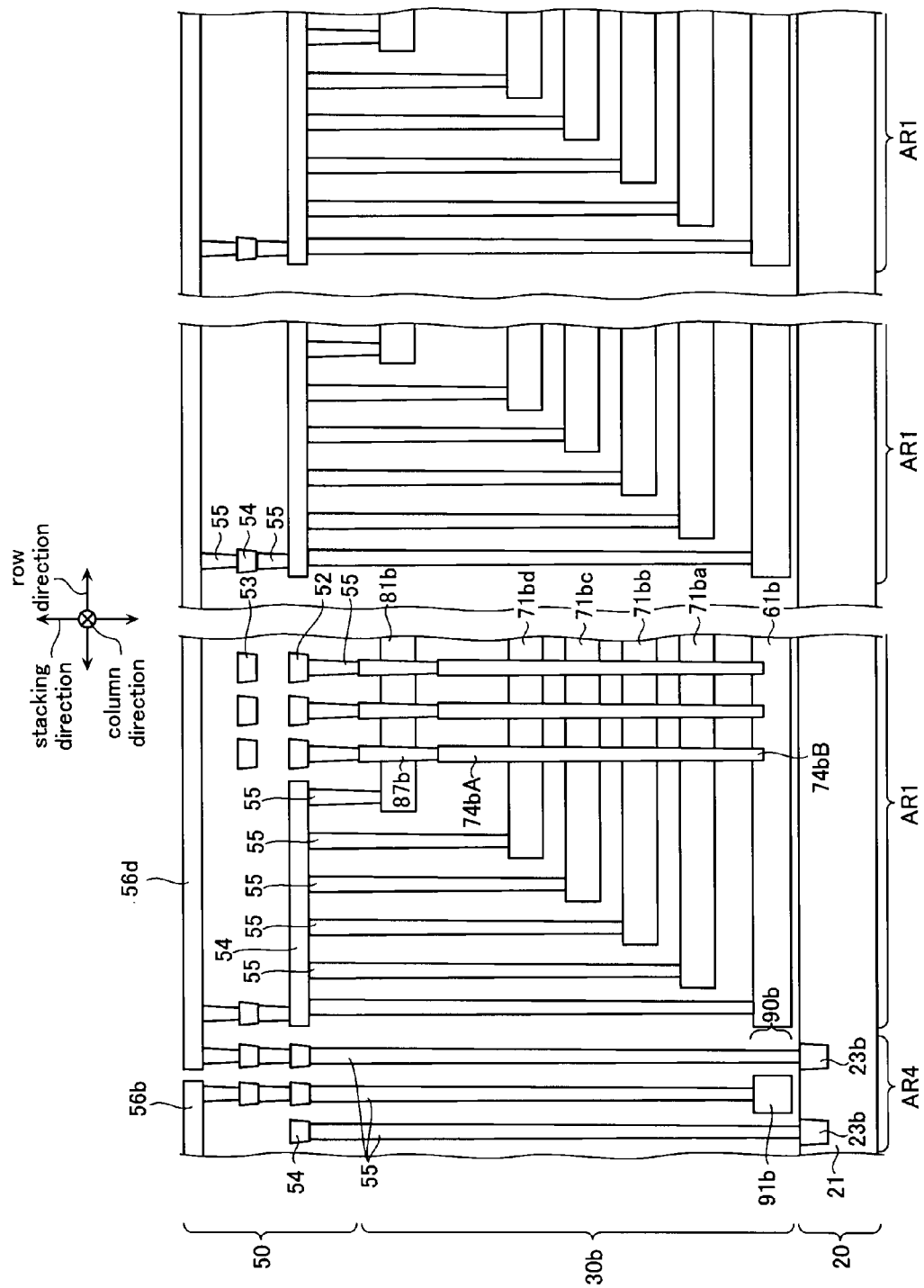
FIG. 55 is a cross-sectional view of the nonvolatile semiconductor memory device in accordance with the twenty-third embodiment.

Next, a stacking structure of the nonvolatile semiconductor memory device in accordance with the twenty-third embodiment is described with reference to FIGS. 53-55. FIG. 53 is a cross-sectional view in the column direction of the nonvolatile semiconductor memory device in accordance with the twenty-third embodiment. FIG. 54 is a cross-sectional view in the row direction of the nonvolatile semiconductor memory device in accordance with the twenty-third embodiment and shows an end portion in the row direction of the second region AR2. FIG. 55 is a cross-sectional view in the row direction of the nonvolatile semiconductor memory device in accordance with the twenty-third embodiment and shows an end portion in the row direction of the first region AR1.

As shown in FIG. 53, the stacking structure of the nonvolatile semiconductor memory device in accordance with the twenty-third embodiment has a configuration substantially similar to that of the twentieth embodiment (FIG. 44). The twenty-third embodiment differs from the twentieth embodiment in having wiring layers 56c and 56d further provided. The wiring layer 56c functions as the global word lines GWLe1-GWLe11. The wiring layer 56d functions as the global word line GWLf. The wiring layers 56c and 56d are configured by, for example, a stacking structure of tungsten (W)/titanium nitride (TiN)/titanium (Ti). The wiring layers 56c and 56d are provided in the same layer as the wiring layers 56a and 56b with a certain pitch in the column direction.

As shown in FIG. 54, the nonvolatile semiconductor memory device in accordance with the twenty-third embodiment has a configuration substantially similar to that of the twentieth embodiment (FIG. 45). However, a position where the wiring layer 56c and the third region AR3 are formed in the twenty-third embodiment differs from that of the twentieth embodiment.

As shown in FIG. 54, the wiring layer 56c (global word lines GWLe1-GWLe11) extends in the row direction straddling a plurality of second regions AR2. The wiring layer 56c is electrically connected via the wiring layer 54 and the plug layer 55 to one from among the back gate conductive layer 61, the word line conductive layers 71a-71d, the drain side conductive layer 81, and the source side conductive layer 82 (word lines WL1-WL8, back gate line BG, drain side select gate line SGD, and source side select gate line SGS), provided to each of the second regions AR2 (not fully shown).

In addition, as shown in FIG. 54, in the twenty-third embodiment, the third region AR3 is not provided adjacent to the end portion in the row direction of each of the second regions AR2, but is provided adjacent only to the end portion in the row direction of a specific second region AR2. One of the pair of diffusion layers 23a is connected via the wiring layer 54 and the plug layer 55 to the wiring layer 56c (global word lines GWLe1-GWLe11).

As shown in FIG. 55, the nonvolatile semiconductor memory device in accordance with the twenty-third embodiment has a configuration substantially similar to that of the twentieth embodiment (FIG. 46). However, a position where the wiring layer 56d and the fourth region AR4 are formed in the twenty-third embodiment differs from that of the twentieth embodiment.

As shown in FIG. 55, the wiring layer 56d (global word line GWLf) extends in the row direction straddling a plurality of first regions AR1. The wiring layer 56d is commonly connected electrically via the wiring layer 54 and the plug layer 55 to the back gate conductive layer 61b, the word line conductive layers 71ba-71bd, the drain side conductive layer 81b, and the source side conductive layer 82b (word lines WLa1-WLa8, back gate line BGa, drain side select gate line SGDa, and source side select gate line SGSa), provided to each of the first regions AR1 (not fully shown).

In addition, as shown in FIG. 55, in the twenty-third embodiment, the fourth region AR4 is not provided adjacent to the end portion in the row direction of each of the first regions AR1, but is provided adjacent only to the end portion in the row direction of a specific first region AR1. One of the pair of diffusion layers 23b is connected via the wiring layer 54 and the plug layer 55 to the wiring layer 56d (global word line GWLf).

[Advantages of the Nonvolatile Semiconductor Memory Device in Accordance with the Twenty-Third Embodiment]

In the nonvolatile semiconductor memory device in accordance with the twenty-third embodiment, the global word lines GWLe1-GWLe11 transfer the drive signal from sources of the transfer transistors Tra1-Tra11 to the word lines WL1-WL8, back gate line BG, drain side select gate line SGD, and source side select gate line SGS in a plurality of memory blocks MB. Increase in occupied area of the device can therefore be suppressed, since only one transfer circuit 18a need be provided to a plurality of blocks B.

In addition, in the nonvolatile semiconductor memory device in accordance with the twenty-third embodiment, the global word line GWLf transfers the drive signal from sources of the transfer transistors Trc and Trd to the word lines WLa1-WLa8, back gate line BGa, drain side select gate line SGDa, and source side select gate line SGSa in a plurality of switch blocks SB. Increase in occupied area of the device can therefore be suppressed, since only one transfer circuit 18b need be provided to a plurality of switch blocks SB.

[Other Embodiments]

This concludes description of the embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention.

What is claimed is:

1. A nonvolatile semiconductor memory device, comprising:
   a plurality of first memory strings each having a plurality of electrically rewritable first memory transistors connected in series;
   a first select transistor having one end thereof connected to one end of the first memory string;
   a first line commonly connected to the other end of a plurality of the first select transistors;
   a switch circuit having one end thereof connected to the first line; and
   a second line commonly connected to the other end of a plurality of the switch circuits,
   the first memory string comprising:
   a first semiconductor layer including a first columnar portion that extends in a perpendicular direction to a substrate and functioning as a body of the first memory transistors;
   a first charge storage layer formed surrounding a side surface of the first columnar portion; and
   a first conductive layer formed surrounding the first charge storage layer and functioning as a gate of the first memory transistors,
   the switch circuit controlling electrical connection between the second line and the first line.

2. The nonvolatile semiconductor memory device according to claim 1,
   wherein the switch circuit comprises a transistor formed on the substrate.

3. The nonvolatile semiconductor memory device according to claim 2,
   wherein the first semiconductor layer comprises a joining portion configured to join ends in the perpendicular direction of a pair of the columnar portions, and
   wherein the first memory string further comprises:
   a second conductive layer formed surrounding a side surface of the joining portion with the first charge storage layer interposed therebetween.

4. The nonvolatile semiconductor memory device according to claim 3,
   wherein the transistor comprises a third conductive layer functioning as a gate of the transistor, and
   wherein the third conductive layer is formed in the same layer as the second conductive layer.

5. The nonvolatile semiconductor memory device according to claim 3,
   wherein the transistor comprises a third conductive layer functioning as a gate of the transistor, and
   wherein the third conductive layer is formed in a layer downward of the second conductive layer.

6. The nonvolatile semiconductor memory device according to claim 1,
   wherein the switch circuit comprises at least a second select transistor having an identical structure to the first select transistor, and
   wherein the first line and the second line are connected to each other through conduction of the second select transistor.

7. The nonvolatile semiconductor memory device according to claim 1,
   wherein the switch circuit comprises at least a second memory string having an identical structure to the first memory string, and
   wherein the first line and the second line are connected to each other through conduction of the second memory string.

8. The nonvolatile semiconductor memory device according to claim 6,
   wherein the switch circuit comprises:
   a second semiconductor layer including a second columnar portion extending in the perpendicular direction to the substrate and having an elliptical shape cross section in a horizontal direction, a length of the elliptical shape in a long axis direction being set to such a length as to contain therein a plurality of the first semiconductor layers;

a third semiconductor layer including a third columnar portion extending in the perpendicular direction to the substrate from an end of an upper surface of the second semiconductor layer and having a width in the long axis direction less than that of the second semiconductor layer, and functioning as a body of the second select transistor;

a second conductive layer provided in a periphery of the second semiconductor layer with an insulating film interposed therebetween, and provided in the same layer as the first conductive layer; and a third conductive layer provided in a periphery of the third semiconductor layer with an insulating film interposed therebetween, and functioning as a control electrode of the second select transistor.

9. The nonvolatile semiconductor memory device according to claim 8,
wherein at least two or more third semiconductor layers are provided on an upper surface of one of the second semiconductor layer.

10. The nonvolatile semiconductor memory device according to claim 8,
wherein the first conductive layer has a width in a first direction parallel to the substrate and extends in a second direction parallel to the substrate and orthogonal to the first direction, and
wherein the first conductive layer provided next to the second conductive layer has a width less than other ones of the first conductive layers.

11. The nonvolatile semiconductor memory device according to claim 8,
wherein the first conductive layer has a width in a first direction parallel to the substrate and extends in a second direction parallel to the substrate and orthogonal to the first direction, and
wherein the first conductive layer provided next to the second conductive layer has the same width as other ones of the first conductive layers.

12. The nonvolatile semiconductor memory device according to claim 8, further comprising:
a first dummy semiconductor layer provided with a certain periodic pattern in a direction parallel to the substrate together with the first columnar portion and extending in the perpendicular direction to the substrate,
wherein the first conductive layer provided next to the second conductive layer is formed to surround the first semiconductor layer and the first dummy semiconductor layer.

13. The nonvolatile semiconductor memory device according to claim 8, further comprising:
a second dummy semiconductor layer provided with a certain periodic pattern in a direction parallel to the substrate together with the first columnar portion and extending in the perpendicular direction to the substrate,
wherein the second conductive layer is formed to surround the second semiconductor layer and the second dummy semiconductor layer.

14. The nonvolatile semiconductor memory device according to claim 8,
wherein the second conductive layer comprises a trench provided with a certain pitch along a longer direction of the second conductive layer, a periphery of the trench being silicided.

15. The nonvolatile semiconductor memory device according to claim 1, wherein a plurality of the first memory transistors are disposed in a plurality of first blocks, further comprising:
a plurality of third lines provided for each of the first blocks and each commonly connected to gates of the plurality of first memory transistors;
a plurality of first transfer circuits each connected to a respective one of the third lines; and
a fourth line commonly connected to the plurality of first transfer circuits,
wherein each of the first transfer circuits is supplied with a first drive signal and transfers the first drive signal to the respective one of the third lines based on a first control signal supplied from the fourth line.

16. The nonvolatile semiconductor memory device according to claim 1, wherein a plurality of the first memory transistors are disposed in a plurality of first blocks, further comprising:
a plurality of third lines provided for each of the first blocks and each commonly connected to gates of the plurality of first memory transistors;
a fourth line commonly connected to the plurality of third lines; and
a first transfer circuit connected to the fourth line,
wherein the first transfer circuit is supplied with a first drive signal and selectively transfers the first drive signal to the third lines via the fourth line.

17. The nonvolatile semiconductor memory device according to claim 15,
wherein the third lines are constituted by polysilicon and the fourth line is constituted by a metal.

18. The nonvolatile semiconductor memory device according to claim 1, wherein the switch circuit comprises a plurality of second memory transistors having an identical structure to that of the first memory transistors and disposed in a plurality of second blocks, further comprising:
a plurality of fifth lines provided to each of the second blocks and each commonly connected to gates of the plurality of second memory transistors;
a plurality of second transfer circuits each connected to a respective one of the fifth lines; and
a sixth line commonly connected to the plurality of second transfer circuits,
wherein each of the second transfer circuits is supplied with a second drive signal and transfers the second drive signal to the respective one of the fifth lines based on a second control signal supplied from the sixth line.

19. The nonvolatile semiconductor memory device according to claim 1, wherein the switch circuit comprises a plurality of second memory transistors having an identical structure to that of the first memory transistors and disposed in a plurality of second blocks, further comprising:
a plurality of fifth lines provided to each of the second blocks and each commonly connected to gates of the plurality of second memory transistors;
a sixth line commonly connected to the plurality of fifth lines; and
a second transfer circuit connected to the sixth line,
wherein the second transfer circuit is supplied with a second drive signal and selectively transfers the second drive signal to the fifth lines via the sixth line.

20. The nonvolatile semiconductor memory device according to claim 18,
wherein the fifth lines are constituted by polysilicon and the sixth line is constituted by a metal.

* * * * *